(12) United States Patent
Lin et al.

(10) Patent No.: US 7,582,966 B2
(45) Date of Patent: Sep. 1, 2009

(54) SEMICONDUCTOR CHIP AND METHOD FOR FABRICATING THE SAME

(75) Inventors: Mou-Shiung Lin, Hsin-Chu (TW); Chiu-Ming Chou, Kao-hsiung (TW)

(73) Assignee: Megica Corporation, Hsin-Chu (TW)

( * ) Notice: Subject to any disclaimer, the term of this patent is extended or adjusted under 35 U.S.C. 154(b) by 162 days.

(21) Appl. No.: 11/850,677

(22) Filed: Sep. 6, 2007

(65) Prior Publication Data
US 2008/0054457 A1 Mar. 6, 2008

Related U.S. Application Data

(60) Provisional application No. 60/824,614, filed on Sep. 6, 2006.

(51) Int. Cl.
*H01L 23/48* (2006.01)
(52) U.S. Cl. ...................... 257/734; 257/750
(58) Field of Classification Search ............ 257/737, 257/738, 750, 778
See application file for complete search history.

(56) References Cited

U.S. PATENT DOCUMENTS 6,642,136 B1 * 11/2003 Lee et al. .............. 438/613
7,338,890 B2 * 3/2008 Lee et al. .............. 438/613

* cited by examiner

*Primary Examiner*—Roy K Potter

(57) ABSTRACT

A semiconductor chip includes a silicon substrate, a first dielectric layer over said silicon substrate, a metallization structure over said first dielectric layer, wherein said metallization structure comprises a first metal layer and a second metal layer over said first metal layer, a second dielectric layer between said first and second metal layers, a passivation layer over said metallization structure and over said first and second dielectric layers, an opening in said passivation layer exposing a pad of said metallization structure, a polymer bump over said passivation layer, wherein said polymer bump has a thickness of between 5 and 25 micrometers, an adhesion/barrier layer on said pad exposed by said opening, over said passivation layer and on a top surface and a portion of sidewall(s) of said polymer bump, a seed layer on said adhesion/barrier layer; and a third metal layer on said seed layer.

20 Claims, 57 Drawing Sheets

SEMICONDUCTOR CHIP AND METHOD FOR FABRICATING THE SAME

This application claims priority to U.S. provisional application No. 60/824,614, filed on Sep. 6, 2006, which is herein incorporated by reference in its entirety.

BACKGROUND OF THE INVENTION

1. Field of the Invention

The invention relates to a chip, and, more specifically, to a semiconductor chip with a polymer bump.

2. Brief Description of the Related Art

Typically, gold is widely used in a conductive bump on a semiconductor chip. When an anisotropic conductive film (ACF) is used to connect the conventional gold bump to a glass substrate, a crack would easily occur between the conventional gold bump and the ACF since a thermal expansion coefficient of the conventional gold bump is different from that of the ACF. The conductive gold bump has a poor elastic buffer to absorb the deformation of the semiconductor chip and of the glass substrate, leading the light through the glass substrate to be possibly refracted. In addition, the conventional gold bump is expensive.

In the trend of fine-pitched gold bumps, relatively highly-concentrated conductive particles captured in the ACF are requested to make sure of the reliable electrical connection in vertical direction. However, two neighboring conventional gold bumps easily generate a short circuit due to the more highly-concentrated conductive particles.

SUMMARY OF THE INVENTION

It is the objective of the invention to provide a semiconductor chip with a polymer bump, having a gold layer formed thereon, substituted for a conventional gold bump, to save the cost of forming a COG structure, a COF package or a TAB package.

It is the objective of the invention to provide a semiconductor chip with polymer bumps having a finer pitch than before and a short circuit between them can be avoided during forming a COG structure.

In order to reach the above objectives, the present invention provides a semiconductor chip comprising: a silicon substrate, at least one active device in or over said silicon substrate, a first dielectric layer over said silicon substrate, a metallization structure over said first dielectric layer, wherein said metallization structure is connected to said at least one active device, and wherein said metallization structure comprises a first metal layer and a second metal layer over said first metal layer, a second dielectric layer between said first and second metal layers, a passivation layer over said metallization structure and over said first and second dielectric layers, an opening in said passivation layer exposing a pad of said metallization structure, a polymer bump over said passivation layer and over said at least one active device, wherein said polymer bump has a thickness of between 5 and 25 micrometers and a width between 5 and 40 micrometers, an adhesion/barrier layer on said pad exposed by said opening, over said passivation layer and on a top surface and a portion of sidewall(s) of said polymer bump, a seed layer on said adhesion/barrier layer; and a third metal layer on said seed layer, wherein the material of said third metal layer is the same as that of said seed layer.

In order to reach the above objectives, the present invention provides a semiconductor chip comprising: a silicon substrate, at least one semiconductor device in or over said silicon substrate, a first dielectric layer over said silicon substrate, a metallization structure over said first dielectric layer, wherein said metallization structure is connected to said at least one semiconductor device, and wherein said metallization structure comprises a first metal layer and a second metal layer over said first metal layer, a second dielectric layer between said first and second metal layers, a passivation layer over said metallization structure and over said first and second dielectric layers, a first opening in said passivation layer exposing a pad of said metallization structure, a polymer bump on said passivation layer and on said pad exposed by said first opening, a second opening in said polymer bump exposing said pad, wherein said polymer bump has a thickness of between 5 and 25 micrometers and a width between 10 and 40 micrometers, an adhesion/barrier layer on said pad exposed by said second opening and on a top surface of said polymer bump, a seed layer on said adhesion/barrier layer; and a third metal layer on said seed layer, wherein the material of said third metal layer is the same as that of said seed layer.

To enable the objectives, technical contents, characteristics and accomplishments of the present invention, the embodiments of the present invention are to be described in detail in copperation with the attached drawings below.

DETAILED DESCRIPTION OF THE INVENTION

Figure 1A:
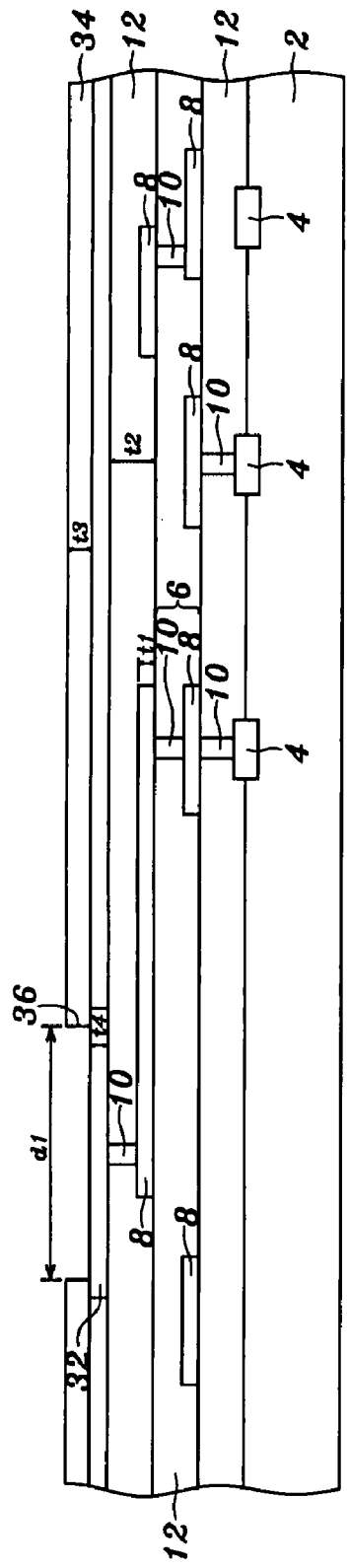
FIGS. 1A and 1B are cross-sectional views schematically showing various structures according to the present invention.

Referring to FIG. 1A, a semiconductor substrate or semiconductor blank wafer 2 may be a silicon substrate or silicon wafer, a GaAs substrate or GaAs wafer, or a SiGe substrate or SiGe wafer. Multiple semiconductor devices 4 are formed in or over the semiconductor substrate 2. The semiconductor device 4 may be a memory device, a logic device, a passive device, such as resistor, capacitor, inductor or filter, or an active device, such as p-channel MOS device, n-channel MOS device, CMOS (Complementary Metal Oxide Semiconductor) device, BJT (Bipolar Junction Transistor) device or BiCMOS (Bipolar CMOS) device.

A circuit structure 6, fine line metal trace structure, is formed over the semiconductor substrate 2 and connect to the semiconductor device 4. The circuit structure 6 comprises multiple patterned metal layers 8 having a thickness t1 of less than 3 micrometers, such as between 0.05 and 2 μm, and preferably between 0.2 and 1 μm, and multiple metal plugs 10. For example, the patterned metal layers 8 and the metal plugs 10 are principally made of copper, wherein the patterned metal layer 8 is a copper layer having a thickness of less than 3 μm, such as between 0.05 and 2 μm, and preferably between 0.2 and 1 μm. Alternatively, the patterned metal layer 8 is principally made of aluminum or aluminum-alloy, and the metal plug 10 is principally made of tungsten, wherein the patterned metal layer 8 is an aluminum-containing layer having a thickness of less than 3 μm, such as between 0.05 and 2 μm, and preferably between 0.2 and 1 μm.

One of the patterned metal layers 8 may be formed by a damascene process including sputtering an adhesion/barrier layer, such as tantalum or tantalum nitride, on an insulating layer, composed of Low-K oxide and oxynitride, and in an opening in the insulating layer, then sputtering a first copper layer on the adhesion/barrier layer, then electroplating a second copper layer on the first copper layer, then removing the first and second copper layers and the adhesion/barrier layer outside the opening in the insulating layer using a chemical mechanical polishing (CMP) process. Alternatively, one of the patterned metal layer 8 may be formed by a process including sputtering an aluminum-alloy layer, containing more than 90 wt % aluminum and less than 10 wt % copper, on an insulating layer, such as oxide, then patterning the aluminum-alloy layer using photolithography and etching processes.

Multiple dielectric layers 12 having a thickness t2 of less than 3 micrometers, such as between 0.05 and 2 μm, are located over the semiconductor substrate 2 and interposed respectively between the neighboring patterned metal layers 8, and the neighboring patterned metal layers 8 are interconnected through the metal plugs 10 inside the dielectric layer 12. The dielectric layer 12 is commonly formed by a chemical vapor deposition (CVD) process. The material of the dielectric layer 12 may include silicon oxide, silicon oxynitride, TEOS (Tetraethoxysilane), a compound containing silicon, carbon, oxygen and hydrogen (such as $Si_wC_xO_yH_z$), silicon nitride (such as $Si_3N_4$), FSG (Fluorinated Silicate Glass), Black Diamond, SiLK, a porous silicon oxide, a porous compound containing nitrogen, oxygen and silicon, SOG (Spin-On Glass), BPSG (borophosphosilicate glass), a polyarylene ether, PBO (Polybenzoxazole), or a material having a low dielectric constant (K) of between 1.5 and 3, for example.

A passivation layer 34 is formed over the circuit structure 6 and over the dielectric layers 12. The passivation layer 34 can protect the semiconductor devices 4 and the circuit structure 6 from being damaged by moisture and foreign ion contamination. In other words, mobile ions (such as sodium ion), transition metals (such as gold, silver and copper) and impurities can be prevented from penetrating through the passivation layer 34 to the semiconductor devices 4, such as transistors, polysilicon resistor elements and polysilicon-polysilicon capacitor elements, and to the circuit structure 6.

The passivation layer 34 is commonly made of silicon oxide (such as $SiO_2$), silicon oxynitride, silicon nitride (such as $Si_3N_4$), or PSG (phosphosilicate glass). The passivation layer 34 commonly has a thickness t3 of more than 0.2 μm, such as between 0.2 and 1.5 μm, and preferably between 0.3 and 1 μm. In a preferred case, the silicon nitride layer in the passivation layer 34 has a thickness of more than 0.3 μm. Ten methods for depositing the passivation layer 34 are described as below.

In a first method, the passivation layer 34 is formed by depositing a silicon oxide layer with a thickness of between 0.2 and 1.2 μm using a CVD method and then depositing a silicon nitride layer with a thickness of 0.2 and 1.2 μm on the silicon oxide layer using a CVD method.

In a second method, the passivation layer 34 is formed by depositing a silicon oxide layer with a thickness of between 0.2 and 1.2 μm using a CVD method, next depositing a silicon oxynitride layer with a thickness of between 0.05 and 0.15 μm on the silicon oxide layer using a Plasma Enhanced CVD (PECVD) method, and then depositing a silicon nitride layer with a thickness of between 0.2 and 1.2 μm on the silicon oxynitride layer using a CVD method.

In a third method, the passivation layer 34 is formed by depositing a silicon oxynitride layer with a thickness of between 0.05 and 0.15 μm using a CVD method, next depositing a silicon oxide layer with a thickness of between 0.2 and 1.2 μm on the silicon oxynitride layer using a CVD method, and then depositing a silicon nitride layer with a thickness of between 0.2 and 1.2 μm on the silicon oxide layer using a CVD method.

In a fourth method, the passivation layer 34 is formed by depositing a first silicon oxide layer with a thickness of between 0.2 and 0.5 μm using a CVD method, next depositing a second silicon oxide layer with a thickness of between 0.5 and 1 μm on the first silicon oxide layer using a spin-coating method, next depositing a third silicon oxide layer with a thickness of between 0.2 and 0.5 μm on the second silicon oxide layer using a CVD method, and then depositing a silicon nitride layer with a thickness of 0.2 and 1.2 μm on the third silicon oxide using a CVD method.

In a fifth method, the passivation layer 34 is formed by depositing a silicon oxide layer with a thickness of between 0.5 and 2 μm using a High Density Plasma CVD (HDP-CVD) method and then depositing a silicon nitride layer with a thickness of 0.2 and 1.2 μm on the silicon oxide layer using a CVD method.

In a sixth method, the passivation layer 34 is formed by depositing an Undoped Silicate Glass (USG) layer with a thickness of between 0.2 and 3 μm, next depositing an insulating layer of TEOS, PSG or BPSG (borophosphosilicate glass) with a thickness of between 0.5 and 3 μm on the USG layer, and then depositing a silicon nitride layer with a thickness of 0.2 and 1.2 μm on the insulating layer using a CVD method.

In a seventh method, the passivation layer 34 is formed by optionally depositing a first silicon oxynitride layer with a thickness of between 0.05 and 0.15 μm using a CVD method, next depositing a silicon oxide layer with a thickness of between 0.2 and 1.2 µm on the first silicon oxynitride layer using a CVD method, next optionally depositing a second silicon oxynitride layer with a thickness of between 0.05 and 0.15 µm on the silicon oxide layer using a CVD method, next depositing a silicon nitride layer with a thickness of between 0.2 and 1.2 µm on the second silicon oxynitride layer or on the silicon oxide using a CVD method, next optionally depositing a third silicon oxynitride layer with a thickness of between 0.05 and 0.15 µm on the silicon nitride layer using a CVD method, and then depositing a silicon oxide layer with a thickness of between 0.2 and 1.2 µm on the third silicon oxynitride layer or on the silicon nitride layer using a CVD method.

In a eighth method, the passivation layer 34 is formed by depositing a first silicon oxide layer with a thickness of between 0.2 and 1.2 µm using a CVD method, next depositing a second silicon oxide layer with a thickness of between 0.5 and 1 µm on the first silicon oxide layer using a spin-coating method, next depositing a third silicon oxide layer with a thickness of between 0.2 and 1.2 µm on the second silicon oxide layer using a CVD method, next depositing a silicon nitride layer with a thickness of between 0.2 and 1.2 µm on the third silicon oxide layer using a CVD method, and then depositing a fourth silicon oxide layer with a thickness of between 0.2 and 1.2 µm on the silicon nitride layer using a CVD method.

In a ninth method, the passivation layer 34 is formed by depositing a first silicon oxide layer with a thickness of between 0.5 and 2 µm using a HDP-CVD method, next depositing a silicon nitride layer with a thickness of between 0.2 and 1.2 µm on the first silicon oxide layer using a CVD method, and then depositing a second silicon oxide layer with a thickness of between 0.5 and 2 µm on the silicon nitride using a HDP-CVD method.

In a tenth method, the passivation layer 34 is formed by depositing a first silicon nitride layer with a thickness of between 0.2 and 1.2 µm using a CVD method, next depositing a silicon oxide layer with a thickness of between 0.2 and 1.2 µm on the first silicon nitride layer using a CVD method, and then depositing a second silicon nitride layer with a thickness of between 0.2 and 1.2 µm on the silicon oxide layer using a CVD method.

An opening 36 in the passivation layer 34 exposes a pad 32 of the circuit structure 6 used to input or output signals or to be connected to a power source or a ground reference. The pad 32 may have a thickness t4 of between 0.4 and 3 µm or between 0.2 and 2 µm. For example, the pad 32 may be composed of a sputtered aluminum layer or a sputtered aluminum-copper-alloy layer with a thickness of between 0.2 and 2 µm. Alternatively, the pad 32 may include an electroplated copper layer with a thickness of between 0.2 and 2 µm, and a barrier layer, such as tantalum or tantalum nitride, on a bottom surface and side walls of the electroplated copper layer.

Therefore, the pad 32 can be an aluminum pad, principally made of sputtered aluminum with a thickness of between 0.2 and 2 µm. Alternatively, the pad 32 can be a copper pad, principally made of electroplated copper with a thickness of between 0.2 and 2 µm.

The opening 36 may have a transverse dimension d1, from a top view, of between 0.1 and 20 µm or between 20 and 200 µm. The shape of the opening 36 from a top view may be a circle, and the diameter of the circle-shaped opening 36 may be between 0.1 and 20 µm or between 20 and 200 µm. Alternatively, the shape of the opening 36 from a top view may be a square, and the width of the square-shaped opening 36 may be between 0.1 and 20 µm or between 20 and 200 µm. Alternatively, the shape of the opening 36 from a top view may be a polygon, such as hexagon or octagon, and the polygon-shaped opening 36 may have a width of between 0.1 and 20 µm or between 20 and 200 µm. Alternatively, the shape of the opening 36 from a top view may be a rectangle, and the rectangle-shaped opening 36 may have a shorter width of between 0.1 and 20 µm or between 20 and 200 µm. Further, there may be some of the semiconductor devices 4 under the pad 32 exposed by the opening 36. Alternatively, there may be no active devices under the pad 32 exposed by the opening 36.

Figure 1B:
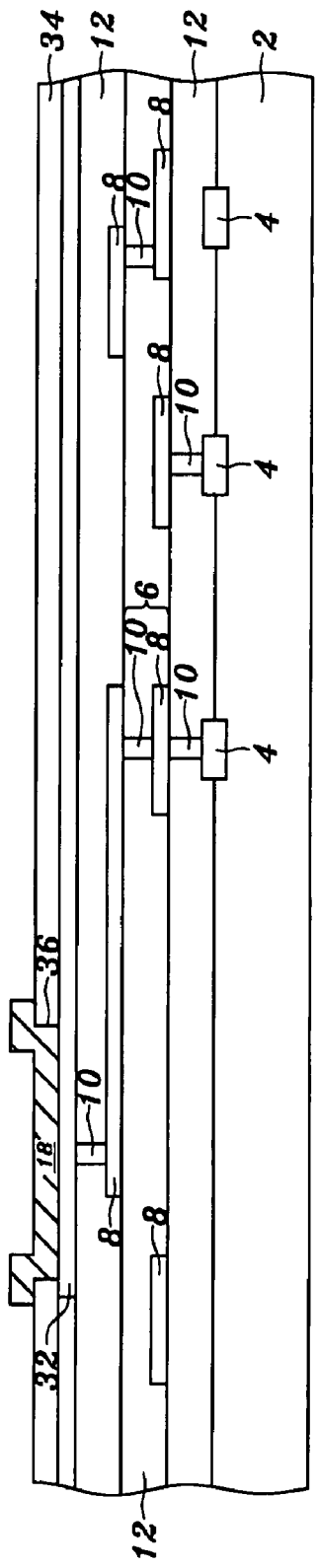

Referring to FIG. 1B, a metal cap 18 having a thickness of between 0.4 and 3 µm can be optionally formed on the pad 32 exposed by the opening 36 in the passivation layer 34 to prevent the pad 32 from being oxidized or contaminated. For example, the metal cap 18 may comprise a barrier layer having a thickness of between 0.01 and 0.7 µm on the pad 32, such as copper pad, exposed by the opening 36, and an aluminum-containing layer having a thickness of between 0.4 and 2 µm on the barrier layer, wherein the barrier layer may be made of titanium, a titanium-tungsten alloy, titanium nitride, tantalum, tantalum nitride, chromium or alloy of refractory metal, and the aluminum-containing layer may be an aluminum layer, an aluminum-copper alloy layer or an Al—Si—Cu alloy layer. Alternatively, the metal cap 18 may be an aluminum-containing layer having a thickness of between 0.4 and 2 µm directly on the pad 32, such as copper pad, exposed by the opening 36, without the above-mentioned barrier layer between the aluminum-containing layer and the pad 32, wherein the aluminum-containing layer may be an aluminum layer, an aluminum-copper alloy layer or an Al—Si—Cu alloy layer.

For example, the metal cap 18 may include a tantalum-containing layer, such as tantalum layer or tantalum-nitride layer, having a thickness of between 0.01 and 0.7 µm on the pad 32, principally made of electroplated copper, exposed by the opening 36, and an aluminum-containing layer, such as aluminum layer or aluminum-alloy layer, having a thickness of between 0.4 and 2 µm on the tantalum-containing layer. Alternatively, the metal cap 18 may include a titanium-containing layer, such as titanium layer or titanium-tungsten-alloy layer, having a thickness of between 0.01 and 0.7 µm on the pad 32, principally made of electroplated copper, exposed by the opening 36, and an aluminum-containing layer, such as aluminum layer or aluminum-alloy layer, having a thickness of between 0.4 and 2 µm on the tantalum-containing layer.

The semiconductor substrate 2, the circuit structure 6, the dielectric layer 12, the passivation layer 34 and the pad 32 are described in the above paragraphs. Below, the scheme 100 under the passivation layer 34 may be any one of the structures shown in FIGS. 1A and 1B under the passivation layer 34; the scheme 100 represents the combination of the semiconductor substrate 2, the semiconductor devices 4, the circuit structure 6 (including the metal layers 8 and the metal plugs 10) and the dielectric layers 12 in FIG. 1A and FIG. 1B.

Aspect 1 of Embodiment 1

Figure 2A:
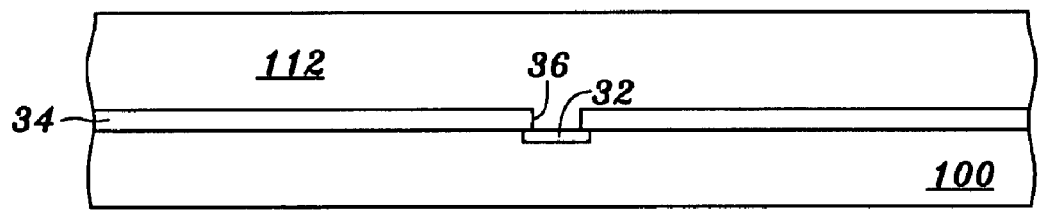
FIGS. 2A through 2L are sectional views showing a process according to one embodiment of the present invention.
Figure 2B:
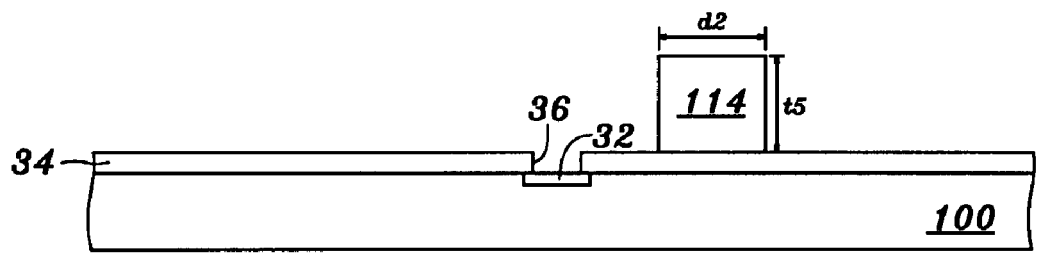

Referring to FIG. 2A, a polymer layer 112 is formed on the passivation layer 34 and on the pad 32 exposed by the opening 36 via a spin-on coating process. Referring to FIG. 2B, the polymer layer 112 is patterned with exposure and development processes to form at least one polymer bump 114 on the passivation layer 34. From a top perspective view, the position of the polymer bump 114 is different from that of the pad 32 exposed by the opening 36. Alternatively, the polymer bump 114 may be formed by a lamination process or a screen-printing process.

The material of the polymer bump 114 may be polyimide (PI), benzocyclobutane (BCB), polyurethane, epoxy resin, a parylene-based polymer, a solder-mask material, an elastomer, silicone or a porous dielectric material. The polymer bump 114 has a thickness t5 of between 5 and 50 micrometers, and preferably of between 5 and 25 micrometers. The polymer bump 114 may have a transverse dimension d2, from a top view, of between 5 and 60 micrometers, and preferably of between 5 and 40 micrometers. The shape of the polymer bump 114 from a top view may be a circle, and the diameter of the circle-shaped polymer bump 114 may be between 5 and 60 micrometers, and preferably between 5 and 40 micrometers. Alternatively, the shape of the polymer bump 114 from a top view may be a square, and the width of the square-shaped polymer bump 114 may be between 5 and 60 micrometers, and preferably between 5 and 40 micrometers. Alternatively, the shape of the polymer bump 114 from a top view may be a polygon, such as hexagon or octagon, and the polygon-shaped polymer bump 114 may have a width of between 5 and 60 micrometers, and preferably of between 5 and 40 micrometers. Alternatively, the shape of the polymer bump 114 from a top view may be a rectangle, and the rectangle-shaped polymer bump 114 may have a shorter width of between 5 and 60 micrometers, and preferably of between 5 and 40 micrometers. Further, there may be some of the active devices, such as p-channel MOS devices, n-channel MOS devices, CMOS (Complementary Metal Oxide Semiconductor) devices, BJT (Bipolar Junction Transistor) devices or BiCMOS (Bipolar CMOS) devices, under the polymer bump 114. Alternatively, there may be no active devices under the polymer bump 114.

For example, the polymer layer 112 can be formed by spin-on coating a negative-type photosensitive polyimide layer, containing ester-typer precursor, having a thickness of 10 and 100 µm on the passivation layer 34 and on the pad 32 exposed by the opening 36, then baking the spin-on coated polyimide layer, then exposing the baked polyimide layer using a 1X stepper or 1X contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form at least one polyimide bump on the passivation layer 34, then curing or heating the polyimide bump at a peak temperature of between 290 and 400° C. for a time of between 20 and 150 minutes in a nitrogen ambient or in an oxygen-free ambient, the cured polyimide bump 114 having a thickness t5 of between 5 and 50 µm, and then removing the residual polymeric material or other contaminants from the upper surface of the pad 32 exposed by the opening 36 with an $O_2$ plasma or a plasma containing fluorine of below 200 PPM and oxygen. Thereby, the polymer bump 114 can be formed on the passivation layer 34. Alternatively, the polyimide bump can be cured or heated at a temperature between 150 and 290° C., and preferably of between 260 and 280° C., for a time of between 20 and 150 minutes in a nitrogen ambient or in an oxygen-free ambient.

Figure 2C:
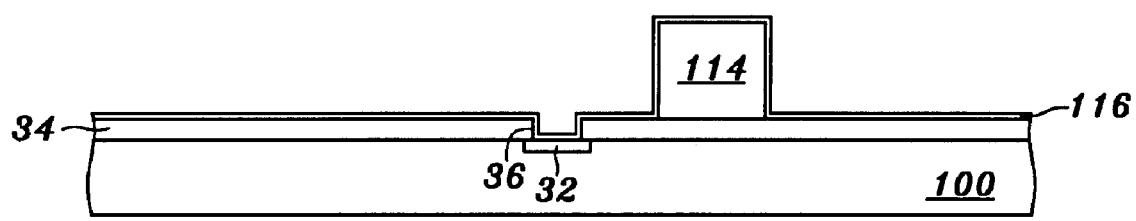

Referring to FIG. 2C, an adhesion/barrier layer 116 having a thickness of between 0.02 and 0.8 µm, and preferably of between 0.05 and 0.2 µm, can be sputtered on an entire top surface and entire sidewall(s) of the polymer bump 114, on the passivation layer 34 and on the pad 32, such as aluminum pad or copper pad, exposed by the opening 36. The material of the adhesion/barrier layer 116 may be titanium, a titanium-tungsten alloy, titanium nitride, chromium, tantalum, tantalum nitride or a composite of the abovementioned materials. Alternatively, the adhesion/barrier layer 116 can be formed by an evaporation process, a chemical vapor deposition (CVD) process, a PVD (Physical Vapor Deposition) process or an electroless plating process.

For example, the adhesion/barrier layer 116 may be formed by sputtering a titanium layer with a thickness of between 0.02 and 0.8 µm, and preferably of between 0.05 and 0.2 µm, on the entire top surface and entire sidewall(s) of the polymer bump 114, on the passivation layer 34 and on the pad 32, principally made of aluminum, exposed by the opening 36. Alternatively, the adhesion/barrier layer 116 may be formed by sputtering a titanium-tungsten-alloy layer with a thickness of between 0.02 and 0.8 µm, and preferably of between 0.05 and 0.2 µm, on the entire top surface and entire sidewall(s) of the polymer bump 114, on the passivation layer 34 and on the pad 32, principally made of aluminum, exposed by the opening 36. Alternatively, the adhesion/barrier layer 116 may be formed by sputtering a titanium-nitride layer with a thickness of between 0.02 and 0.8 µm, and preferably of between 0.05 and 0.2 µm, on the entire top surface and entire sidewall(s) of the polymer bump 114, on the passivation layer 34 and on the pad 32, principally made of aluminum, exposed by the opening 36. Alternatively, the adhesion/barrier layer 116 may be formed by sputtering a chromium layer with a thickness of between 0.02 and 0.8 µm, and preferably of between 0.05 and 0.2 µm, on the entire top surface and entire sidewall(s) of the polymer bump 114, on the passivation layer 34 and on the pad 32, principally made of aluminum, exposed by the opening 36. Alternatively, the adhesion/barrier layer 116 may be formed by sputtering a tantalum-nitride layer with a thickness of between 0.02 and 0.8 µm, and preferably of between 0.05 and 0.2 µm, on the entire top surface and entire sidewall(s) of the polymer bump 114, on the passivation layer 34 and on the pad 32, principally made of aluminum, exposed by the opening 36. Alternatively, the adhesion/barrier layer 116 may be formed by sputtering a tantalum layer with a thickness of between 0.02 and 0.8 µm, and preferably of between 0.05 and 0.2 µm, on the entire top surface and entire sidewall(s) of the polymer bump 114, on the passivation layer 34 and on the pad 32, principally made of aluminum, exposed by the opening 36.

For example, the adhesion/barrier layer 116 may be formed by sputtering a titanium layer with a thickness of between 0.02 and 0.8 µm, and preferably of between 0.05 and 0.2 µm, on the entire top surface and entire sidewall(s) of the polymer bump 114, on the passivation layer 34 and on the pad 32, principally made of copper, exposed by the opening 36. Alternatively, the adhesion/barrier layer 116 may be formed by sputtering a titanium-tungsten-alloy layer with a thickness of between 0.02 and 0.8 µm, and preferably of between 0.05 and 0.2 µm, on the entire top surface and entire sidewall(s) of the polymer bump 114, on the passivation layer 34 and on the pad 32, principally made of copper, exposed by the opening 36. Alternatively, the adhesion/barrier layer 116 may be formed by sputtering a titanium-nitride layer with a thickness of between 0.02 and 0.8 µm, and preferably of between 0.05 and 0.2 µm, on the entire top surface and entire sidewall(s) of the polymer bump 114, on the passivation layer 34 and on the pad 32, principally made of copper, exposed by the opening 36. Alternatively, the adhesion/barrier layer 116 may be formed by sputtering a chromium layer with a thickness of between 0.02 and 0.8 µm, and preferably of between 0.05 and 0.2 µm, on the entire top surface and entire sidewall(s) of the polymer bump 114, on the passivation layer 34 and on the pad 32, principally made of copper, exposed by the opening 36. Alternatively, the adhesion/barrier layer 116 may be formed by sputtering a tantalum-nitride layer with a thickness of between 0.02 and 0.8 μm, and preferably of between 0.05 and 0.2 μm, on the entire top surface and entire sidewall(s) of the polymer bump 114, on the passivation layer 34 and on the pad 32, principally made of copper, exposed by the opening 36. Alternatively, the adhesion/barrier layer 116 may be formed by sputtering a tantalum layer with a thickness of between 0.02 and 0.8 μm, and preferably of between 0.05 and 0.2 μm, on the entire top surface and entire sidewall(s) of the polymer bump 114, on the passivation layer 34 and on the pad 32, principally made of copper, exposed by the opening 36.

Figure 2D:
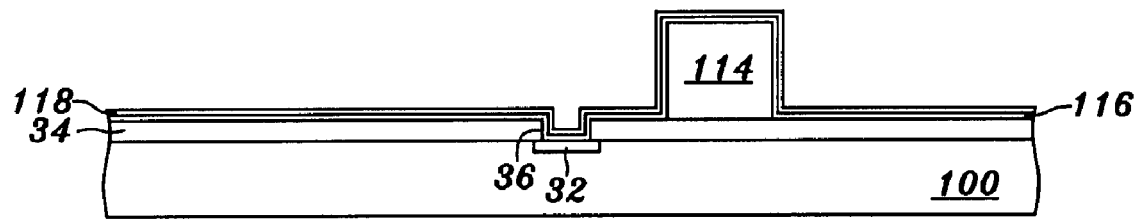

Referring to FIG. 2D, a seed layer 118 having a thickness of between 0.005 and 2 μm, and preferably of between 0.1 and 0.7 μm, can be sputtered on the adhesion/barrier layer 116. Alternatively, the seed layer 118 can be formed by a vapor deposition method, an electroless plating method or a PVD (Physical Vapor Deposition) method. The seed layer 118 is beneficial to electroplating a metal layer thereon. Thus, the material of the seed layer 118 varies with the material of the electroplated metal layer formed on the seed layer 118. When a gold layer is to be electroplated on the seed layer 118, gold is a preferable material to the seed layer 118. When a copper layer is to be electroplated on the seed layer 118, copper is a preferable material to the seed layer 118.

For example, when the adhesion/barrier layer 116 is formed by sputtering a titanium layer with a thickness of between 0.02 and 0.8 μm, and preferably of between 0.05 and 0.2 μm, the seed layer 118 can be formed by sputtering a gold layer with a thickness of between 0.005 and 2 μm, and preferably of between 0.1 and 0.7 μm, on the titanium layer. When the adhesion/barrier layer 116 is formed by sputtering a titanium-tungsten-alloy layer with a thickness of between 0.02 and 0.8 μm, and preferably of between 0.05 and 0.2 μm, the seed layer 118 can be formed by sputtering a gold layer with a thickness of between 0.005 and 2 μm, and preferably of between 0.1 and 0.7 μm, on the titanium-tungsten-alloy layer. When the adhesion/barrier layer 116 is formed by sputtering a titanium-nitride layer with a thickness of between 0.02 and 0.8 μm, and preferably of between 0.05 and 0.2 μm, the seed layer 118 can be formed by sputtering a gold layer with a thickness of between 0.005 and 2 μm, and preferably of between 0.1 and 0.7 μm, on the titanium-nitride layer. When the adhesion/barrier layer 116 is formed by sputtering a chromium layer with a thickness of between 0.02 and 0.8 μm, and preferably of between 0.05 and 0.2 μm, the seed layer 118 can be formed by sputtering a gold layer with a thickness of between 0.005 and 2 μm, and preferably of between 0.1 and 0.7 μm, on the chromium layer. When the adhesion/barrier layer 116 is formed by sputtering a tantalum-nitride layer with a thickness of between 0.02 and 0.8 μm, and preferably of between 0.05 and 0.2 μm, the seed layer 118 can be formed by sputtering a gold layer with a thickness of between 0.005 and 2 μm, and preferably of between 0.1 and 0.7 μm, on the tantalum-nitride layer. When the adhesion/barrier layer 116 is formed by sputtering a tantalum layer with a thickness of between 0.02 and 0.8 μm, and preferably of between 0.05 and 0.2 μm, the seed layer 118 can be formed by sputtering a gold layer with a thickness of between 0.005 and 2 μm, and preferably of between 0.1 and 0.7 μm, on the tantalum layer.

For example, when the adhesion/barrier layer 116 is formed by sputtering a titanium layer with a thickness of between 0.02 and 0.8 μm, and preferably of between 0.05 and 0.2 μm, the seed layer 118 can be formed by sputtering a copper layer with a thickness of between 0.005 and 2 μm, and preferably of between 0.1 and 0.7 μm, on the titanium layer. When the adhesion/barrier layer 116 is formed by sputtering a titanium-tungsten-alloy layer with a thickness of between 0.02 and 0.8 μm, and preferably of between 0.05 and 0.2 μm, the seed layer 118 can be formed by sputtering a copper layer with a thickness of between 0.005 and 2 μm, and preferably of between 0.1 and 0.7 μm, on the titanium-tungsten-alloy layer. When the adhesion/barrier layer 116 is formed by sputtering a titanium-nitride layer with a thickness of between 0.02 and 0.8 μm, and preferably of between 0.05 and 0.2 μm, the seed layer 118 can be formed by sputtering a copper layer with a thickness of between 0.005 and 2 μm, and preferably of between 0.1 and 0.7 μm, on the titanium-nitride layer. When the adhesion/barrier layer 116 is formed by sputtering a chromium layer with a thickness of between 0.02 and 0.8 μm, and preferably of between 0.05 and 0.2 μm, the seed layer 118 can be formed by sputtering a copper layer with a thickness of between 0.005 and 2 μm, and preferably of between 0.1 and 0.7 μm, on the chromium layer. When the adhesion/barrier layer 116 is formed by sputtering a tantalum-nitride layer with a thickness of between 0.02 and 0.8 μm, and preferably of between 0.05 and 0.2 μm, the seed layer 118 can be formed by sputtering a copper layer with a thickness of between 0.005 and 2 μm, and preferably of between 0.1 and 0.7 μm, on the tantalum-nitride layer. When the adhesion/barrier layer 116 is formed by sputtering a tantalum layer with a thickness of between 0.02 and 0.8 μm, and preferably of between 0.05 and 0.2 μm, the seed layer 118 can be formed by sputtering a copper layer with a thickness of between 0.005 and 2 μm, and preferably of between 0.1 and 0.7 μm, on the tantalum layer.

Figure 2E:
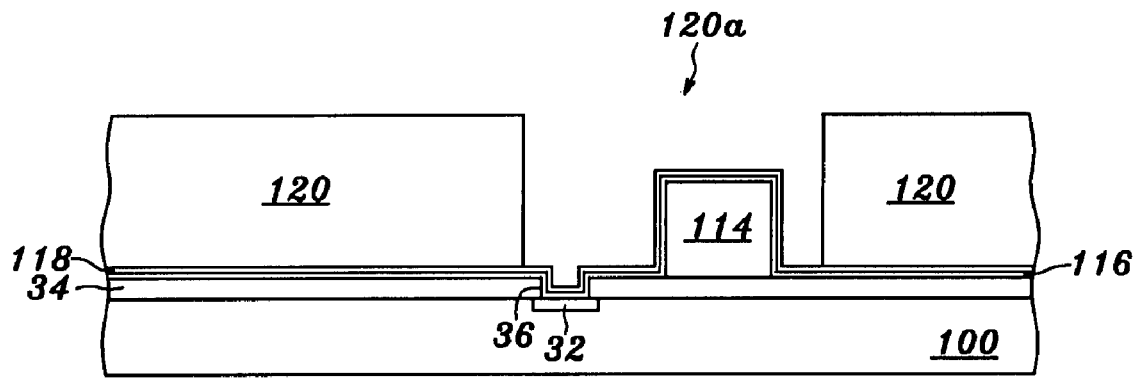

Referring to FIG. 2E, a photoresist layer 120, such as positive-type photoresist layer, having a thickness of between 6 and 100 μm, and preferably of between 10 and 50 μm, is spin-on coated on the seed layer 118. Next, the photoresist layer 120 is patterned with exposure and development processes to form an opening 120a in the photoresist layer 120 exposing the seed layer 118 at the entire top surface and entire sidewall(s) of the polymer bump 114, over the passivation layer 34 and over the pad 32. A 1X stepper or 1X contact aligner can be used to expose the photoresist layer 120 during the process of exposure.

For example, the photoresist layer 120 can be formed by spin-on coating a positive-type photosensitive polymer layer having a thickness of between 7 and 90 μm, and preferably of between 8 and 45 μm, on the seed layer 118, then exposing the photosensitive polymer layer using a 1X stepper or 1X contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants from the seed layer 118 with an $O_2$ plasma or a plasma containing fluorine of below 200 PPM and oxygen, such that the photoresist layer 120 can be patterned with an opening 120a in the photoresist layer 120 exposing the seed layer 118 at the entire top surface and entire sidewall(s) of the polymer bump 114, over the passivation layer 34 and over the pad 32.

Figure 2F:
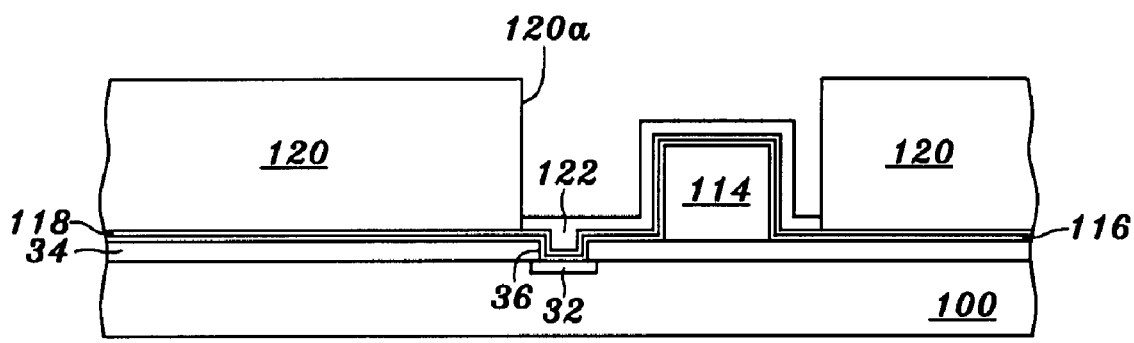

Referring to FIG. 2F, a metal layer 122 having a thickness of between 1 and 20 μm, and preferably of between 1.5 and 15 μm, can be electroplated and/or electroless plated over the seed layer 118 exposed by the opening 120a. The metal layer 122 may be a single layer of gold, copper, silver, palladium, platinum, rhodium, ruthenium, rhenium or nickel, or a composite layer made of the abovementioned metals.

For example, the metal layer 122 may be formed by electroplating a gold layer with a thickness of between 1 and 20 µm, and preferably of between 1.5 and 15 µm, on the seed layer 118, made of gold, exposed by the opening 120a. Alternatively, the metal layer 122 may be formed by electroplating a copper layer with a thickness of between 1 and 20 µm, and preferably of between 1.5 and 15 µm, on the seed layer 118, made of copper, exposed by the opening 120a. Alternatively, the metal layer 122 may be formed by electroplating a copper layer with a thickness of between 0.5 and 10 µm on the seed layer 118, made of copper, exposed by the opening 120a, and then electroplating a gold layer with a thickness of between 0.5 and 10 µm on the copper layer in the opening 120a, wherein the thickness of the copper layer and the gold layer is between 1 and 20 µm, and preferably of between 1.5 and 15 µm. Alternatively, the metal layer 122 may be formed by electroplating a copper layer with a thickness of between 0.5 and 10 µm on the seed layer 118, made of copper, exposed by the opening 120a, then electroplating a nickel layer with a thickness of between 0.25 and 5 µm on the copper layer in the opening 120a, and then electroplating a gold layer with a thickness of between 0.25 and 5 µm on the nickel layer in the opening 120a, wherein the thickness of the copper layer, the nickel layer and the gold layer is between 1 and 20 µm, and preferably of between 1.5 and 15 µm. Alternatively, the metal layer 122 may be formed by electroplating a copper layer with a thickness of between 0.5 and 13 µm on the seed layer 118, made of copper, exposed by the opening 120a, then electroplating a nickel layer with a thickness of between 0.45 and 5 µm on the copper layer in the opening 120a, and then electroless plating a gold layer with a thickness of between 0.05 and 2 µm on the nickel layer in the opening 120a, wherein the thickness of the copper layer, the nickel layer and the gold layer is between 1 and 20 µm, and preferably of between 1.5 and 15 µm. Alternatively, the metal layer 122 may be formed by electroplating a copper layer with a thickness of between 0.5 and 10 µm on the seed layer 118, made of copper, exposed by the opening 120a, then electroplating a nickel layer with a thickness of between 0.25 and 5 µm on the copper layer in the opening 120a, and then electroplating a palladium layer with a thickness of between 0.25 and 5 µm on the nickel layer in the opening 120a, wherein the thickness of the copper layer, the nickel layer and the palladium layer is between 1 and 20 µm, and preferably of between 1.5 and 15 µm. Alternatively, the metal layer 122 may be formed by electroplating a copper layer with a thickness of between 0.5 and 13 µm on the seed layer 118, made of copper, exposed by the opening 120a, then electroplating a nickel layer with a thickness of between 0.45 and 5 µm on the copper layer in the opening 120a, and then electroless plating a palladium layer with a thickness of between 0.05 and 2 µm on the nickel layer in the opening 120a, wherein the thickness of the copper layer, the nickel layer and the palladium layer is between 1 and 20 µm, and preferably of between 1.5 and 15 µm. Alternatively, the metal layer 122 may be formed by electroplating a copper layer with a thickness of between 0.5 and 10 µm on the seed layer 118, made of copper, exposed by the opening 120a, then electroplating a nickel layer with a thickness of between 0.25 and 5 µm on the copper layer in the opening 120a, and then electroplating a platinum layer with a thickness of between 0.25 and 5 µm on the nickel layer in the opening 120a, wherein the thickness of the copper layer, the nickel layer and the platinum layer is between 1 and 20 µm, and preferably of between 1.5 and 15 µm. Alternatively, the metal layer 122 may be formed by electroplating a copper layer with a thickness of between 0.5 and 13 µm on the seed layer 118, made of copper, exposed by the opening 120a, then electroplating a nickel layer with a thickness of between 0.45 and 5 µm on the copper layer in the opening 120a, and then electroless plating a platinum layer with a thickness of between 0.05 and 2 µm on the nickel layer in the opening 120a, wherein the thickness of the copper layer, the nickel layer and the platinum layer is between 1 and 20 µm, and preferably of between 1.5 and 15 µm.

Figure 2G:
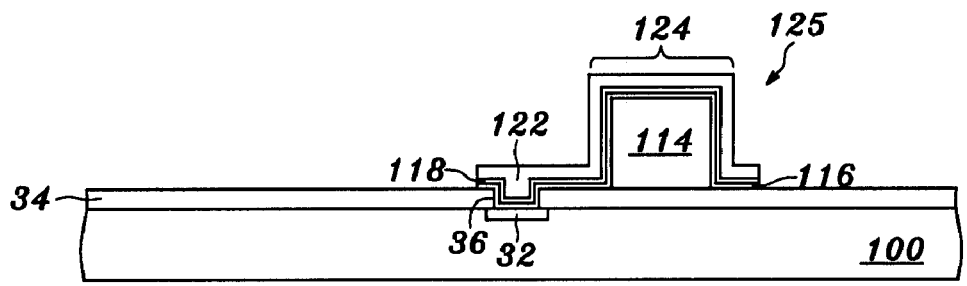

Referring to FIG. 2G, after the metal layer 122 is formed, most of the photoresist layer 120 can be removed using an organic solution with amide. However, some residuals from the photoresist layer 120 could remain on the metal layer 122 and on the seed layer 118. Thereafter, the residuals can be removed from the metal layer 122 and from the seed layer 118 with a plasma, such as $O_2$ plasma or plasma containing fluorine of below 200 PPM and oxygen.

Next, the seed layer 118 and the adhesion/barrier layer 116 not under the metal layer 122 are subsequently removed with a dry etching method or a wet etching method. As to the wet etching method, when the seed layer 118 is a gold layer, it can be etched with an iodine-containing solution, such as solution containing potassium iodide; when the seed layer 118 is a copper layer, it can be etched with a solution containing $NH_4OH$; when the adhesion/barrier layer 116 is a titanium-tungsten-alloy layer, it can be etched with a solution containing hydrogen peroxide; when the adhesion/barrier layer 116 is a titanium layer, it can be etched with a solution containing hydrogen fluoride; when the adhesion/barrier layer 116 is a chromium layer, it can be etched with a solution containing potassium ferricyanide. As to the dry etching method, when the seed layer 118 is a gold layer, it can be removed with an ion milling process or with an Ar sputtering etching process; when the adhesion/barrier layer 116 is a titanium layer or a titanium-tungsten-alloy layer, it can be etched with a chlorine-containing plasma etching process or with an RIE process. Generally, the dry etching method to etch the seed layer 118 and the adhesion/barrier layer 116 not under the metal layer 122 may include a chemical plasma etching process, a sputtering etching process, such as argon sputter process, or a chemical vapor etching process.

Thereby, a metal trace 125, formed with the adhesion/barrier layer 116, the seed layer 118 and the metal layer 122, includes a bonding pad 124 on the top surface of the polymer bump 114. The bonding pad 124 is used to be connected to an external circuit, and from a top perspective view, the position of the bonding pad 124 is different from that of the pad 32, to which the metal trace 125 is connected. The external circuit may be a semiconductor chip or wafer, a flexible substrate comprising a polymer layer (such as polyimide) having a thickness of between 30 and 200 µm and not comprising any polymer layer with glass fiber, a glass substrate, a ceramic substrate comprising a ceramic material as insulating layers between circuit layers, a silicon substrate or an organic substrate. Alternatively, the bonding pad 124 can be connected to a printed circuit board (PCB) via a TAB (tape automated bonding) method.

Figure 2H:
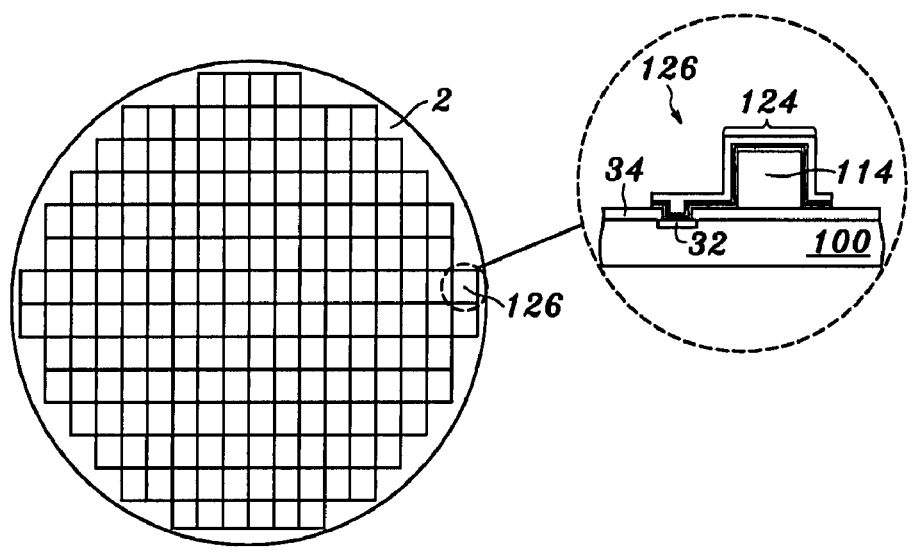

Referring to FIG. 2H, after the seed layer 118 and the adhesion/barrier layer 116 not under the metal layer 122 are removed, a semiconductor wafer formed with the polymer bump 114 and the metal layers 116, 118 and 122 can be diced into a plurality of individual semiconductor chips 126, IC (integrated circuit) chips.

Figure 2I:
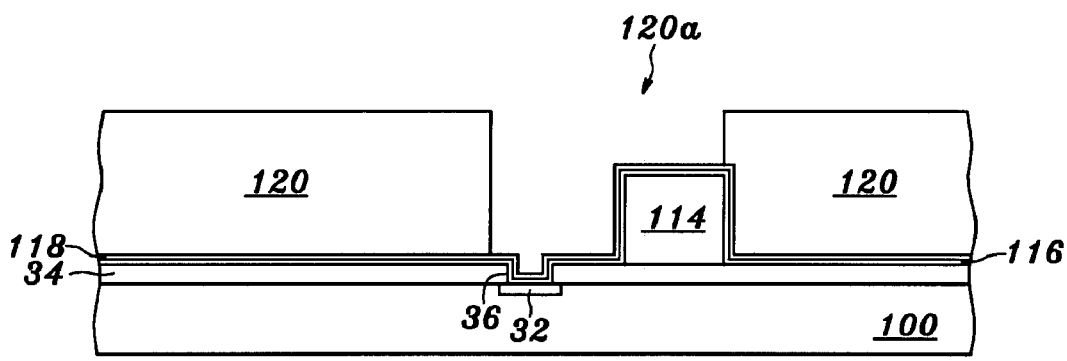
Figure 2J:
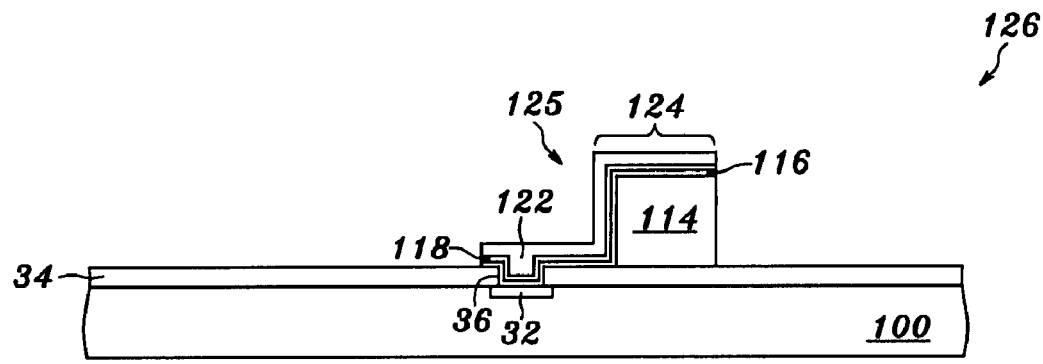

Alternatively, referring to FIG. 2I, after the seed layer 118 shown in FIG. 2D is formed, a photoresist layer 120 having a thickness of between 6 and 100 µm, and preferably of between 10 and 50 µm, is spin-on coated on the seed layer 118. Next, the photoresist layer 120 is patterned with exposure and development processes to form an opening 120a in the photoresist layer 120 exposing the seed layer 118 at the entire top surface and a portion of the sidewall(s) of the polymer bump 114, over the passivation layer 34 and over the pad 32. Next, the steps as referred to in FIGS. 2F-2G are performed in sequence. Next, referring to FIG. 2J, the semiconductor wafer can be diced into a plurality of individual semiconductor chips 126.

Figure 2K:
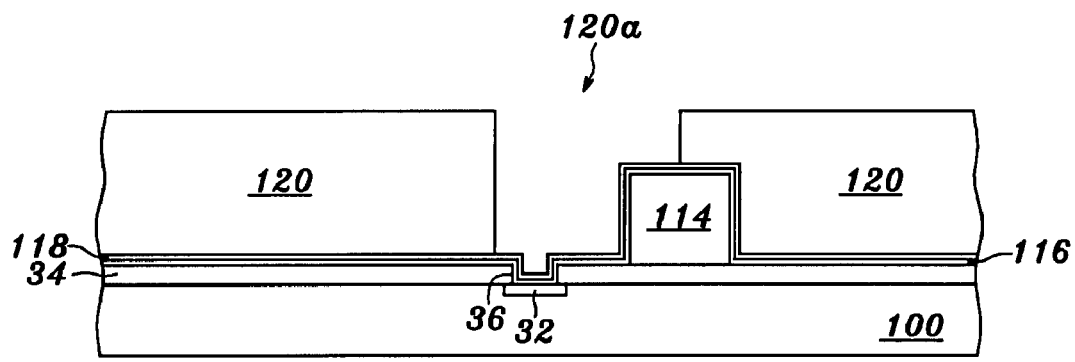
Figure 2L:
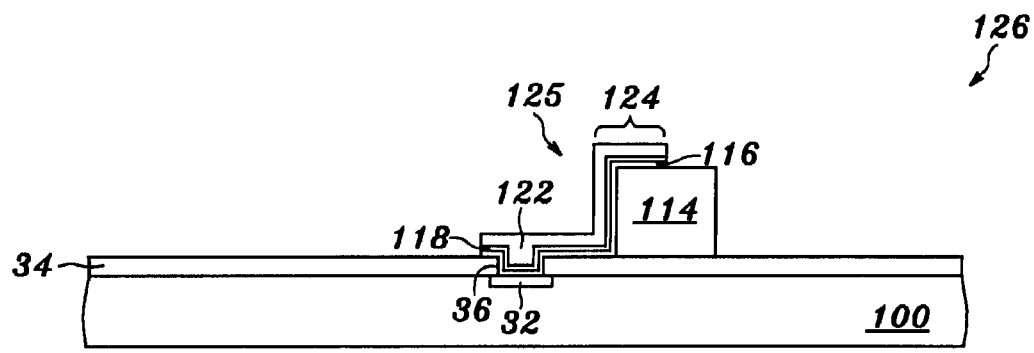

Alternatively, referring to FIG. 2K, after the seed layer 118 is formed, a photoresist layer 120 having a thickness of between 6 and 100 μm, and preferably of between 10 and 50 μm, is spin-on coated on the seed layer 118. Next, the photoresist layer 120 is patterned with the processes of exposure, development, etc., to form an opening 120a in the photoresist layer 120 exposing the seed layer 118 at a portion of the top surface and a portion of the sidewall(s) of the polymer bump 114, over the passivation layer 34 and over the pad 32. Next, the steps as referred to in FIGS. 2F-2G are performed in sequence. Next, referring to FIG. 2L, the semiconductor wafer can be diced into a plurality of individual semiconductor chips 126.

Aspect 2 of Embodiment 1

Figure 3A:
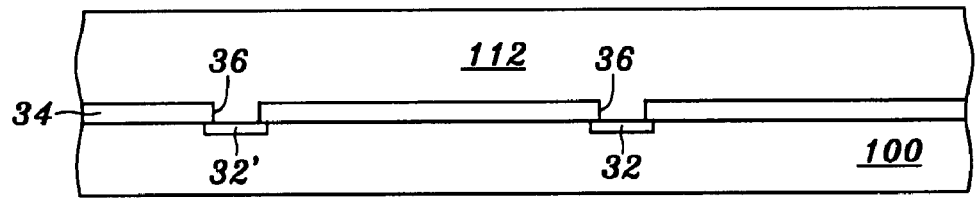
FIGS. 3A through 3L are sectional views showing a process according to another one embodiment of the present invention.
Figure 3B:
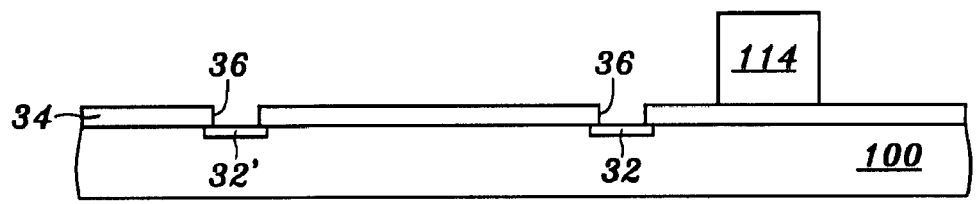

Referring to FIG. 3A, a polymer layer 112 is formed on the passivation layer 34 and on the multiple pads 32 and 32' exposed by multiple openings 36 via a spin-on coating process. The specification of pads 32 and 32' shown in FIGS. 3A-3L, 4A-4I, 5A-5N, 6A-6J, 8A-8L, 9A-9I, 10A-10K, 12A-12I and 13A-13I can be referred to as that of the pad 32 shown in FIG. 1A. Referring to FIG. 3B, the polymer layer 112 is patterned with exposure and development processes to form at least one polymer bump 114 on the passivation layer 34. From a top perspective view, the position of the polymer bump 114 is different from that of the pad 32 exposed by the opening 36. The specification of the polymer bump 114 shown in FIG. 3B can be referred to as the polymer bump 114 illustrated in FIG. 2B. The process of forming the polymer bump 114 shown in FIG. 3B can be referred to as the process of forming the polymer bump 114 illustrated in FIG. 2B. Further, there may be some of the active devices, such as p-channel MOS devices, n-channel MOS devices, CMOS (Complementary Metal Oxide Semiconductor) devices, BJT (Bipolar Junction Transistor) devices or BiCMOS (Bipolar CMOS) devices, under the polymer bump 114. Alternatively, there may be no active devices under the polymer bump 114.

Figure 3C:
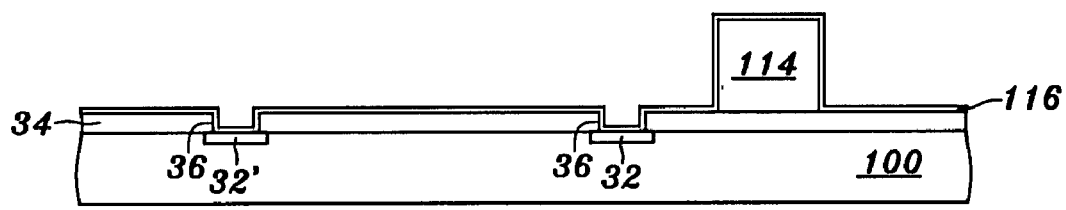

Referring to FIG. 3C, an adhesion/barrier layer 116 having a thickness of between 0.02 and 0.8 μm, and preferably of between 0.05 and 0.2 μm, can be sputtered on the passivation layer 34, on an entire top surface and entire sidewall(s) of the polymer bump 114 and on the pads 32 and 32', such as aluminum pads or copper pads, exposed by the openings 36. The material of the adhesion/barrier layer 116 may be titanium, a titanium-tungsten alloy, titanium nitride, chromium, tantalum, tantalum nitride or a composite of the abovementioned materials. Alternatively, the adhesion/barrier layer 116 can be formed by an evaporation process, a chemical vapor deposition (CVD) process, a PVD (Physical Vapor Deposition) process or an electroless plating process.

For example, the adhesion/barrier layer 116 may be formed by sputtering a titanium layer with a thickness of between 0.02 and 0.8 μm, and preferably of between 0.05 and 0.2 μm, on the passivation layer 34, on the entire top surface and entire sidewall(s) of the polymer bump 114 and on the pads 32 and 32', principally made of aluminum, exposed by the openings 36. Alternatively, the adhesion/barrier layer 116 may be formed by sputtering a titanium-tungsten-alloy layer with a thickness of between 0.02 and 0.8 μm, and preferably of between 0.05 and 0.2 μm, on the passivation layer 34, on the entire top surface and entire sidewall(s) of the polymer bump 114 and on the pads 32 and 32', principally made of aluminum, exposed by the openings 36. Alternatively, the adhesion/barrier layer 116 may be formed by sputtering a titanium-nitride layer with a thickness of between 0.02 and 0.8 μm, and preferably of between 0.05 and 0.2 μm, on the passivation layer 34, on the entire top surface and entire sidewall(s) of the polymer bump 114 and on the pads 32 and 32', principally made of aluminum, exposed by the openings 36. Alternatively, the adhesion/barrier layer 116 may be formed by sputtering a chromium layer with a thickness of between 0.02 and 0.8 μm, and preferably of between 0.05 and 0.2 μm, on the passivation layer 34, on the entire top surface and entire sidewall(s) of the polymer bump 114 and on the pads 32 and 32', principally made of aluminum, exposed by the openings 36. Alternatively, the adhesion/barrier layer 116 may be formed by sputtering a tantalum-nitride layer with a thickness of between 0.02 and 0.8 μm, and preferably of between 0.05 and 0.2 μm, on the passivation layer 34, on the entire top surface and entire sidewall(s) of the polymer bump 114 and on the pads 32 and 32', principally made of aluminum, exposed by the openings 36. Alternatively, the adhesion/barrier layer 116 may be formed by sputtering a tantalum layer with a thickness of between 0.02 and 0.8 μm, and preferably of between 0.05 and 0.2 μm, on the passivation layer 34, on the entire top surface and entire sidewall(s) of the polymer bump 114 and on the pads 32 and 32', principally made of aluminum, exposed by the openings 36.

For example, the adhesion/barrier layer 116 may be formed by sputtering a titanium layer with a thickness of between 0.02 and 0.8 μm, and preferably of between 0.05 and 0.2 μm, on the passivation layer 34, on the entire top surface and entire sidewall(s) of the polymer bump 114 and on the pads 32 and 32', principally made of copper, exposed by the openings 36. Alternatively, the adhesion/barrier layer 116 may be formed by sputtering a titanium-tungsten-alloy layer with a thickness of between 0.02 and 0.8 μm, and preferably of between 0.05 and 0.2 μm, on the passivation layer 34, on the entire top surface and entire sidewall(s) of the polymer bump 114 and on the pads 32 and 32', principally made of copper, exposed by the openings 36. Alternatively, the adhesion/barrier layer 116 may be formed by sputtering a titanium-nitride layer with a thickness of between 0.02 and 0.8 μm, and preferably of between 0.05 and 0.2 μm, on the passivation layer 34, on the entire top surface and entire sidewall(s) of the polymer bump 114 and on the pads 32 and 32', principally made of copper, exposed by the openings 36. Alternatively, the adhesion/barrier layer 116 may be formed by sputtering a chromium layer with a thickness of between 0.02 and 0.8 μm, and preferably of between 0.05 and 0.2 μm, on the passivation layer 34, on the entire top surface and entire sidewall(s) of the polymer bump 114 and on the pads 32 and 32', principally made of copper, exposed by the openings 36. Alternatively, the adhesion/barrier layer 116 may be formed by sputtering a tantalum-nitride layer with a thickness of between 0.02 and 0.8 μm, and preferably of between 0.05 and 0.2 μm, on the passivation layer 34, on the entire top surface and entire sidewall(s) of the polymer bump 114 and on the pads 32 and 32', principally made of copper, exposed by the openings 36. Alternatively, the adhesion/barrier layer 116 may be formed by sputtering a tantalum layer with a thickness of between 0.02 and 0.8 μm, and preferably of between 0.05 and 0.2 μm, on the passivation layer 34, on the entire top surface and entire sidewall(s) of the polymer bump 114 and on the pads 32 and 32', principally made of copper, exposed by the openings 36.

Figure 3D:
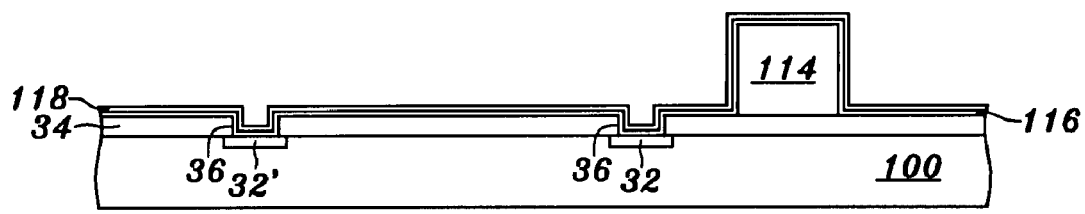

Referring to FIG. 3D, a seed layer 118 having a thickness of between 0.005 and 2 μm, and preferably of between 0.1 and 0.7 μm, can be sputtered on the adhesion/barrier layer 116. Alternatively, the seed layer 118 can be formed by a vapor deposition method, an electroless plating method or a PVD (Physical Vapor Deposition) method. The specification of the seed layer 118 shown in FIG. 3D can be referred to as the seed layer 118 illustrated in FIG. 2D. The process of forming the seed layer 118 shown in FIG. 3D can be referred to as the process of forming the seed layer 118 illustrated in FIG. 2D.

Figure 3E:
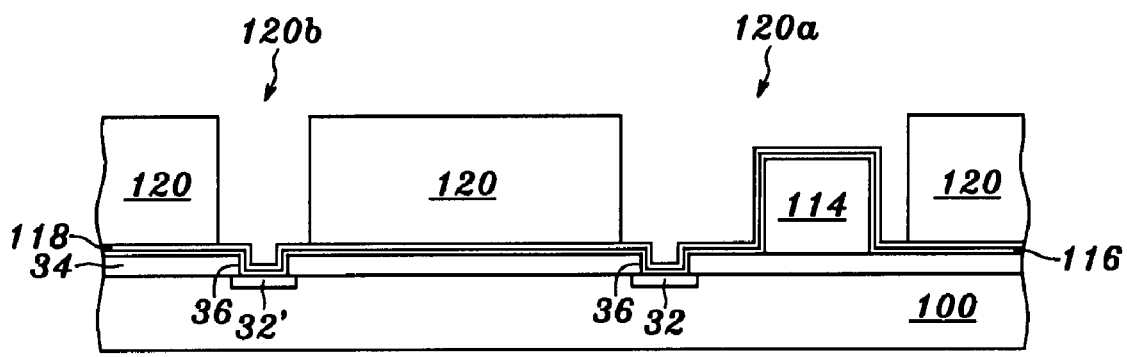

Referring to FIG. 3E, a photoresist layer 120, such as positive-type photoresist layer, having a thickness of between 6 and 100 μm, and preferably of between 10 and 50 μm, is spin-on coated on the seed layer 118. Next, the photoresist layer 120 is patterned with exposure and development processes to form an opening 120a in the photoresist layer 120 exposing the seed layer 118 at the entire top surface and entire sidewall(s) of the polymer bump 114, over the passivation layer 34 and over the pad 32, and to form an opening 120b in the photoresist layer 120 exposing the seed layer 118 over the pad 32' and over the passivation layer 34 close to the pad 32'. A 1X stepper or 1X contact aligner can be used to expose the photoresist layer 120 during the process of exposure.

For example, the photoresist layer 120 can be formed by spin-on coating a positive-type photosensitive polymer layer having a thickness of between 7 and 90 μm, and preferably of between 8 and 45 μm, on the seed layer 118, then exposing the photosensitive polymer layer using a 1X stepper or 1X contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants form the seed layer 118 with an $O_2$ plasma or a plasma containing fluorine of below 200 PPM and oxygen, such that the photoresist layer 120 can be patterned with an opening 120a in the photoresist layer 120 exposing the seed layer 118 at the entire top surface and entire sidewall(s) of the polymer bump 114, over the passivation layer 34 and over the pad 32, and with an opening 120b in the photoresist layer 120 exposing the seed layer 118 over the pad 32' and over the passivation layer 34 close to the pad 32'.

Figure 3F:
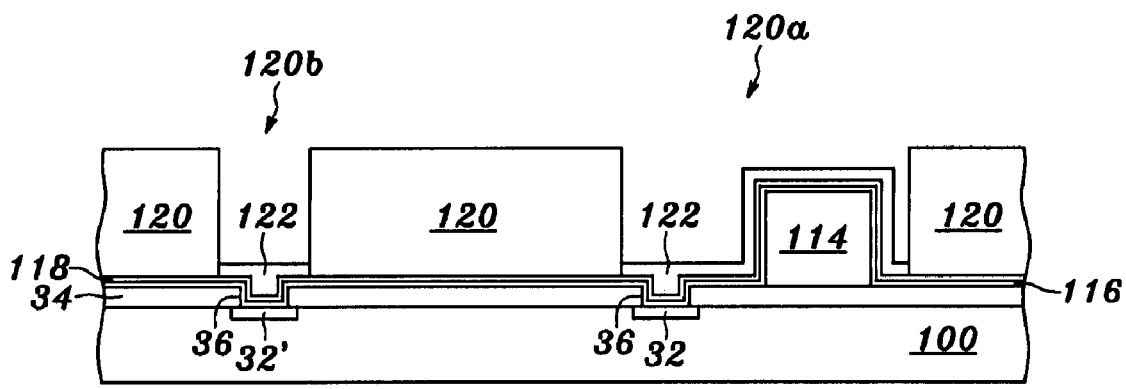

Referring to FIG. 3F, a metal layer 122 having a thickness of between 1 and 20 μm, and preferably of between 1.5 and 15 μm, can be electroplated and/or electroless plated over the seed layer 118 exposed by the openings 120a and 120b. The specification of the metal layer 122 shown in FIG. 3F can be referred to as the metal layer 122 illustrated in FIG. 2F. The process of forming the metal layer 122 shown in FIG. 3F can be referred to as the process of forming the metal layer 122 illustrated in FIG. 2F.

Figure 3G:
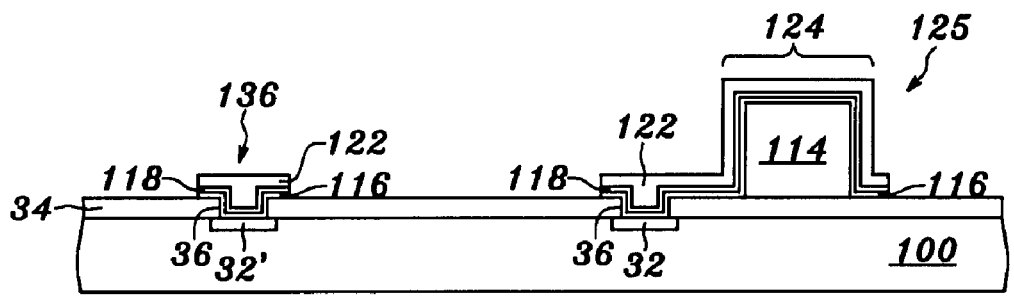

Referring to FIG. 3G, after the metal layer 122 is formed, most of the photoresist layer 120 can be removed using an organic solution with amide. However, some residuals from the photoresist layer 120 could remain on the metal layer 122 and on the seed layer 118. Thereafter, the residuals can be removed from the metal layer 122 and from the seed layer 118 with a plasma, such as $O_2$ plasma or plasma containing fluorine of below 200 PPM and oxygen.

Next, the seed layer 118 and the adhesion/barrier layer 116 not under the metal layer 122 are subsequently removed with a dry etching method or a wet etching method. The process of removing the seed layer 118 and the adhesion/barrier layer 116 not under the metal layer 122, as shown in FIG. 3G, can be referred to as the process of removing the seed layer 118 and the adhesion/barrier layer 116 not under the metal layer 122, as illustrated in FIG. 2G.

Thereby, a metal trace 125, formed with the adhesion/barrier layer 116, the seed layer 118 and the metal layer 122, includes a bonding pad 124 on the top surface of the polymer bump 114, and a bonding pad 136, formed with the adhesion/barrier layer 116, the seed layer 118 and the metal layer 122, is on the pad 32'. The bonding pad 124 is used to be connected to a semiconductor chip via a flip chip (FC) mothed, and from a top perspective view, the position of the bonding pad 124 is different from that of the pad 32, to which the metal trace 125 is connected. The bonding pad 136 is used to be connected to an external circuit via a wirebonding process, a solder bonding process or a tape-automated-bonding (TAB) process, for example. The external circuit may be another semiconductor chip, a flexible substrate comprising a polymer layer (such as polyimide) having a thickness of between 30 and 200 μm and not comprising any polymer layer with glass fiber, a glass substrate, a ceramic substrate comprising a ceramic material as insulating layers between circuit layers, a silicon substrate, an organic substrate, a printed circuit board (PCB) or a ball grid array (BGA) substrate.

Figure 3H:
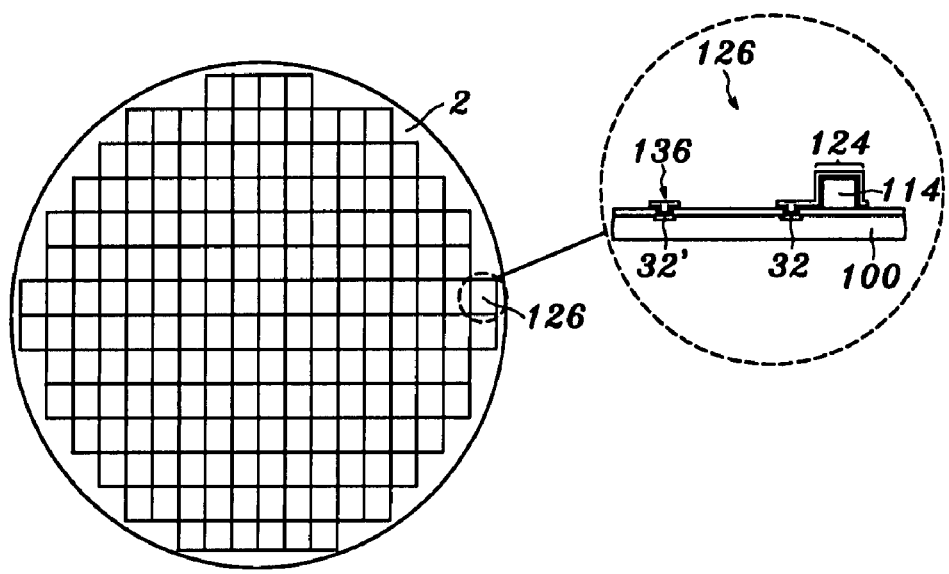

Referring to FIG. 3H, after the seed layer 118 and the adhesion/barrier layer 116 not under the metal layer 122 are removed, a semiconductor wafer formed with the polymer bump 114 and the metal layers 116, 118 and 122 can be diced into a plurality of individual semiconductor chips 126.

Figure 3I:
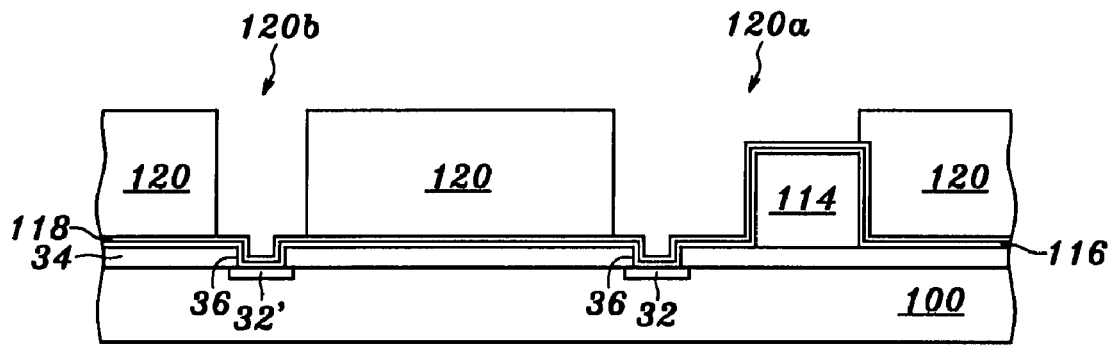
Figure 3J:
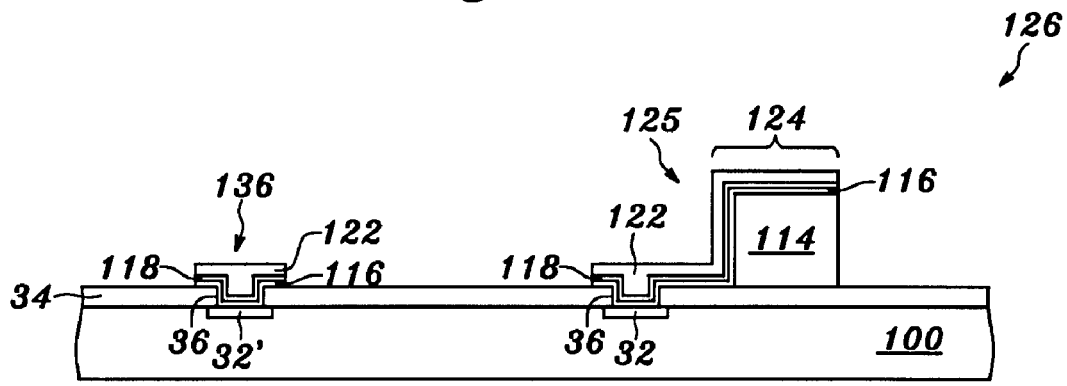

Alternatively, referring to FIG. 3I, after the seed layer 118 is formed, a photoresist layer 120 having a thickness of between 6 and 100 μm, and preferably of between 10 and 50 μm, is spin-on coated on the seed layer 118. Next, the photoresist layer 120 is patterned with exposure and development processes to form an opening 120a in the photoresist layer 120 exposing the seed layer 118 at the entire top surface and a portion of the sidewall(s) of the polymer bump 114, over the passivation layer 34 and over the pad 32, and to form an opening 120b in the photoresist layer 120 exposing the seed layer 118 over the pad 32' and over the passivation layer 34 close to the pad 32'. Next, the steps as referred to in FIGS. 3F-3G are performed in sequence. Next, referring to FIG. 3J, the semiconductor wafer can be diced into a plurality of individual semiconductor chips 126.

Figure 3K:
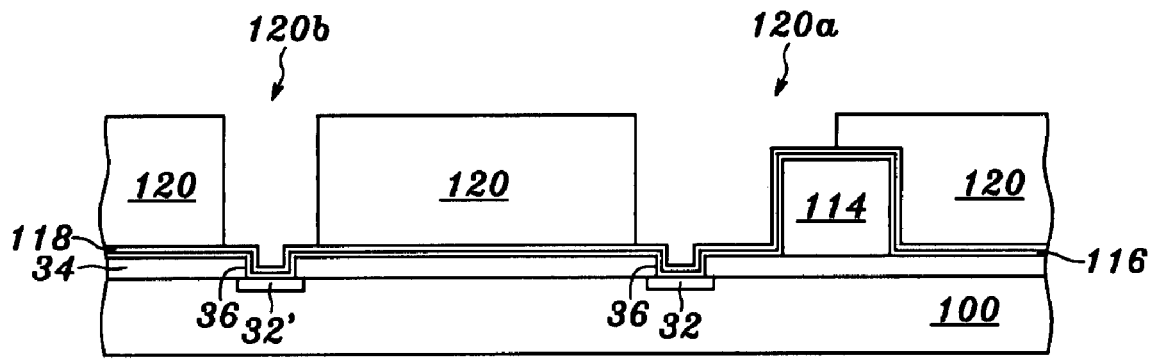
Figure 3L:
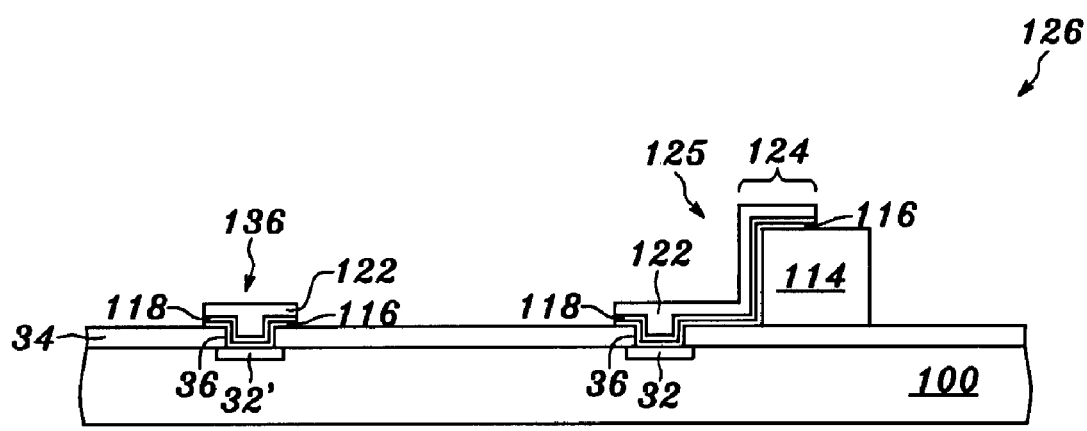

Alternatively, referring to FIG. 3K, after the seed layer 118 is formed, a photoresist layer 120 having a thickness of between 6 and 100 μm, and preferably of between 10 and 50 μm, is spin-on coated on the seed layer 118. Next, the photoresist layer 120 is patterned with exposure and development processes to form an opening 120a in the photoresist layer 120 exposing the seed layer 118 at a portion of the top surface and a portion of the sidewall(s) of the polymer bump 114, over the passivation layer 34 and over the pad 32, and to form an opening 120b in the photoresist layer 120 exposing the seed layer 118 over the pad 32' and over the passivation layer 34 close to the pad 32'. Next, the steps as referred to in FIGS. 3F-3G are performed in sequence. Next, referring to FIG. 3L, the semiconductor wafer can be diced into a plurality of individual semiconductor chips 126.

Aspect 3 of Embodiment 1

Figure 4A:
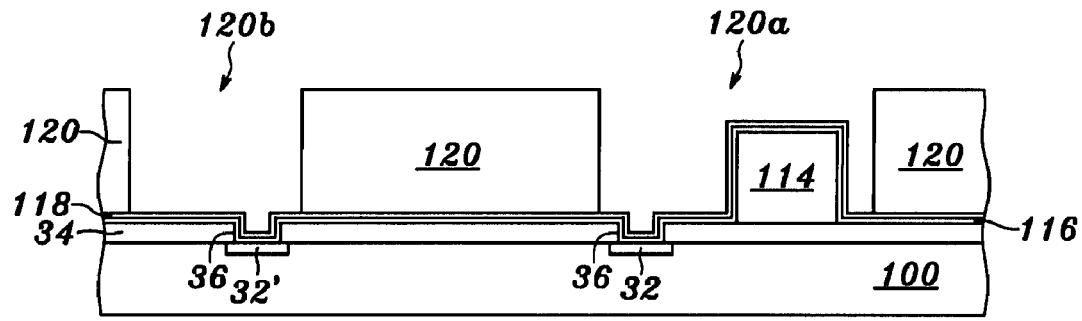
FIGS. 4A through 4I are sectional views showing a process according to another one embodiment of the present invention.

Referring to FIG. 4A, after the step shown in FIG. 3D is completed, a photoresist layer 120, such as positive-type photoresist layer, having a thickness of between 6 and 100 μm, and preferably of between 10 and 50 μm, is spin-on coated on the seed layer 118. Next, the photoresist layer 120 is patterned with exposure and development processes to form an opening 120a in the photoresist layer 120 exposing the seed layer 118 at the entire top surface and entire sidewall(s) of the polymer bump 114, over the passivation layer 34 and over the pad 32, and to form an opening 120b in the photoresist layer 120 exposing the seed layer 118 over the passivation layer 34 and over the pad 32'. A 1X stepper or 1X contact aligner can be used to expose the photoresist layer 120 during the process of exposure. The process of forming the photoresist layer 120 and the openings 120a and 120b, as shown in FIG. 4A, can be referred to as the process of forming the photoresist layer 120 and the openings 120a and 120b, as illustrated in FIG. 3E.

Figure 4B:
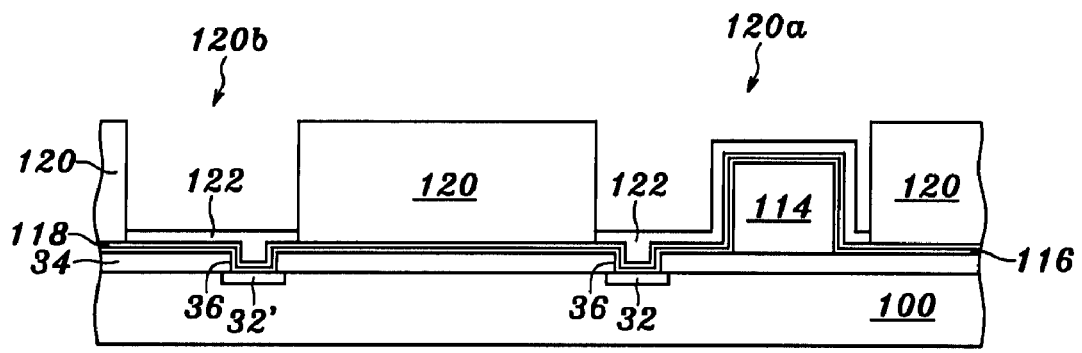

Referring to FIG. 4B, a metal layer 122 having a thickness of between 1 and 20 μm, and preferably of between 1.5 and 15 μm, can be electroplated and/or electroless plated over the seed layer 118 exposed by the openings 120a and 120b. The specification of the metal layer 122 shown in FIG. 4B can be referred to as the metal layer 122 illustrated in FIG. 2F. The process of forming the metal layer 122 shown in FIG. 4B can be referred to as the process of forming the metal layer 122 illustrated in FIG. 2F.

Figure 4C:
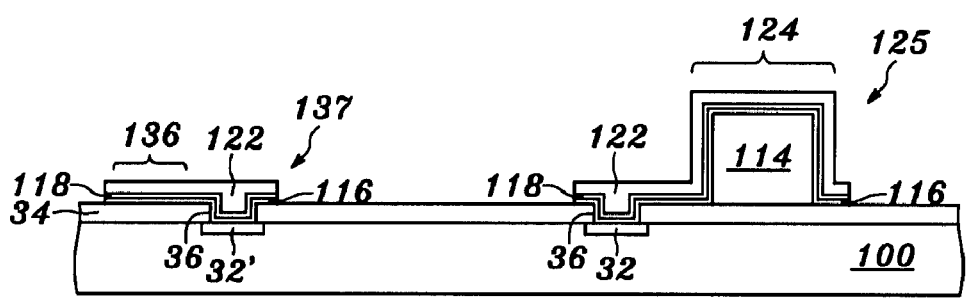

Referring to FIG. 4C, after the metal layer 122 is formed, most of the photoresist layer 120 can be removed using an organic solution with amide. However, some residuals from the photoresist layer 120 could remain on the metal layer 122 and on the seed layer 118. Thereafter, the residuals can be removed from the metal layer 122 and from the seed layer 118 with a plasma, such as O$_2$ plasma or plasma containing fluorine of below 200 PPM and oxygen.

Next, the seed layer 118 and the adhesion/barrier layer 116 not under the metal layer 122 are subsequently removed with a dry etching method or a wet etching method. The process of removing the seed layer 118 and the adhesion/barrier layer 116 not under the metal layer 122, as shown in FIG. 4C, can be referred to as the process of removing the seed layer 118 and the adhesion/barrier layer 116 not under the metal layer 122, as illustrated in FIG. 2G.

Figure 4D:
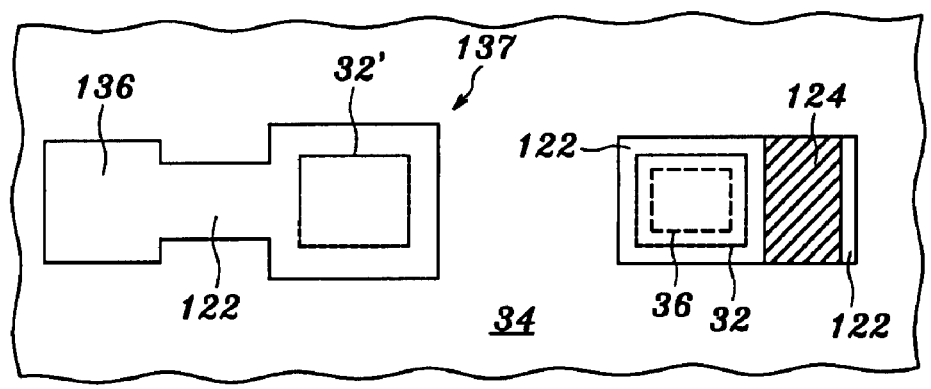

Thereby, referring to FIGS. 4C and 4D, at least two metal traces 125 and 137 are formed with the adhesion/barrier layer 116, the seed layer 118 and the metal layer 122, including a bonding pad 124 on the top surface of the polymer bump 114, and a bonding pad 136 on the passivation layer 34, connected to the pad 32' through the opening 36. The bonding pad 124 is used to be connected to a semiconductor chip via a flip chip (FC) mothed, and from a top perspective view, the position of the bonding pad 124 is different from that of the pad 32, to which the metal trace 125 is connected. The bonding pad 136 is used to be connected to an external circuit via a wirebonding process, a solder bonding process or a tape-automated-bonding (TAB) process, for example. From a top perspective view, the position of the bonding pad 136 may be different from that of the pad 32'. Alternatively, from a top perspective view, the position of the bonding pad 136 may be the same as that of the pad 32'. The external circuit may be another semiconductor chip, a flexible substrate comprising a polymer layer (such as polyimide) having a thickness of between 30 and 200 μm and not comprising any polymer layer with glass fiber, a glass substrate, a ceramic substrate comprising a ceramic material as insulating layers between circuit layers, a silicon substrate, an organic substrate, a printed circuit board (PCB) or a ball grid array (BGA) substrate.

Figure 4E:
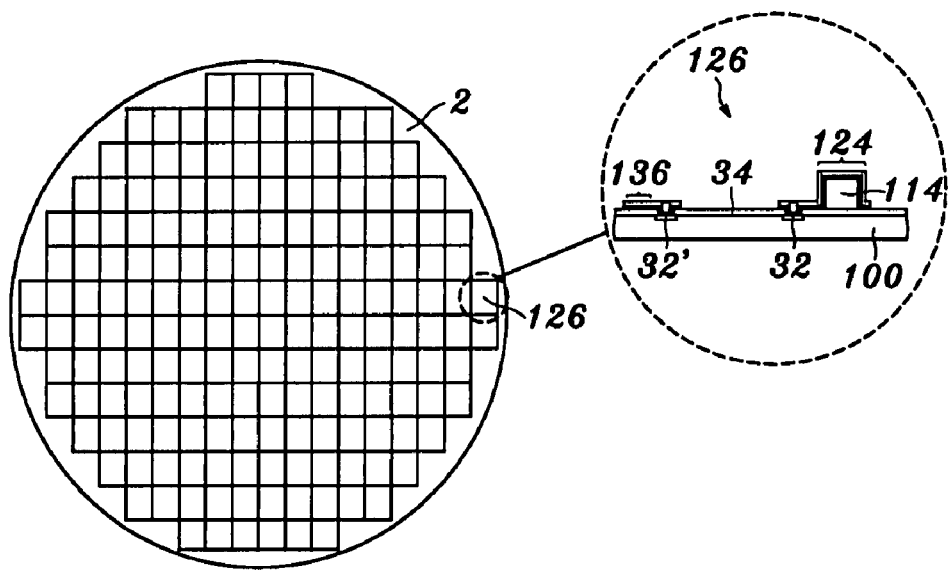

Referring to FIG. 4E, after the seed layer 118 and the adhesion/barrier layer 116 not under the metal layer 122 are removed, a semiconductor wafer formed with the polymer bump 114 and the metal layers 116, 118 and 122 can be diced into a plurality of individual semiconductor chips 126.

Figure 4F:
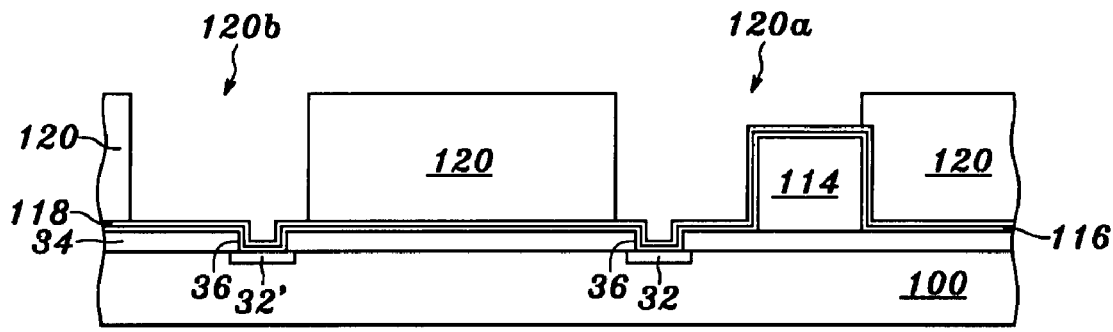
Figure 4G:
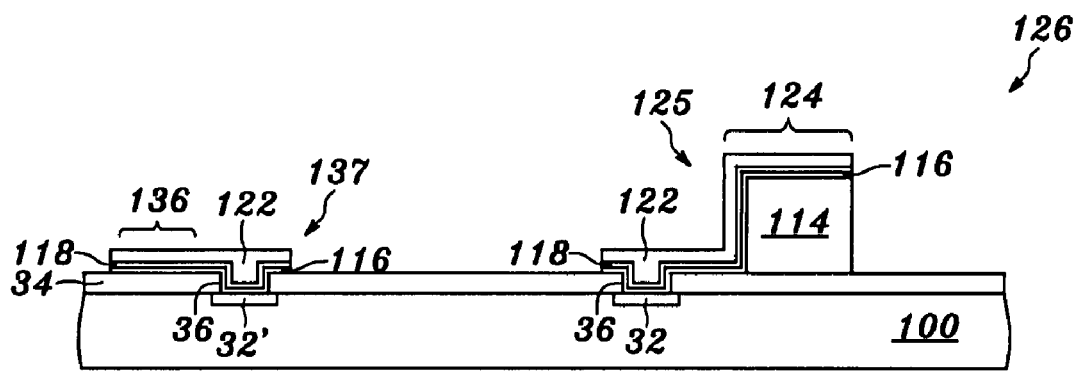

Alternatively, referring to FIG. 4F, after the seed layer 118 is formed, a photoresist layer 120 having a thickness of between 6 and 100 μm, and preferably of between 10 and 50 μm, is spin-on coated on the seed layer 118. Next, the photoresist layer 120 is patterned with exposure and development processes to form an opening 120a in the photoresist layer 120 exposing the seed layer 118 at the entire top surface and a portion of the sidewall(s) of the polymer bump 114, over the passivation layer 34 and over the pad 32, and to form an opening 120b in the photoresist layer 120 exposing the seed layer 118 over the passivation layer 34 and over the pad 32'. Next, the steps as referred to in FIGS. 4B-4C are performed in sequence. Next, referring to FIG. 4G, the semiconductor wafer can be diced into a plurality of individual semiconductor chips 126.

Figure 4H:
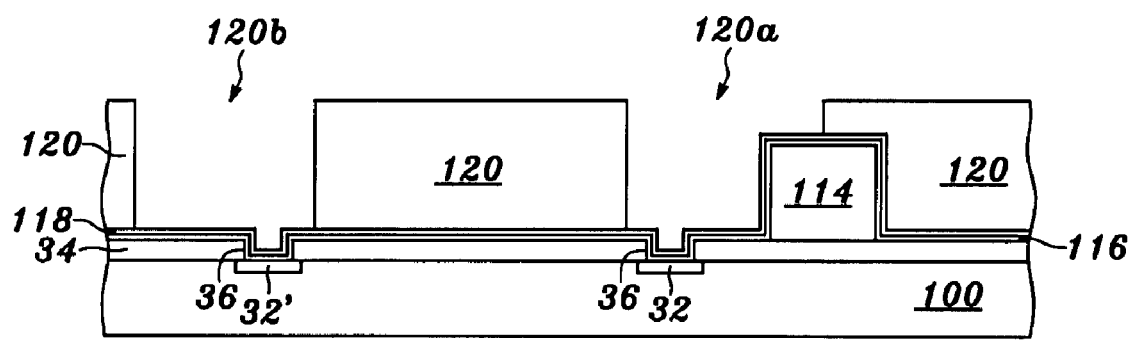
Figure 4I:
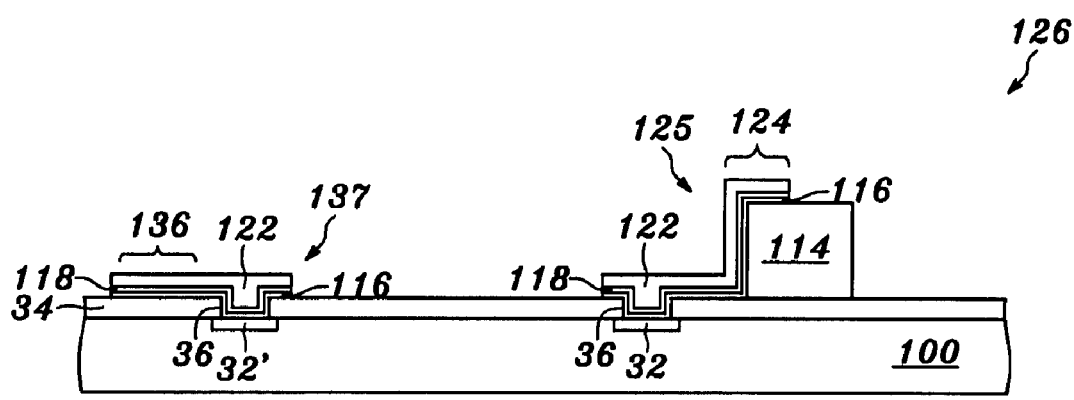

Alternatively, referring to FIG. 4H, after the seed layer 118 is formed, a photoresist layer 120 having a thickness of between 6 and 100 μm, and preferably of between 10 and 50 μm, is spin-on coated on the seed layer 118. Next, the photoresist layer 120 is patterned with exposure and development processes to form an opening 120a in the photoresist layer 120 exposing the seed layer 118 at a portion of the top surface and a portion of the sidewall(s) of the polymer bump 114, over the passivation layer 34 and over the pad 32, and to form an opening 120b in the photoresist layer 120 exposing the seed layer 118 over the passivation layer 34 and over the pad 32'. Next, the steps as referred to in FIGS. 4B-4C are performed in sequence. Next, referring to FIG. 4I, the semiconductor wafer can be diced into a plurality of individual semiconductor chips 126.

Aspect 4 of Embodiment 1

Figure 5A:
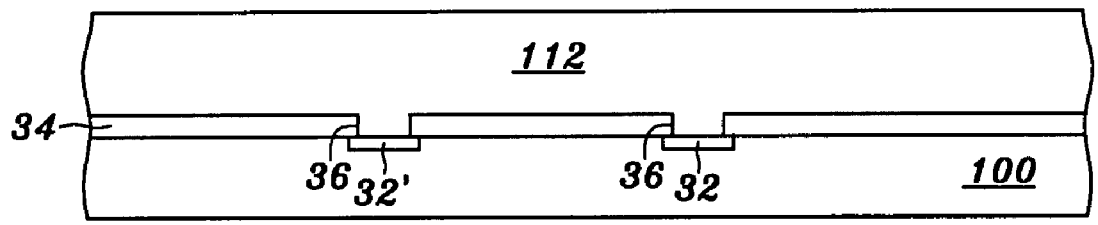
FIGS. 5A through 5N are sectional views showing a process according to another one embodiment of the present invention.
Figure 5B:
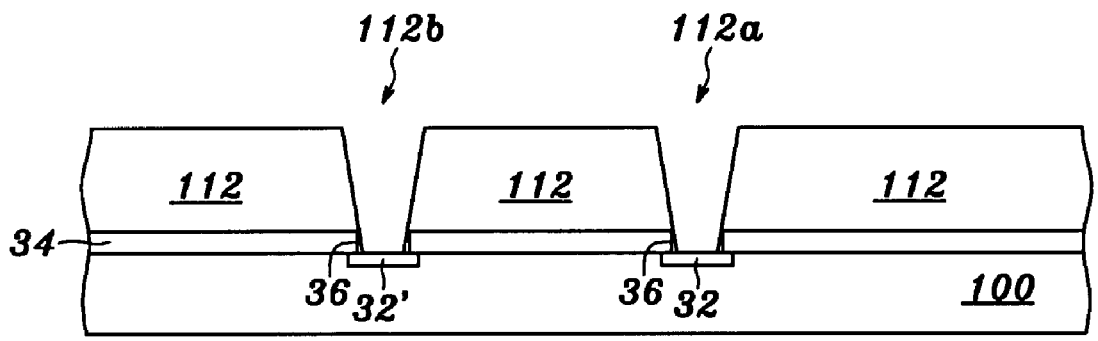

Referring to FIG. 5A, a polymer layer 112 is formed on the passivation layer 34 and on the multiple pads 32 and 32' exposed by multiple openings 36. Referring to FIG. 5B, the polymer layer 112 is patterned with exposure and development processes to form two openings 112a and 112b in the polymer layer 112 exposing two pads 36 and 36', respectively. The pads 32 and 32' may include a center portion exposed by two openings 112a and 112b, respectively, and a peripheral portion covered with the polymer layer 112, as shown in FIG. 5A. Alternatively, the openings 112a and 112b may expose the entire upper surface of the pads 32 and 32' exposed by the openings 36 in the passivation layer 34, respectively, and further may expose the upper surface of the passivation layer 34 adjacent to the pads 32 and 32', respectively.

The material of the polymer layer 112 may be polyimide (PI), benzocyclobutane (BCB), polyurethane, epoxy resin, a parylene-based polymer, a solder-mask material, an elastomer, silicone or a porous dielectric material. The polymer layer 112 having a thickness of between 5 and 50 μm can be formed by a process including a spin-on coating process, a lamination process or a screen-printing process.

For example, the polymer layer 112 can be formed by spin-on coating a negative-type photosensitive polyimide layer, containing ester-typer precursor, having a thickness of between 10 and 100 μm on the passivation layer 34, then baking the spin-on coated polyimide layer, then exposing the baked polyimide layer using a 1X stepper or 1X contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form two openings in the developed polyimide layer exposing the pads 32 and 32', respectively, then curing or heating the developed polyimide layer at a peak temperature of between 290 and 400° C. for a time of between 20 and 150 minutes in a nitrogen ambient or in an oxygen-free ambient, the cured polyimide layer having a thickness of between 5 and 50 µm, and then removing the residual polymeric material or other contaminants from the upper surface of the pads 32 and 32' exposed by the openings, respectively, with an $O_2$ plasma or a plasma containing fluorine of below 200 PPM and oxygen, such that the polymer layer 112 can be patterned with two openings 112a and 112b in the polymer layer 112 exposing two pads 32 and 32', respectively. Alternatively, the developed polyimide layer can be cured or heated at a temperature between 150 and 290° C., and preferably of between 260 and 280° C., for a time of between 20 and 150 minutes in a nitrogen ambient or in an oxygen-free ambient.

Figure 5C:
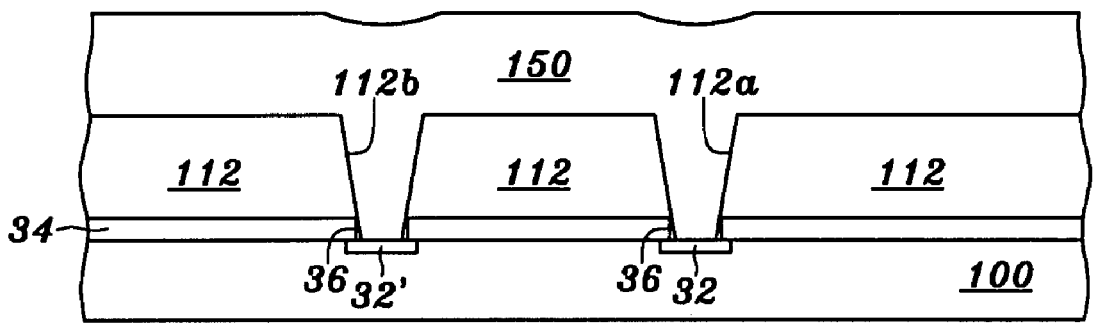
Figure 5D:
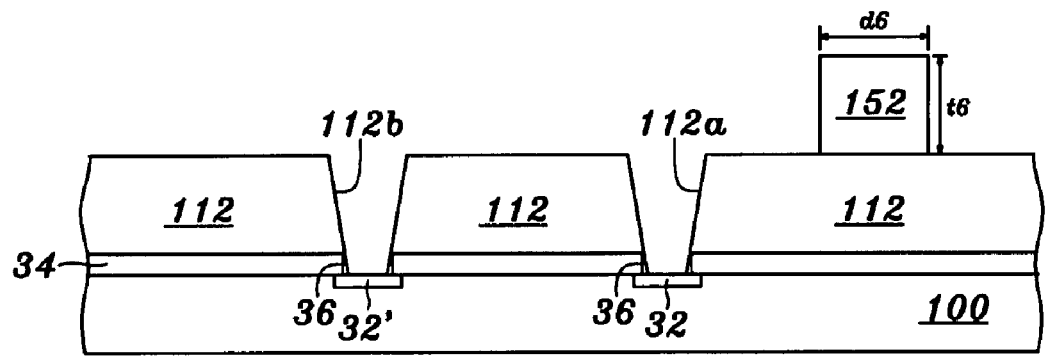

Referring to FIG. 5C, a polymer layer 150 is formed on the polymer layer 112 and on the pads 32 and 32' exposed by the openings 112a and 112b, respectively, via a spin-on coating process. Referring to FIG. 5D, the polymer layer 150 is patterned with exposure and development processes to form at least one polymer bump 152 on the polymer layer 112. From a top perspective view, the position of the polymer bump 152 is different from that of the pad 32 exposed by the opening 112a. Alternatively, the polymer bump 152 may be formed by a lamination process or a screen-printing process.

The material of the polymer bump 152 may be polyimide (PI), benzocyclobutane (BCB), polyurethane, epoxy resin, a parylene-based polymer, a solder-mask material, an elastomer, silicone or a porous dielectric material. The polymer bump 152 has a thickness t6 of between 5 and 50 micrometers, and preferably of between 5 and 25 micrometers. The polymer bump 152 may have a transverse dimension d6, from a top view, of between 5 and 60 micrometers, and preferably of between 5 and 40 micrometers. The shape of the polymer bump 152 from a top view may be a circle, and the diameter of the circle-shaped polymer bump 152 may be between 5 and 60 micrometers, and preferably between 5 and 40 micrometers. Alternatively, the shape of the polymer bump 152 from a top view may be a square, and the width of the square-shaped polymer bump 152 may be between 5 and 60 micrometers, and preferably between 5 and 40 micrometers. Alternatively, the shape of the polymer bump 152 from a top view may be a polygon, such as hexagon or octagon, and the polygon-shaped polymer bump 152 may have a width of between 5 and 60 micrometers, and preferably of between 5 and 40 micrometers. Alternatively, the shape of the polymer bump 152 from a top view may be a rectangle, and the rectangle-shaped polymer bump 152 may have a shorter width of between 5 and 60 micrometers, and preferably of between 5 and 40 micrometers. Further, there may be some of the active devices, such as p-channel MOS devices, n-channel MOS devices, CMOS (Complementary Metal Oxide Semiconductor) devices, BJT (Bipolar Junction Transistor) devices or BiCMOS (Bipolar CMOS) devices, under the polymer bump 152. Alternatively, there may be no active devices under the polymer bump 152.

For example, the polymer layer 150 can be formed by spin-on coating a negative-type photosensitive polyimide layer, containing ester-typer precursor, having a thickness of 10 and 100 µm on the polymer layer 112 and on the pads 32 and 32' exposed by the openings 112a and 112b, respectively, then baking the spin-on coated polyimide layer, then exposing the baked polyimide layer using a 1X stepper or 1X contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form at least one polyimide bump on the polymer layer 112, then curing or heating the polyimide bump at a peak temperature of between 290 and 400° C. for a time of between 20 and 150 minutes in a nitrogen ambient or in an oxygen-free ambient, the cured polyimide bump 152 having a thickness t6 of between 5 and 50 µm, and then removing the residual polymeric material or other contaminants from the upper surface of the pads 32 and 32 exposed by the openings 112a and 112b, respectively, with an $O_2$ plasma or a plasma containing fluorine of below 200 PPM and oxygen. Thereby, the polymer bump 152 can be formed on the polymer layer 112. Alternatively, the polyimide bump can be cured or heated at a temperature between 150 and 290° C., and preferably of between 260 and 280° C., for a time of between 20 and 150 minutes in a nitrogen ambient or in an oxygen-free ambient.

Figure 5E:
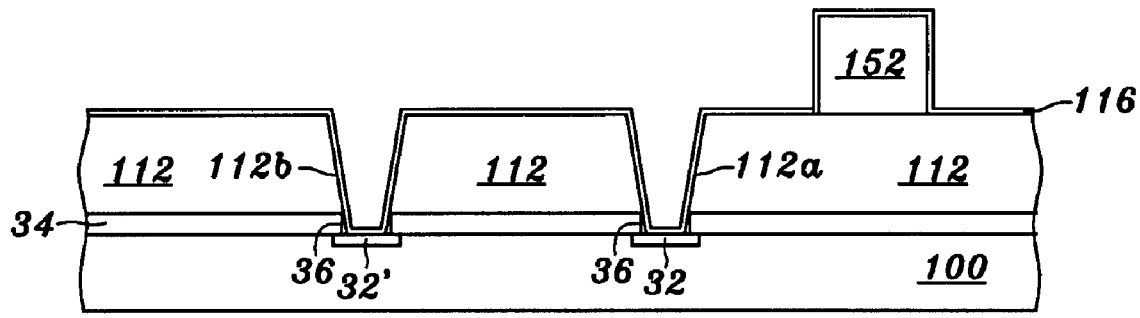

Referring to FIG. 5E, an adhesion/barrier layer 116 having a thickness of between 0.02 and 0.8 µm, and preferably of between 0.05 and 0.2 µm, can be sputtered on an entire top surface and entire sidewall(s) of the polymer bump 152, on the polymer layer 112 and on the pads 32 and 32', such as aluminum pads or copper pads, exposed by the openings 112a and 112b, respectively. The material of the adhesion/barrier layer 116 may be titanium, a titanium-tungsten alloy, titanium nitride, chromium, tantalum, tantalum nitride or a composite of the abovementioned materials. Alternatively, the adhesion/barrier layer 116 can be formed by an evaporation process, a chemical vapor deposition (CVD) process, a PVD (Physical Vapor Deposition) process or an electroless plating process.

For example, the adhesion/barrier layer 116 may be formed by sputtering a titanium layer with a thickness of between 0.02 and 0.8 µm, and preferably of between 0.05 and 0.2 µm, on the entire top surface and entire sidewall(s) of the polymer bump 152, on the polymer layer 112 and on the pads 32 and 32', principally made of aluminum, exposed by the openings 112a and 112b, respectively. Alternatively, the adhesion/barrier layer 116 may be formed by sputtering a titanium-tungsten-alloy layer with a thickness of between 0.02 and 0.8 µm, and preferably of between 0.05 and 0.2 µm, on the entire top surface and entire sidewall(s) of the polymer bump 152, on the polymer layer 112 and on the pads 32 and 32', principally made of aluminum, exposed by the openings 112a and 112b, respectively. Alternatively, the adhesion/barrier layer 116 may be formed by sputtering a titanium-nitride layer with a thickness of between 0.02 and 0.8 µm, and preferably of between 0.05 and 0.2 µm, on the entire top surface and entire sidewall(s) of the polymer bump 152, on the polymer layer 112 and on the pads 32 and 32', principally made of aluminum, exposed by the openings 112a and 112b, respectively. Alternatively, the adhesion/barrier layer 116 may be formed by sputtering a chromium layer with a thickness of between 0.02 and 0.8 µm, and preferably of between 0.05 and 0.2 µm, on the entire top surface and entire sidewall(s) of the polymer bump 152, on the polymer layer 112 and on the pads 32 and 32', principally made of aluminum, exposed by the openings 112a and 112b, respectively. Alternatively, the adhesion/barrier layer 116 may be formed by sputtering a tantalum-nitride layer with a thickness of between 0.02 and 0.8 µm, and preferably of between 0.05 and 0.2 µm, on the entire top surface and entire sidewall(s) of the polymer bump 152, on the polymer layer 112 and on the pads 32 and 32', principally made of aluminum, exposed by the openings 112a and 112b, respectively. Alternatively, the adhesion/barrier layer 116 may be formed by sputtering a tantalum layer with a thickness of between 0.02 and 0.8 μm, and preferably of between 0.05 and 0.2 μm, on the entire top surface and entire sidewall(s) of the polymer bump 152, on the polymer layer 112 and on the pads 32 and 32', principally made of aluminum, exposed by the openings 112a and 112b, respectively.

For example, the adhesion/barrier layer 116 may be formed by sputtering a titanium layer with a thickness of between 0.02 and 0.8 μm, and preferably of between 0.05 and 0.2 μm, on the entire top surface and entire sidewall(s) of the polymer bump 152, on the polymer layer 112 and on the pads 32 and 32', principally made of copper, exposed by the openings 112a and 112b, respectively. Alternatively, the adhesion/barrier layer 116 may be formed by sputtering a titanium-tungsten-alloy layer with a thickness of between 0.02 and 0.8 μm, and preferably of between 0.05 and 0.2 μm, on the entire top surface and entire sidewall(s) of the polymer bump 152, on the polymer layer 112 and on the pads 32 and 32', principally made of copper, exposed by the openings 112a and 112b, respectively. Alternatively, the adhesion/barrier layer 116 may be formed by sputtering a titanium-nitride layer with a thickness of between 0.02 and 0.8 μm, and preferably of between 0.05 and 0.2 μm, on the entire top surface and entire sidewall(s) of the polymer bump 152, on the polymer layer 112 and on the pads 32 and 32', principally made of copper, exposed by the openings 112a and 112b, respectively. Alternatively, the adhesion/barrier layer 116 may be formed by sputtering a chromium layer with a thickness of between 0.02 and 0.8 μm, and preferably of between 0.05 and 0.2 μm, on the entire top surface and entire sidewall(s) of the polymer bump 152, on the polymer layer 112 and on the pads 32 and 32', principally made of copper, exposed by the openings 112a and 112b, respectively. Alternatively, the adhesion/barrier layer 116 may be formed by sputtering a tantalum-nitride layer with a thickness of between 0.02 and 0.8 μm, and preferably of between 0.05 and 0.2 μm, on the entire top surface and entire sidewall(s) of the polymer bump 152, on the polymer layer 112 and on the pads 32 and 32', principally made of copper, exposed by the openings 112a and 112b, respectively. Alternatively, the adhesion/barrier layer 116 may be formed by sputtering a tantalum layer with a thickness of between 0.02 and 0.8 μm, and preferably of between 0.05 and 0.2 μm, on the entire top surface and entire sidewall(s) of the polymer bump 152, on the polymer layer 112 and on the pads 32 and 32', principally made of copper, exposed by the openings 112a and 112b, respectively.

Figure 5F:
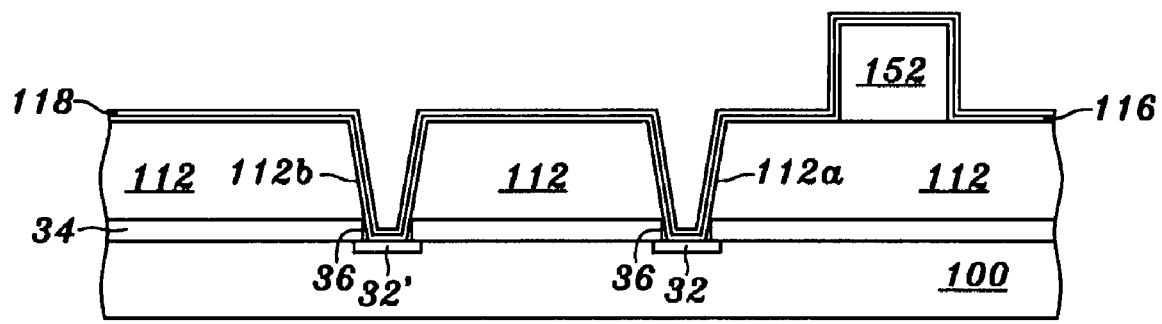

Referring to FIG. 5F, a seed layer 118 having a thickness of between 0.005 and 2 μm, and preferably of between 0.1 and 0.7 μm, can be sputtered on the adhesion/barrier layer 116. The specification of the seed layer 118 shown in FIG. 5F can be referred to as the seed layer 118 illustrated in FIG. 2D. The process of forming the seed layer 118 shown in FIG. 5F can be referred to as the process of forming the seed layer 118 illustrated in FIG. 2D.

Figure 5G:
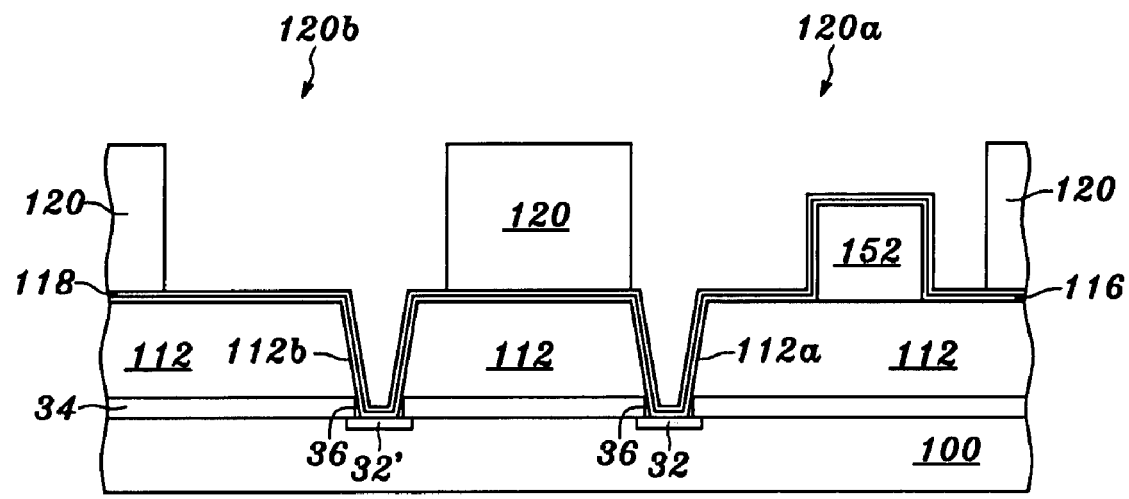

Referring to FIG. 5G, a photoresist layer 120, such as positive-type photoresist layer, having a thickness of between 6 and 100 μm, and preferably of between 10 and 50 μm, is spin-on coated on the seed layer 118. Next, the photoresist layer 120 is patterned with exposure and development processes to form an opening 120a in the photoresist layer 120 exposing the seed layer 118 at the entire top surface and entire sidewall(s) of the polymer bump 152, over the polymer layer 112 and over the pad 32 exposed by the opening 112a, and to form an opening 120b in the photoresist layer 120 exposing the seed layer 118 over the polymer layer 112 and over the pad 32' exposed by the opening 112b. A 1X stepper or 1X contact aligner can be used to expose the photoresist layer 120 during the process of exposure.

For example, the photoresist layer 120 can be formed by spin-on coating a positive-type photosensitive polymer layer having a thickness of between 7 and 90 μm, and preferably of between 8 and 45 μm, on the seed layer 118, then exposing the photosensitive polymer layer using a 1X stepper or 1X contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants from the seed layer 118 with an $O_2$ plasma or a plasma containing fluorine of below 200 PPM and oxygen, such that the photoresist layer 120 can be patterned with an opening 120a in the photoresist layer 120 exposing the seed layer 118 at the entire top surface and entire sidewall(s) of the polymer bump 152, over the polymer layer 112 and over the pad 32 exposed by the opening 112a, and with an opening 120b in the photoresist layer 120 exposing the seed layer 118 over the polymer layer 112 and over the pad 32' exposed by the opening 112b.

Figure 5H:
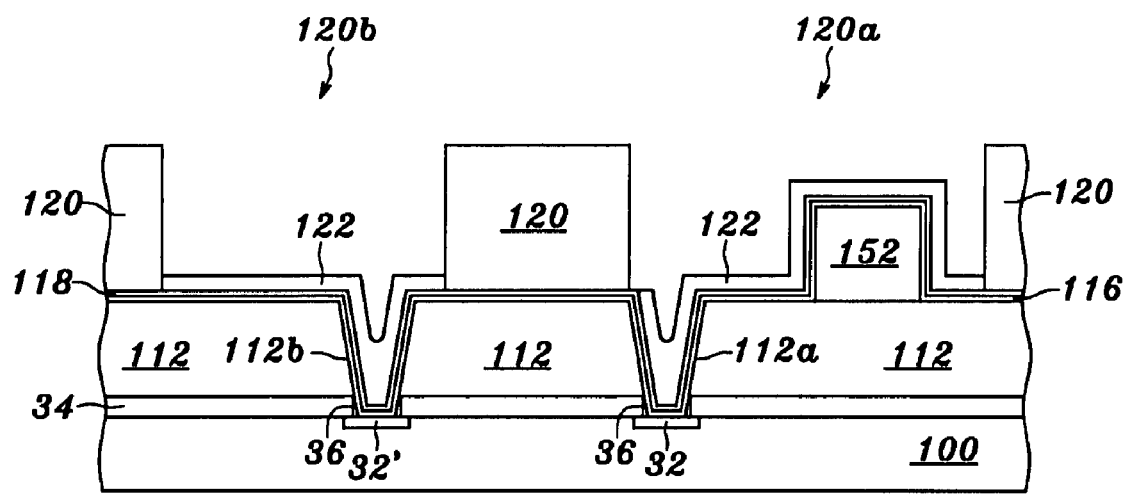

Referring to FIG. 5H, a metal layer 122 having a thickness of between 1 and 20 μm, and preferably of between 1.5 and 15 μm, can be electroplated and/or electroless plated over the seed layer 118 exposed by the openings 120a and 120b. The metal layer 122 may be a single layer of gold, copper, silver, palladium, platinum, rhodium, ruthenium, rhenium or nickel, or a composite layer made of the abovementioned metals. The specification of the metal layer 122 shown in FIG. 5H can be referred to as the metal layer 122 illustrated in FIG. 2F. The process of forming the metal layer 122 shown in FIG. 5H can be referred to as the process of forming the metal layer 122 illustrated in FIG. 2F.

Figure 5I:
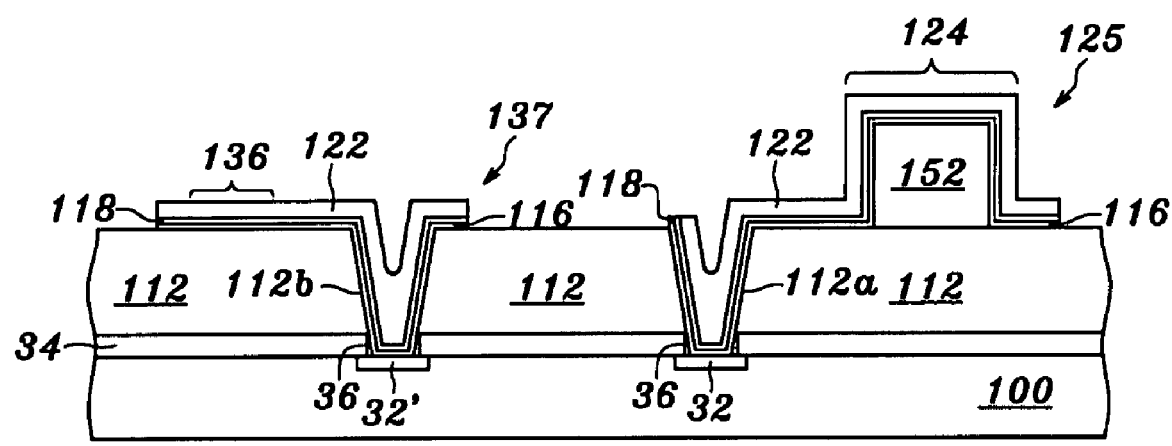

Referring to FIG. 5I, after the metal layer 122 is formed, most of the photoresist layer 120 can be removed using an organic solution with amide. However, some residuals from the photoresist layer 120 could remain on the metal layer 122 and on the seed layer 118. Thereafter, the residuals can be removed from the metal layer 122 and from the seed layer 118 with a plasma, such as $O_2$ plasma or plasma containing fluorine of below 200 PPM and oxygen.

Next, the seed layer 118 and the adhesion/barrier layer 116 not under the metal layer 122 are subsequently removed with a dry etching method or a wet etching method. The process of removing the seed layer 118 and the adhesion/barrier layer 116 not under the metal layer 122, as shown in FIG. 5I, can be referred to as the process of removing the seed layer 118 and the adhesion/barrier layer 116 not under the metal layer 122, as illustrated in FIG. 2G.

Thereby, at least two metal traces 125 and 137 are formed with the adhesion/barrier layer 116, the seed layer 118 and the metal layer 122, including a bonding pad 124 on the top surface of the polymer bump 152, and a bonding pad 136 on the polymer layer 112, connected to the pad 32' through the opening 112b. The bonding pad 124 is used to be connected to a semiconductor chip via a flip chip (FC) mothed, and from a top perspective view, the position of the bonding pad 124 is different from that of the pad 32, to which the metal trace 125 is connected. The bonding pad 136 is used to be connected to an external circuit via a wirebonding process, a solder bonding process or a tape-automated-bonding (TAB) process, for example. From a top perspective view, the position of the bonding pad 136 may be different from that of the pad 32'. Alternatively, from a top perspective view, the position of the bonding pad 136 may be the same as that of the pad 32'. The external circuit may be another semiconductor chip, a flexible substrate comprising a polymer layer (such as polyimide) having a thickness of between 30 and 200 µm and not comprising any polymer layer with glass fiber, a glass substrate, a ceramic substrate comprising a ceramic material as insulating layers between circuit layers, a silicon substrate, an organic substrate, a printed circuit board (PCB) or a ball grid array (BGA) substrate.

Figure 5J:
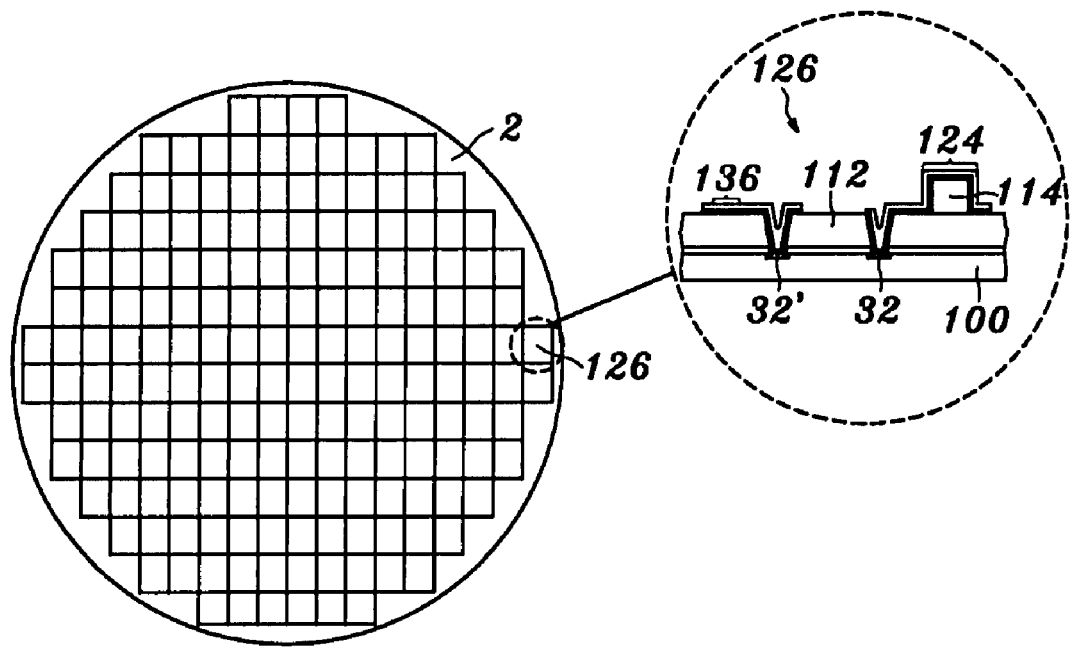

Referring to FIG. 5J, after the seed layer 118 and the adhesion/barrier layer 116 not under the metal layer 122 are removed, a semiconductor wafer formed with the polymer layer 112, the polymer bump 152 and the metal layers 116, 118 and 122 can be diced into a plurality of individual semiconductor chips 126.

Figure 5K:
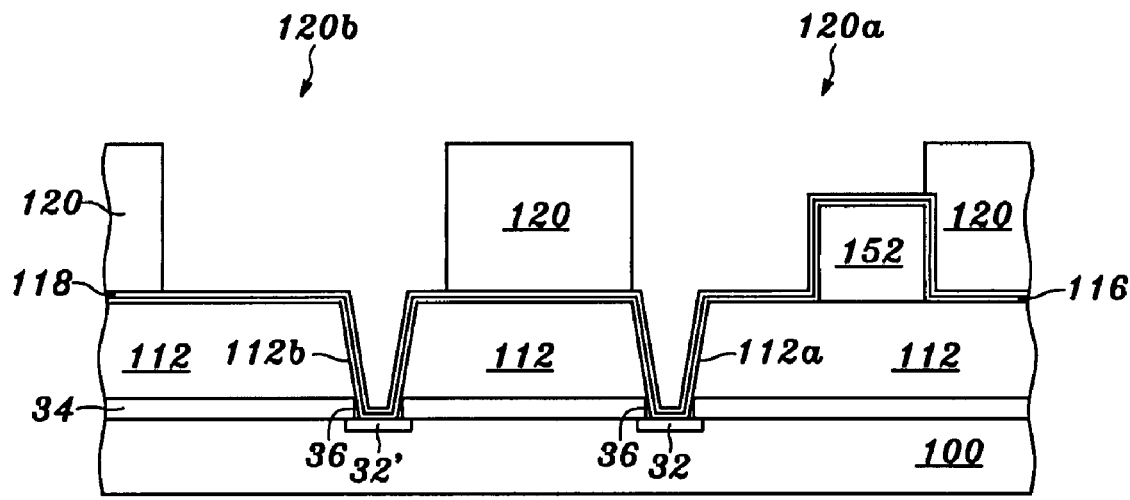
Figure 5L:
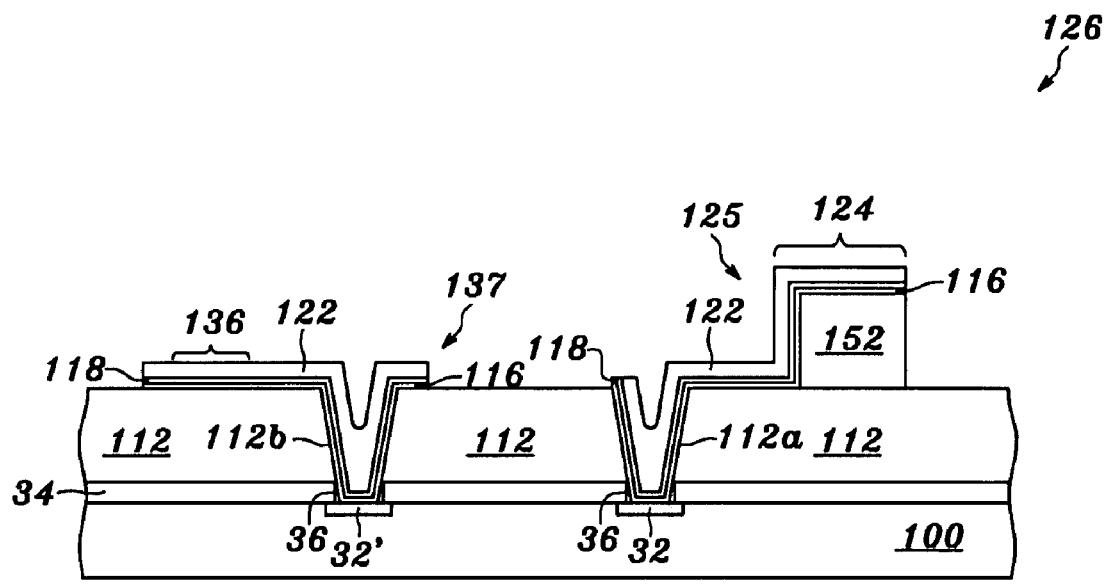

Alternatively, referring to FIG. 5K, after the seed layer 118 is formed, a photoresist layer 120 having a thickness of between 6 and 100 µm, and preferably of between 10 and 50 µm, is spin-on coated on the seed layer 118. Next, the photoresist layer 120 is patterned with exposure and development processes to form an opening 120a in the photoresist layer 120 exposing the seed layer 118 at the entire top surface and a portion of the sidewall(s) of the polymer bump 152, over the polymer layer 112 and over the pad 32 exposed by the opening 112a, and to form an opening 120b in the photoresist layer 120 exposing the seed layer 118 over the polymer layer 112 and over the pad 32' exposed by the opening 112b. Next, the steps as referred to in FIGS. 5H-5I are performed in sequence. Next, referring to FIG. 5L, the semiconductor wafer can be diced into a plurality of individual semiconductor chips 126.

Figure 5M:
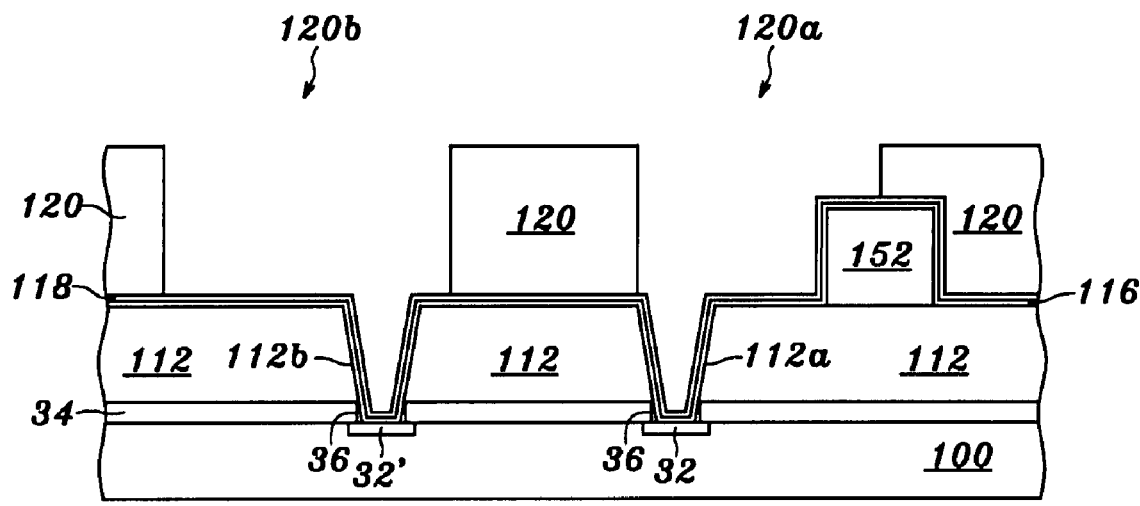
Figure 5N:
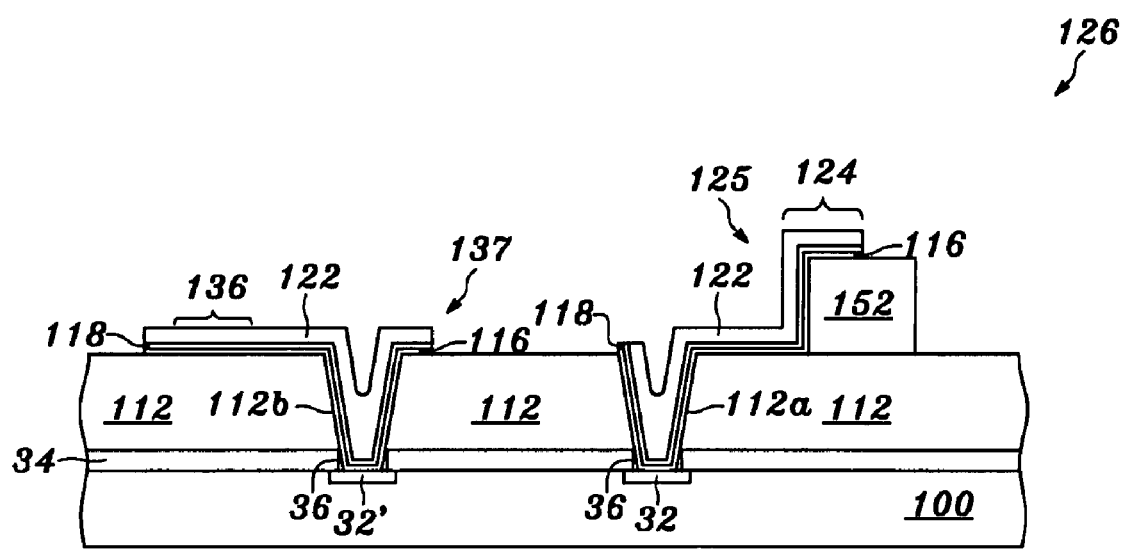

Alternatively, referring to FIG. 5M, after the seed layer 118 is formed, a photoresist layer 120 having a thickness of between 6 and 100 µm, and preferably of between 10 and 50 µm, is spin-on coated on the seed layer 118. Next, the photoresist layer 120 is patterned with exposure and development processes to form an opening 120a in the photoresist layer 120 exposing the seed layer 118 at a portion of the top surface and a portion of the sidewall(s) of the polymer bump 152, over the polymer layer 112 and over the pad 32 exposed by the opening 112a, and to form an opening 120b in the photoresist layer 120 exposing the seed layer 118 over the polymer layer 112 and over the pad 32' exposed by the opening 112b. Next, the steps as referred to in FIGS. 5H-5I are performed in sequence. Next, referring to FIG. 5N, the semiconductor wafer can be diced into a plurality of individual semiconductor chips 126.

Aspect 5 of Embodiment 1

Figure 6A:
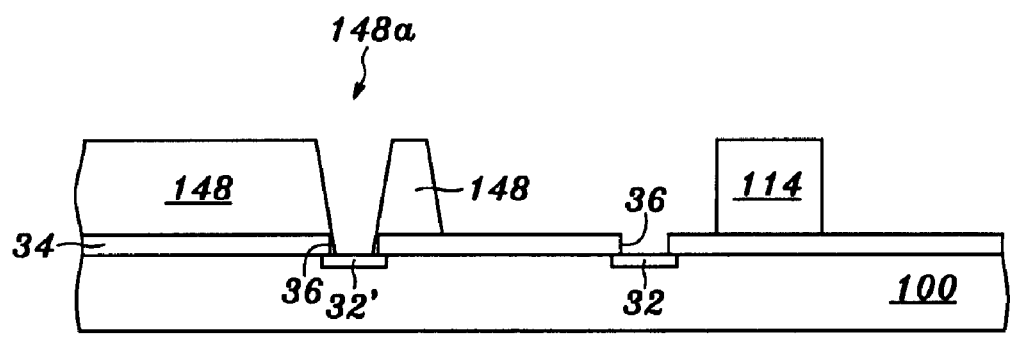
FIGS. 6A through 6J are sectional views showing a process according to another one embodiment of the present invention.

Referring to FIG. 6A, after the step shown in FIG. 5A is completed, the polymer layer 112 is patterned with exposure and development processes to form at least one polymer bump 114 on the passivation layer 34, and to form at lest one polymer island 148 on the passivation layer 34, an opening 148a in the polymer island 148 exposing the pad 32', and the pad 32 being uncoved by the polymer bump 114 and the polymer island 148. From a top perspective view, the position of the polymer bump 114 is different from that of the pad 32.

The pad 32' may include a center portion exposed by the opening 148a and a peripheral portion covered with the polymer island 148, as shown in FIG. 6A. Alternatively, the opening 148a may expose the entire upper surface of the pad 32' exposed by the opening 36 in the passivation layer 34 and further may expose the upper surface of the passivation layer 34 near the pad 32'.

The material of the polymer bump 114 and the polymer island 148 may be polyimide (PI), benzocyclobutane (BCB), polyurethane, epoxy resin, a parylene-based polymer, a solder-mask material, an elastomer, or a porous dielectric material. The polymer bump 114 and the polymer island 148 have a thickness of between 5 and 50 µm. The specification of the polymer bump 114 shown in FIG. 6A can be referred to as the polymer bump 114 illustrated in FIG. 2B. Further, there may be some of the active devices, such as p-channel MOS devices, n-channel MOS devices, CMOS (Complementary Metal Oxide Semiconductor) devices, BJT (Bipolar Junction Transistor) devices or BiCMOS (Bipolar CMOS) devices, under the polymer bump 114. Alternatively, there may be no active devices under the polymer bump 114.

For example, the polymer layer 112 can be formed by spin-on coating a negative-type photosensitive polyimide layer, containing ester-typer precursor, having a thickness of between 10 and 100 µm on the passivation layer 34, then baking the spin-on coated polyimide layer, then exposing the baked polyimide layer using a 1X stepper or 1X contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form at least one polyimide bump on the passivation layer 34 and at lest one polyimide island on the passivation layer 34, an opening in the polyimide island exposing the pad 32' exposed by the opening 36 in the passivation layer 34, and the pad 32 being uncoved by the polyimide bump and the polyimide island, then curing or heating the polyimide bump and the polyimide island at a peak temperature of between 290 and 400° C. for a time of between 20 and 150 minutes in a nitrogen ambient or in an oxygen-free ambient, the cured the polyimide bump 114 and the polyimide island 148 having a thickness of between 5 and 50 µm, and then removing the residual polymeric material or other contaminants from the upper surface of the pad 32 exposed by the opening 36 and from the upper surface of the pad 32' exposed by the opening in the polyimide island with an $O_2$ plasma or a plasma containing fluorine of below 200 PPM and oxygen. Thereby, the polymer bump 114 and the polyimide island 148 can be formed on the passivation layer 34. Alternatively, the polyimide bump and the polyimide island can be cured or heated at a temperature between 150 and 290° C., and preferably of between 260 and 280° C., for a time of between 20 and 150 minutes in a nitrogen ambient or in an oxygen-free ambient.

Figure 6B:
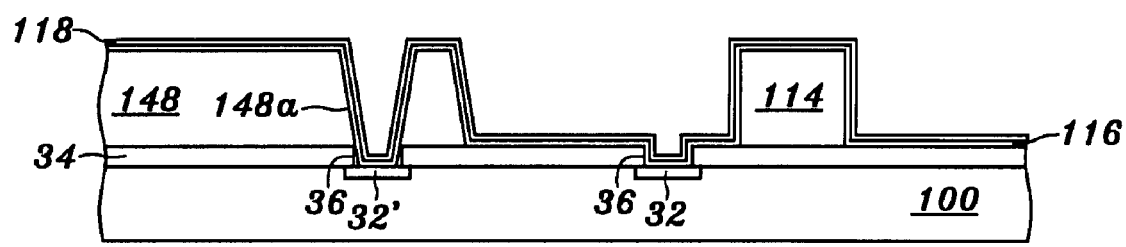

Referring to FIG. 6B, an adhesion/barrier layer 116 having a thickness of between 0.02 and 0.8 µm, and preferably of between 0.05 and 0.2 µm, can be sputtered on an entire top surface and entire sidewall(s) of the polymer bump 114, on the passivation layer 34, on the pad 32 exposed by the opening 36, on the polymer island 148 and on the pad 32' exposed by the opening 148a. The material of the adhesion/barrier layer 116 may be titanium, a titanium-tungsten alloy, titanium nitride, chromium, tantalum, tantalum nitride or a composite of the abovementioned materials. Alternatively, the adhesion/barrier layer 116 can be formed by an evaporation process, a chemical vapor deposition (CVD) process, a PVD (Physical Vapor Deposition) process or an electroless plating process.

For example, the adhesion/barrier layer 116 may be formed by sputtering a titanium layer with a thickness of between 0.02 and 0.8 µm, and preferably of between 0.05 and 0.2 µm, on the entire top surface and entire sidewall(s) of the polymer bump 114, on the passivation layer 34, on the polymer island 148 and on the pads 32 and 32' principally made of aluminum. Alternatively, the adhesion/barrier layer 116 may be formed by sputtering a titanium-tungsten-alloy layer with a thickness of between 0.02 and 0.8 µm, and preferably of between 0.05 and 0.2 µm, on the entire top surface and entire sidewall(s) of the polymer bump 114, on the passivation layer 34, on the polymer island 148 and on the pads 32 and 32' principally made of aluminum. Alternatively, the adhesion/barrier layer 116 may be formed by sputtering a titanium-nitride layer with a thickness of between 0.02 and 0.8 µm, and preferably of between 0.05 and 0.2 µm, on the entire top surface and entire sidewall(s) of the polymer bump 114, on the passivation layer 34, on the polymer island 148 and on the pads 32 and 32' principally made of aluminum. Alternatively, the adhesion/barrier layer 116 may be formed by sputtering a chromium layer with a thickness of between 0.02 and 0.8 µm, and preferably of between 0.05 and 0.2 µm, on the entire top surface and entire sidewall(s) of the polymer bump 114, on the passivation layer 34, on the polymer island 148 and on the pads 32 and 32' principally made of aluminum. Alternatively, the adhesion/barrier layer 116 may be formed by sputtering a tantalum-nitride layer with a thickness of between 0.02 and 0.8 µm, and preferably of between 0.05 and 0.2 µm, on the entire top surface and entire sidewall(s) of the polymer bump 114, on the passivation layer 34, on the polymer island 148 and on the pads 32 and 32' principally made of aluminum. Alternatively, the adhesion/barrier layer 116 may be formed by sputtering a tantalum layer with a thickness of between 0.02 and 0.8 µm, and preferably of between 0.05 and 0.2 µm, on the entire top surface and entire sidewall(s) of the polymer bump 114, on the passivation layer 34, on the polymer island 148 and on the pads 32 and 32' principally made of aluminum.

For example, the adhesion/barrier layer 116 may be formed by sputtering a titanium layer with a thickness of between 0.02 and 0.8 µm, and preferably of between 0.05 and 0.2 µm, on the entire top surface and entire sidewall(s) of the polymer bump 114, on the passivation layer 34, on the polymer island 148 and on the pads 32 and 32' principally made of copper. Alternatively, the adhesion/barrier layer 116 may be formed by sputtering a titanium-tungsten-alloy layer with a thickness of between 0.02 and 0.8 µm, and preferably of between 0.05 and 0.2 µm, on the entire top surface and entire sidewall(s) of the polymer bump 114, on the passivation layer 34, on the polymer island 148 and on the pads 32 and 32' principally made of copper. Alternatively, the adhesion/barrier layer 116 may be formed by sputtering a titanium-nitride layer with a thickness of between 0.02 and 0.8 µm, and preferably of between 0.05 and 0.2 µm, on the entire top surface and entire sidewall(s) of the polymer bump 114, on the passivation layer 34, on the polymer island 148 and on the pads 32 and 32' principally made of copper. Alternatively, the adhesion/barrier layer 116 may be formed by sputtering a chromium layer with a thickness of between 0.02 and 0.8 µm, and preferably of between 0.05 and 0.2 µm, on the entire top surface and entire sidewall(s) of the polymer bump 114, on the passivation layer 34, on the polymer island 148 and on the pads 32 and 32' principally made of copper. Alternatively, the adhesion/barrier layer 116 may be formed by sputtering a tantalum-nitride layer with a thickness of between 0.02 and 0.8 µm, and preferably of between 0.05 and 0.2 µm, on the entire top surface and entire sidewall(s) of the polymer bump 114, on the passivation layer 34, on the polymer island 148 and on the pads 32 and 32' principally made of copper. Alternatively, the adhesion/barrier layer 116 may be formed by sputtering a tantalum layer with a thickness of between 0.02 and 0.8 µm, and preferably of between 0.05 and 0.2 µm, on the entire top surface and entire sidewall(s) of the polymer bump 114, on the passivation layer 34, on the polymer island 148 and on the pads 32 and 32' principally made of copper.

Next, a seed layer 118 having a thickness of between 0.005 and 2 µm, and preferably of between 0.1 and 0.7 µm, can be sputtered on the adhesion/barrier layer 116. The specification of the seed layer 118 shown in FIG. 6B can be referred to as the seed layer 118 illustrated in FIG. 2D. The process of forming the seed layer 118 shown in FIG. 6B can be referred to as the process of forming the seed layer 118 illustrated in FIG. 2D.

Figure 6C:
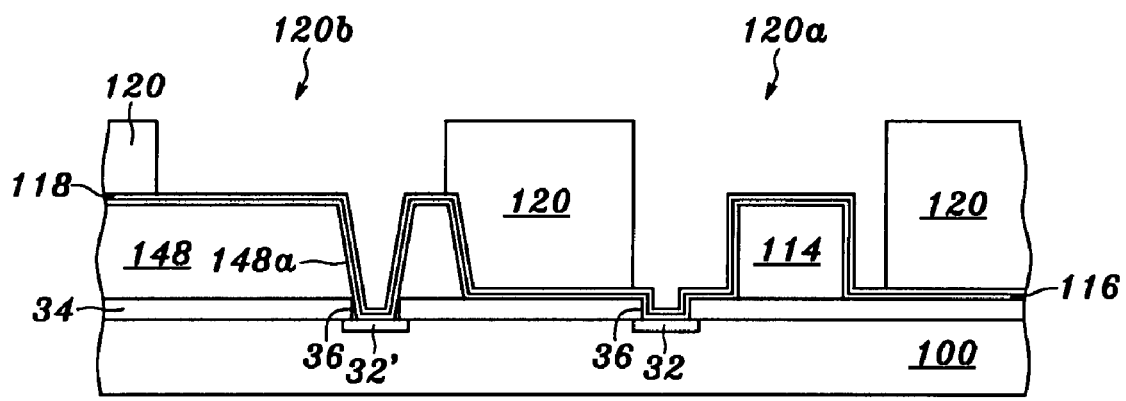

Referring to FIG. 6C, a photoresist layer 120, such as positive-type photoresist layer, having a thickness of between 6 and 100 µm, and preferably of between 10 and 50 µm, is spin-on coated on the seed layer 118. Next, the photoresist layer 120 is patterned with exposure and development processes to form an opening 120a in the photoresist layer 120 exposing the seed layer 118 at the entire top surface and entire sidewall(s) of the polymer bump 114, over the passivation layer 34 and over the pad 32 exposed by the opening 36, and to form an opening 120b in the photoresist layer 120 exposing the seed layer 118 over the polymer island 148 and over the pad 32' exposed by the opening 148a. A 1X stepper or 1X contact aligner can be used to expose the photoresist layer 120 during the process of exposure.

For example, the photoresist layer 120 can be formed by spin-on coating a positive-type photosensitive polymer layer having a thickness of between 7 and 90 µm, and preferably of between 8 and 45 µm, on the seed layer 118, then exposing the photosensitive polymer layer using a 1X stepper or 1X contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants from the seed layer 118 with an $O_2$ plasma or a plasma containing fluorine of below 200 PPM and oxygen, such that the photoresist layer 120 can be patterned with an opening 120a in the photoresist layer 120 exposing the seed layer 118 at the entire top surface and entire sidewall(s) of the polymer bump 114, over the passivation layer 34 and over the pad 32 exposed by the opening 36, and with an opening 120b in the photoresist layer 120 exposing the seed layer 118 over the polymer island 148 and over the pad 32' exposed by the opening 148a.

Figure 6D:
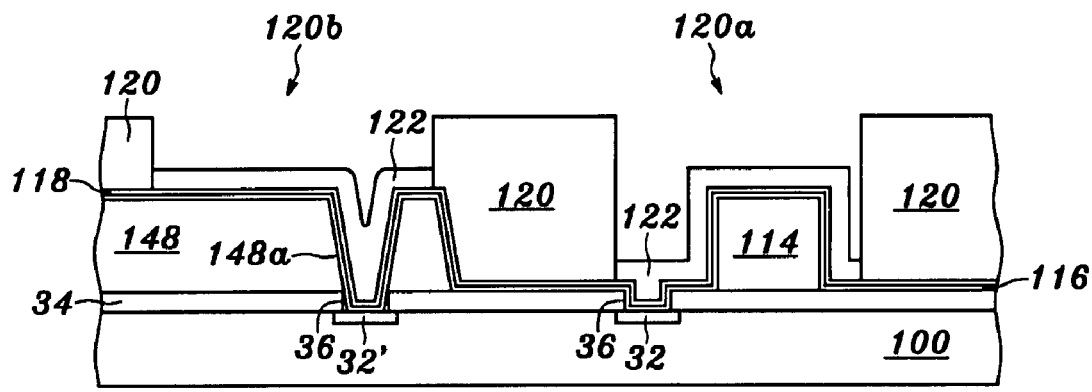

Referring to FIG. 6D, a metal layer 122 having a thickness of between 1 and 20 µm, and preferably of between 1.5 and 15 µm, can be electroplated and/or electroless plated over the seed layer 118 exposed by the openings 120a and 120b. The metal layer 122 may be a single layer of gold, copper, silver, palladium, platinum, rhodium, ruthenium, rhenium or nickel, or a composite layer made of the abovementioned metals. The specification of the metal layer 122 shown in FIG. 6D can be referred to as the metal layer 122 illustrated in FIG. 2F. The process of forming the metal layer 122 shown in FIG. 6D can be referred to as the process of forming the metal layer 122 illustrated in FIG. 2F.

Figure 6E:
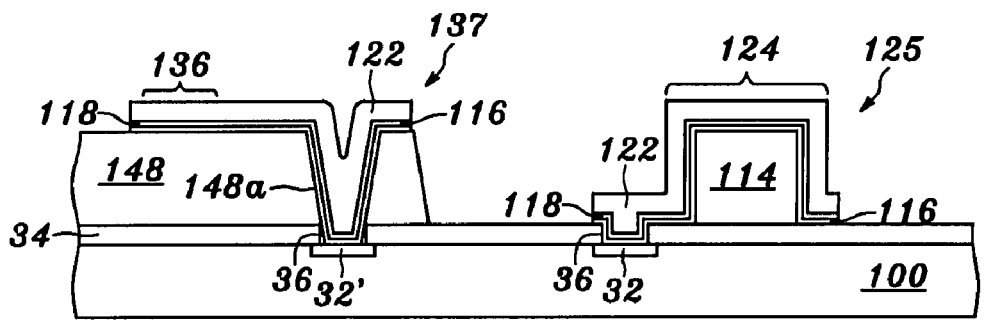

Referring to FIG. 6E, after the metal layer 122 is formed, most of the photoresist layer 120 can be removed using an organic solution with amide. However, some residuals from the photoresist layer 120 could remain on the metal layer 122 and on the seed layer 118. Thereafter, the residuals can be removed from the metal layer 122 and from the seed layer 118 with a plasma, such as $O_2$ plasma or plasma containing fluorine of below 200 PPM and oxygen.

Next, the seed layer 118 and the adhesion/barrier layer 116 not under the metal layer 122 are subsequently removed with a dry etching method or a wet etching method. The process of removing the seed layer 118 and the adhesion/barrier layer 116 not under the metal layer 122, as shown in FIG. 6E, can be referred to as the process of removing the seed layer 118 and the adhesion/barrier layer 116 not under the metal layer 122, as illustrated in FIG. 2G.

Thereby, at least two metal traces 125 and 137 are formed with the adhesion/barrier layer 116, the seed layer 118 and the metal layer 122, including a bonding pad 124 on the top surface of the polymer bump 114, and a bonding pad 136 on the polymer island 148, connected to the pad 32' through the opening 148a. The bonding pad 124 is used to be connected to a semiconductor chip via a flip chip (FC) mothed, and from a top perspective view, the position of the bonding pad 124 is different from that of the pad 32, to which the metal trace 125 is connected. The bonding pad 136 is used to be connected to an external circuit via a wirebonding process, a solder bonding process or a tape-automated-bonding (TAB) process, for example. From a top perspective view, the position of the bonding pad 136 may be different from that of the pad 32'. Alternatively, from a top perspective view, the position of the bonding pad 136 may be the same as that of the pad 32'. The external circuit may be another semiconductor chip, a flexible substrate comprising a polymer layer (such as polyimide) having a thickness of between 30 and 200 μm and not comprising any polymer layer with glass fiber, a glass substrate, a ceramic substrate comprising a ceramic material as insulating layers between circuit layers, a silicon substrate, an organic substrate, a printed circuit board (PCB) or a ball grid array (BGA) substrate.

Figure 6F:
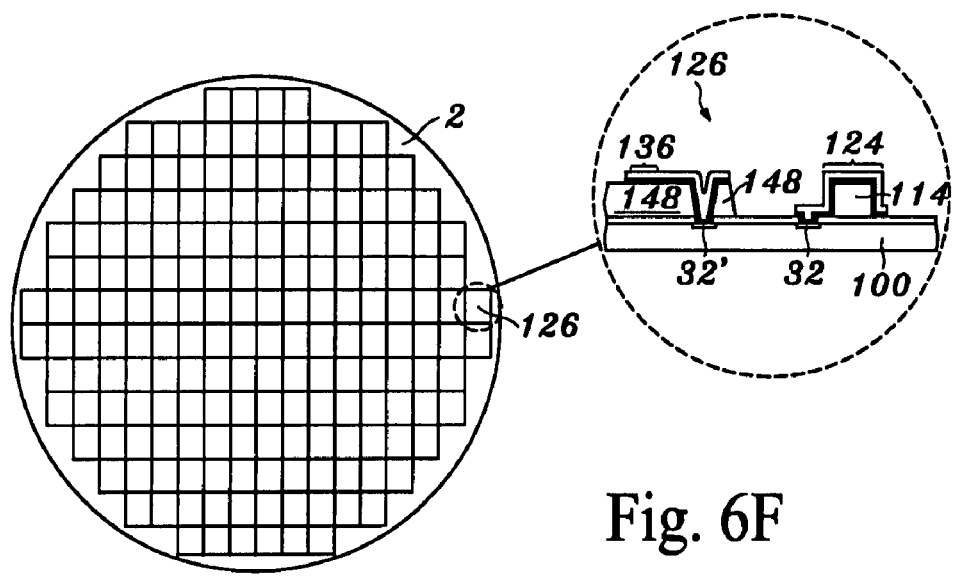

Referring to FIG. 6F, after the seed layer 118 and the adhesion/barrier layer 116 not under the metal layer 122 are removed, a semiconductor wafer formed with the polymer island 148, the polymer bump 114 and the metal layers 116, 118 and 122 can be diced into a plurality of individual semiconductor chips 126.

Figure 6G:
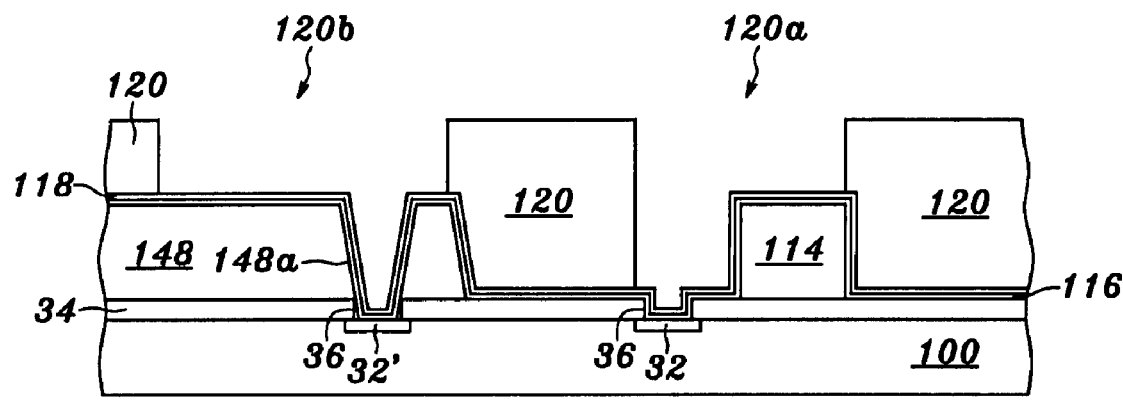
Figure 6H:
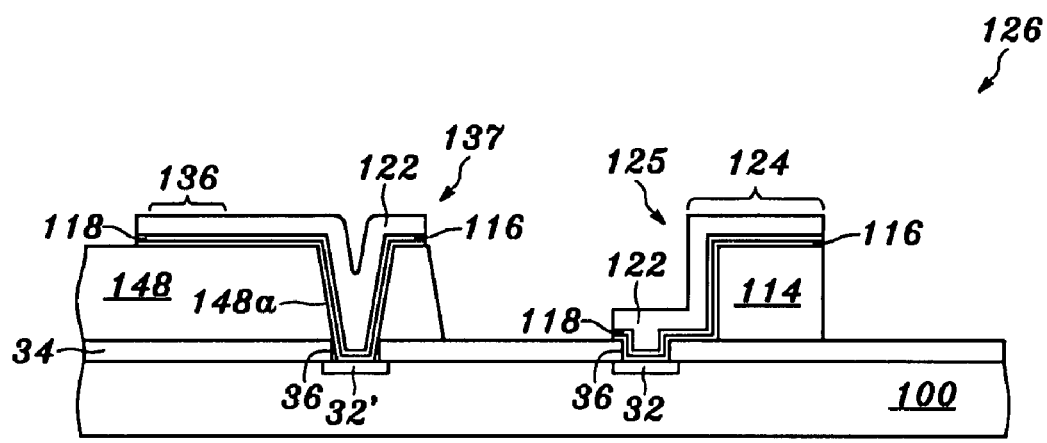

Alternatively, referring to FIG. 6G, after the seed layer 118 is formed, a photoresist layer 120 having a thickness of between 6 and 100 μm, and preferably of between 10 and 50 μm, is spin-on coated on the seed layer 118. Next, the photoresist layer 120 is patterned with exposure and development processes to form an opening 120a in the photoresist layer 120 exposing the seed layer 118 at the entire top surface and a portion of the sidewall(s) of the polymer bump 114, over the passivation layer 34 and over the pad 32 exposed by the opening 36, and to form an opening 120b in the photoresist layer 120 exposing the seed layer 118 over the polymer island 148 and over the pad 32' exposed by the opening 148a. Next, the steps as referred to in FIGS. 6D-6E are performed in sequence. Next, referring to FIG. 6H, the semiconductor wafer can be diced into a plurality of individual semiconductor chips 126.

Figure 6I:
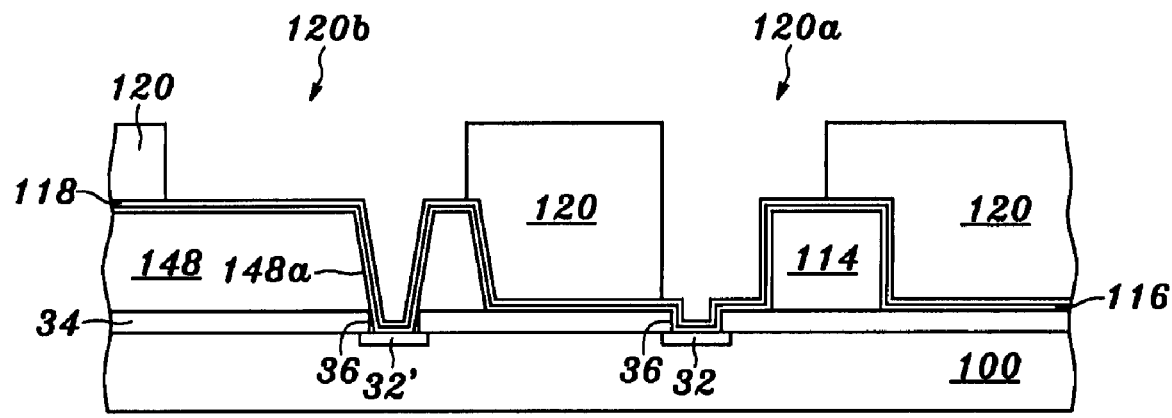
Figure 6J:
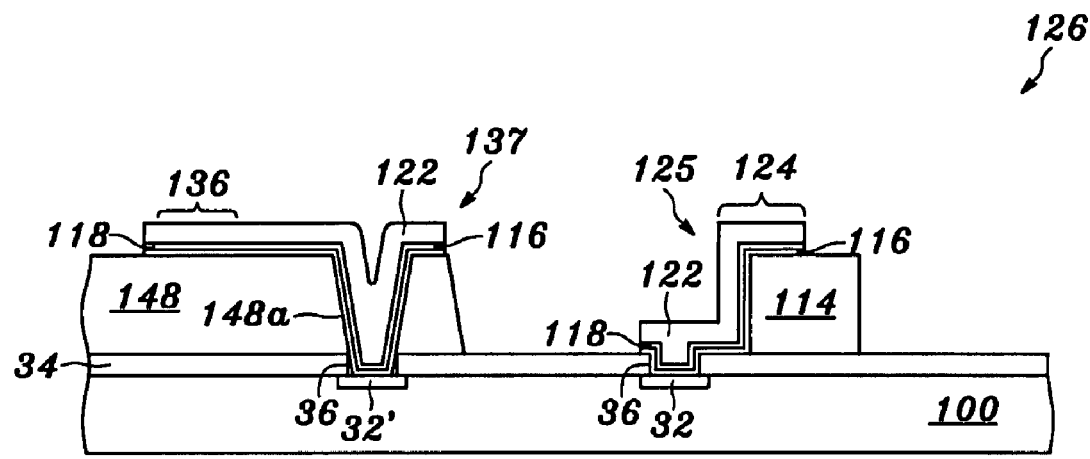

Alternatively, referring to FIG. 6I, after the seed layer 118 is formed, a photoresist layer 120 having a thickness of between 6 and 100 μm, and preferably of between 10 and 50 μm, is spin-on coated on the seed layer 118. Next, the photoresist layer 120 is patterned with exposure and development processes to form an opening 120a in the photoresist layer 120 exposing the seed layer 118 at a portion of the top surface and a portion of the sidewall(s) of the polymer bump 114, over the passivation layer 34 and over the pad 32 exposed by the opening 36, and to form an opening 120b in the photoresist layer 120 exposing the seed layer 118 over the polymer island 148 and over the pad 32' exposed by the opening 148a. Next, the steps as referred to in FIGS. 6D-6E are performed in sequence. Next, referring to FIG. 6J, the semiconductor wafer can be diced into a plurality of individual semiconductor chips 126.

Aspect 1 of Embodiment 2

Figure 7A:
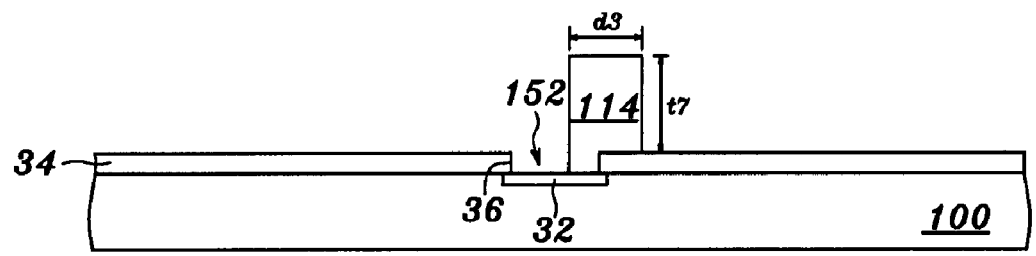
FIGS. 7A through 7L are sectional views showing a process according to another one embodiment of the present invention.
Figure 7B:
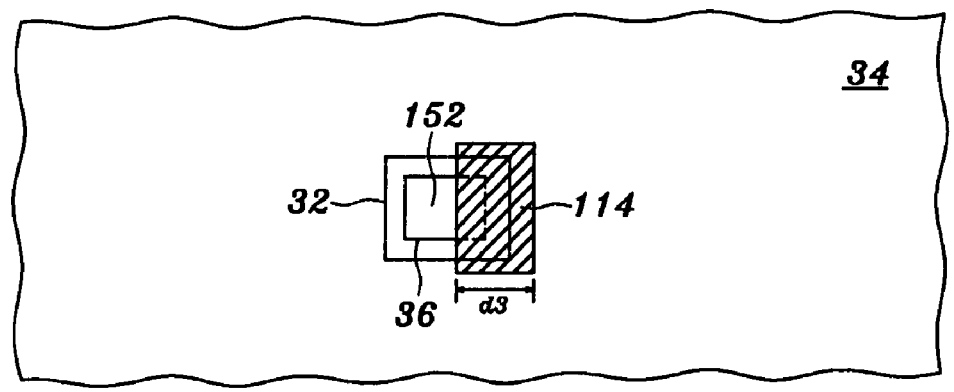

Referring to FIGS. 7A and 7B, after the step shown in FIG. 2A is completed, the polymer layer 112 is patterned with exposure and development processes to form a polymer bump 114 on a portion of the pad 32 exposed by the opening 36 and on the passivation layer 34 close to the pad 32. The top surface of the pad 32 exposed by the opening 36 may have a first region 152 uncovered by the polymer bump 114 and a second region covered by the polymer bump 114. The ratio of the area of the first region 152 to that of the pad 32 is between 0.1 and 0.9, or between 0.05 and 0.5. Alternatively, the polymer bump 114 may be formed by a lamination process or a screen-printing process.

The material of the polymer bump 114 may be polyimide (PI), benzocyclobutane (BCB), polyurethane, epoxy resin, a parylene-based polymer, a solder-mask material, an elastomer, silicone or a porous dielectric material. The polymer bump 114 has a thickness t7 of between 5 and 50 micrometers, and preferably of between 5 and 25 micrometers. The polymer bump 114 may have a transverse dimension d3, from a top view, of between 5 and 60 micrometers, and preferably of between 5 and 40 micrometers. The shape of the polymer bump 114 from a top view may be a circle, and the diameter of the circle-shaped polymer bump 114 may be between 5 and 60 micrometers, and preferably between 5 and 40 micrometers. Alternatively, the shape of the polymer bump 114 from a top view may be a square, and the width of the square-shaped polymer bump 114 may be between 5 and 60 micrometers, and preferably between 5 and 40 micrometers. Alternatively, the shape of the polymer bump 114 from a top view may be a polygon, such as hexagon or octagon, and the polygon-shaped polymer bump 114 may have a width of between 5 and 60 micrometers, and preferably of between 5 and 40 micrometers. Alternatively, the shape of the polymer bump 114 from a top view may be a rectangle, and the rectangle-shaped polymer bump 114 may have a shorter width of between 5 and 60 micrometers, and preferably of between 5 and 40 micrometers. Further, there may be some of the active devices, such as p-channel MOS devices, n-channel MOS devices, CMOS (Complementary Metal Oxide Semiconductor) devices, BJT (Bipolar Junction Transistor) devices or BiCMOS (Bipolar CMOS) devices, under the polymer bump 114. Alternatively, there may be no active devices under the polymer bump 114.

For example, the polymer layer 112 can be formed by spin-on coating a negative-type photosensitive polyimide layer, containing ester-typer precursor, having a thickness of 10 and 100 μm on the passivation layer 34 and on the pad 32 exposed by the opening 36, then baking the spin-on coated polyimide layer, then exposing the baked polyimide layer using a 1X stepper or 1X contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form an polyimide bump on the portion of the pad 32 exposed by the opening 36 and on the passivation layer 34 close to the pad 32, then curing or heating the polyimide bump at a peak temperature of between 290 and 400° C. for a time of between 20 and 150 minutes in a nitrogen ambient or in an oxygen-free ambient, the cured polyimide bump 114 having a thickness t7 of between 5 and 50 μm, and then removing the residual polymeric material or other contaminants from the upper surface of the first region 152 with an $O_2$ plasma or a plasma containing fluorine of below 200 PPM and oxygen. Thereby, the polymer bump 114 can be formed on the portion of the pad 32 exposed by the opening 36 and on the passivation layer 34 close to the pad 32. Alternatively, the polyimide bump can be cured or heated at a temperature between 150 and 290° C., and preferably of between 260 and 280° C., for a time of between 20 and 150 minutes in a nitrogen ambient or in an oxygen-free ambient.

Figure 7C:
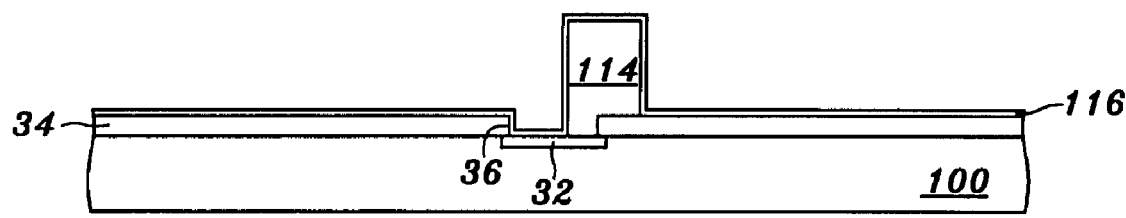

Referring to FIG. 7C, an adhesion/barrier layer 116 having a thickness of between 0.02 and 0.8 μm, and preferably of between 0.05 and 0.2 μm, can be sputtered on an entire top surface and entire sidewall(s) of the polymer bump 114, on the passivation layer 34 and on the first region 152 of the pad 32, such as aluminum pad or copper pad, exposed by the opening 36. The material of the adhesion/barrier layer 116 may be titanium, a titanium-tungsten alloy, titanium nitride, chromium, tantalum, tantalum nitride or a composite of the abovementioned materials. Alternatively, the adhesion/barrier layer 116 can be formed by an evaporation process, a chemical vapor deposition (CVD) process, a PVD (Physical Vapor Deposition) process or an electroless plating process.

For example, the adhesion/barrier layer 116 may be formed by sputtering a titanium layer with a thickness of between 0.02 and 0.8 μm, and preferably of between 0.05 and 0.2 μm, on the entire top surface and entire sidewall(s) of the polymer bump 114, on the passivation layer 34 and on the first region 152 of the pad 32, principally made of aluminum, exposed by the opening 36. Alternatively, the adhesion/barrier layer 116 may be formed by sputtering a titanium-tungsten-alloy layer with a thickness of between 0.02 and 0.8 μm, and preferably of between 0.05 and 0.2 μm, on the entire top surface and entire sidewall(s) of the polymer bump 114, on the passivation layer 34 and on the first region 152 of the pad 32, principally made of aluminum, exposed by the opening 36. Alternatively, the adhesion/barrier layer 116 may be formed by sputtering a titanium-nitride layer with a thickness of between 0.02 and 0.8 μm, and preferably of between 0.05 and 0.2 μm, on the entire top surface and entire sidewall(s) of the polymer bump 114, on the passivation layer 34 and on the first region 152 of the pad 32, principally made of aluminum, exposed by the opening 36. Alternatively, the adhesion/barrier layer 116 may be formed by sputtering a chromium layer with a thickness of between 0.02 and 0.8 μm, and preferably of between 0.05 and 0.2 μm, on the entire top surface and entire sidewall(s) of the polymer bump 114, on the passivation layer 34 and on the first region 152 of the pad 32, principally made of aluminum, exposed by the opening 36. Alternatively, the adhesion/barrier layer 116 may be formed by sputtering a tantalum-nitride layer with a thickness of between 0.02 and 0.8 μm, and preferably of between 0.05 and 0.2 μm, on the entire top surface and entire sidewall(s) of the polymer bump 114, on the passivation layer 34 and on the first region 152 of the pad 32, principally made of aluminum, exposed by the opening 36. Alternatively, the adhesion/barrier layer 116 may be formed by sputtering a tantalum layer with a thickness of between 0.02 and 0.8 μm, and preferably of between 0.05 and 0.2 μm, on the entire top surface and entire sidewall(s) of the polymer bump 114, on the passivation layer 34 and on the first region 152 of the pad 32, principally made of aluminum, exposed by the opening 36.

For example, the adhesion/barrier layer 116 may be formed by sputtering a titanium layer with a thickness of between 0.02 and 0.8 μm, and preferably of between 0.05 and 0.2 μm, on the entire top surface and entire sidewall(s) of the polymer bump 114, on the passivation layer 34 and on the first region 152 of the pad 32, principally made of copper, exposed by the opening 36. Alternatively, the adhesion/barrier layer 116 may be formed by sputtering a titanium-tungsten-alloy layer with a thickness of between 0.02 and 0.8 μm, and preferably of between 0.05 and 0.2 μm, on the entire top surface and entire sidewall(s) of the polymer bump 114, on the passivation layer 34 and on the first region 152 of the pad 32, principally made of copper, exposed by the opening 36. Alternatively, the adhesion/barrier layer 116 may be formed by sputtering a titanium-nitride layer with a thickness of between 0.02 and 0.8 μm, and preferably of between 0.05 and 0.2 μm, on the entire top surface and entire sidewall(s) of the polymer bump 114, on the passivation layer 34 and on the first region 152 of the pad 32, principally made of copper, exposed by the opening 36. Alternatively, the adhesion/barrier layer 116 may be formed by sputtering a chromium layer with a thickness of between 0.02 and 0.8 μm, and preferably of between 0.05 and 0.2 μm, on the entire top surface and entire sidewall(s) of the polymer bump 114, on the passivation layer 34 and on the first region 152 of the pad 32, principally made of copper, exposed by the opening 36. Alternatively, the adhesion/barrier layer 116 may be formed by sputtering a tantalum-nitride layer with a thickness of between 0.02 and 0.8 μm, and preferably of between 0.05 and 0.2 μm, on the entire top surface and entire sidewall(s) of the polymer bump 114, on the passivation layer 34 and on the first region 152 of the pad 32, principally made of copper, exposed by the opening 36. Alternatively, the adhesion/barrier layer 116 may be formed by sputtering a tantalum layer with a thickness of between 0.02 and 0.8 μm, and preferably of between 0.05 and 0.2 μm, on the entire top surface and entire sidewall(s) of the polymer bump 114, on the passivation layer 34 and on the first region 152 of the pad 32, principally made of copper, exposed by the opening 36.

Figure 7D:
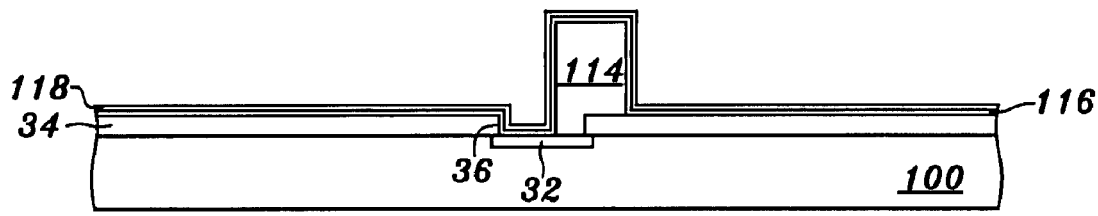

Referring to FIG. 7D, a seed layer 118 having a thickness of between 0.005 and 2 μm, and preferably of between 0.1 and 0.7 μm, can be sputtered on the adhesion/barrier layer 116. Alternatively, the seed layer 118 can be formed by a vapor deposition method, an electroless plating method or a PVD (Physical Vapor Deposition) method. The specification of the seed layer 118 shown in FIG. 7D can be referred to as the seed layer 118 illustrated in FIG. 2D. The process of forming the seed layer 118 shown in FIG. 7D can be referred to as the process of forming the seed layer 118 illustrated in FIG. 2D.

Figure 7E:
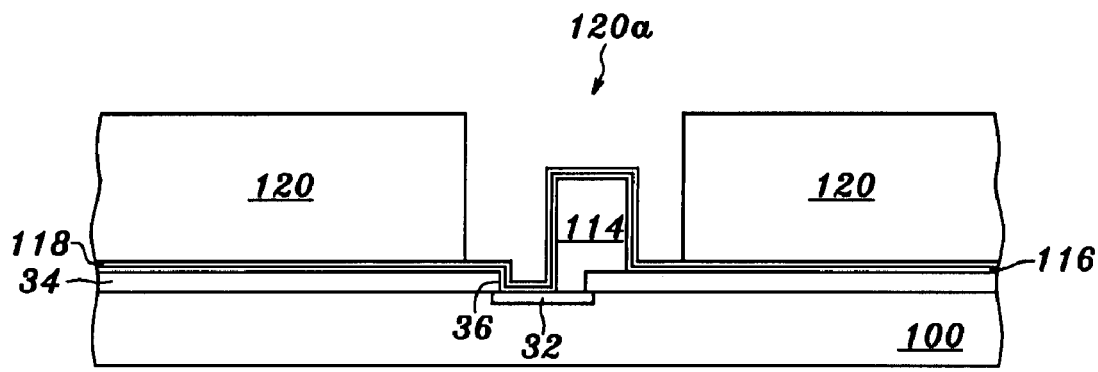

Referring to FIG. 7E, a photoresist layer 120, such as positive-type photoresist layer, having a thickness of between 6 and 100 μm, and preferably of between 10 and 50 μm, is spin-on coated on the seed layer 118. Next, the photoresist layer 120 is patterned with exposure and development processes to form an opening 120a in the photoresist layer 120 exposing the seed layer 118 at the entire top surface and entire sidewall(s) of the polymer bump 114, over the passivation layer 34 and over the first region 152 of the pad 32. A 1X stepper or 1X contact aligner can be used to expose the photoresist layer 120 during the process of exposure.

For example, the photoresist layer 120 can be formed by spin-on coating a positive-type photosensitive polymer layer having a thickness of between 7 and 90 μm, and preferably of between 8 and 45 μm, on the seed layer 118, then exposing the photosensitive polymer layer using a 1X stepper or 1X contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants from the seed layer 118 with an $O_2$ plasma or a plasma containing fluorine of below 200 PPM and oxygen, such that the photoresist layer 120 can be patterned with an opening 120a in the photoresist layer 120 exposing the seed layer 118 at the entire top surface and entire sidewall(s) of the polymer bump 114, over the passivation layer 34 and over the first region 152 of the pad 32.

Figure 7F:
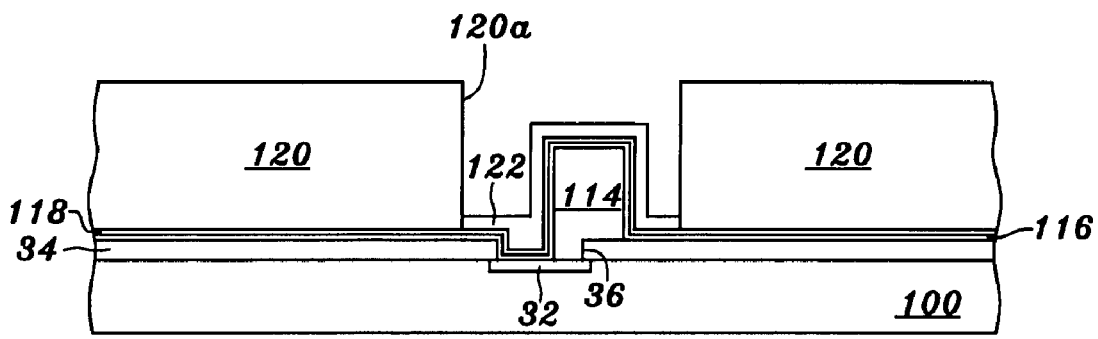

Referring to FIG. 7F, a metal layer 122 having a thickness of between 1 and 20 μm, and preferably of between 1.5 and 15 μm, can be electroplated and/or electroless plated over the seed layer 118 exposed by the opening 120a. The metal layer 122 may be a single layer of gold, copper, silver, palladium, platinum, rhodium, ruthenium, rhenium or nickel, or a composite layer made of the abovementioned metals. The specification of the metal layer 122 shown in FIG. 7F can be referred to as the metal layer 122 illustrated in FIG. 2F. The process of forming the metal layer 122 shown in FIG. 7F can be referred to as the process of forming the metal layer 122 illustrated in FIG. 2F.

Figure 7G:
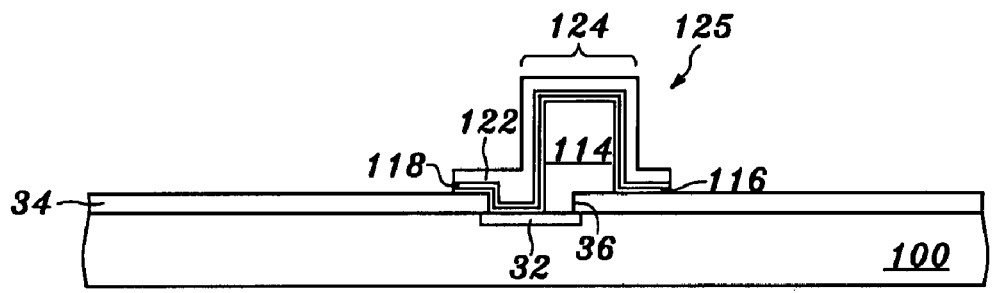

Referring to FIG. 7G, after the metal layer 122 is formed, most of the photoresist layer 120 can be removed using an organic solution with amide. However, some residuals from the photoresist layer 120 could remain on the metal layer 122 and on the seed layer 118. Thereafter, the residuals can be removed from the metal layer 122 and from the seed layer 118 with a plasma, such as $O_2$ plasma or plasma containing fluorine of below 200 PPM and oxygen.

Next, the seed layer 118 and the adhesion/barrier layer 116 not under the metal layer 122 are subsequently removed with a dry etching method or a wet etching method. The process of removing the seed layer 118 and the adhesion/barrier layer 116 not under the metal layer 122, as shown in FIG. 7G, can be referred to as the process of removing the seed layer 118 and the adhesion/barrier layer 116 not under the metal layer 122, as illustrated in FIG. 2G.

Thereby, a metal trace 125, formed with the adhesion/barrier layer 116, the seed layer 118 and the metal layer 122, includes a bonding pad 124 on the top surface of the polymer bump 114. The bonding pad 124 is used to be connected to an external circuit, such as a semiconductor chip or wafer, a flexible substrate comprising a polymer layer (such as polyimide) having a thickness of between 30 and 200 μm and not comprising any polymer layer with glass fiber, a glass substrate, a ceramic substrate comprising a ceramic material as insulating layers between circuit layers, a silicon substrate or an organic substrate. Alternatively, the bonding pad 124 can be connected to a printed circuit board (PCB) via a TAB (tape automated bonding) method.

Figure 7H:
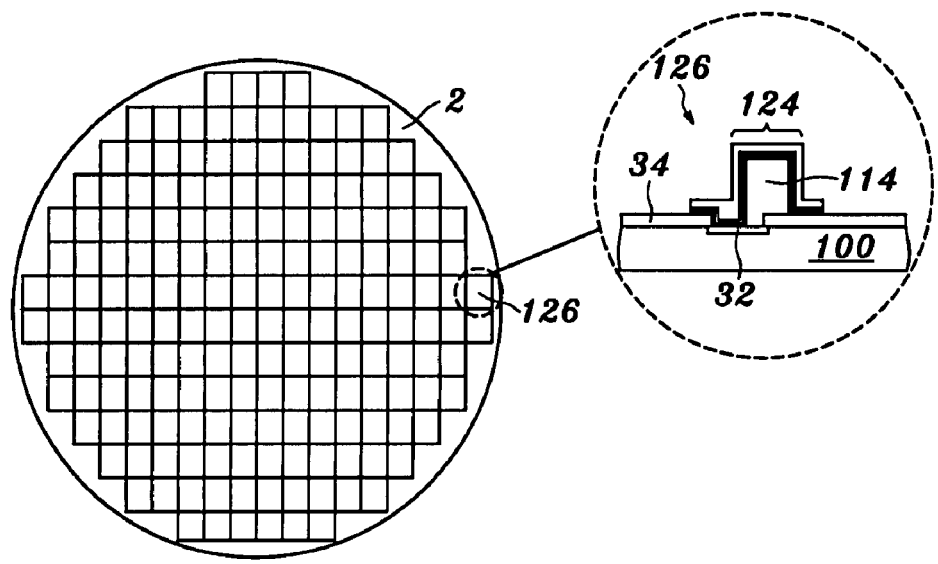

Referring to FIG. 7H, after the seed layer 118 and the adhesion/barrier layer 116 not under the metal layer 122 are removed, a semiconductor wafer formed with the polymer bump 114 and the metal layers 116, 118 and 122 can be diced into a plurality of individual semiconductor chips 126.

Figure 7I:
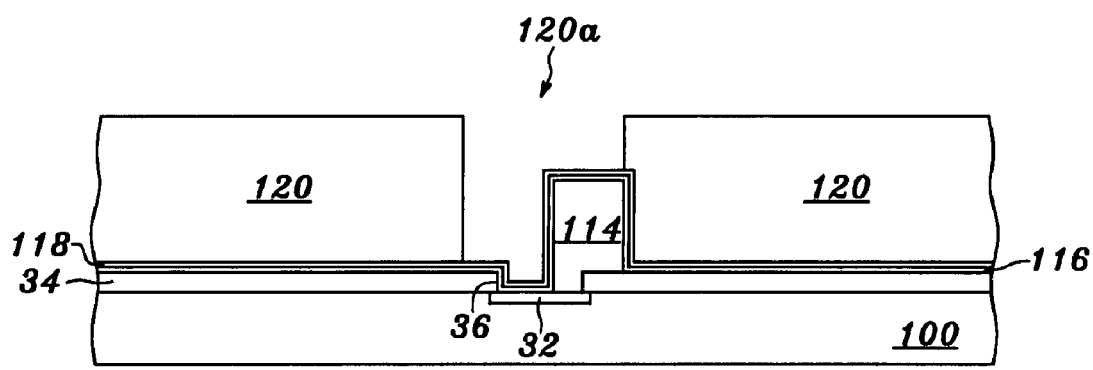
Figure 7J:
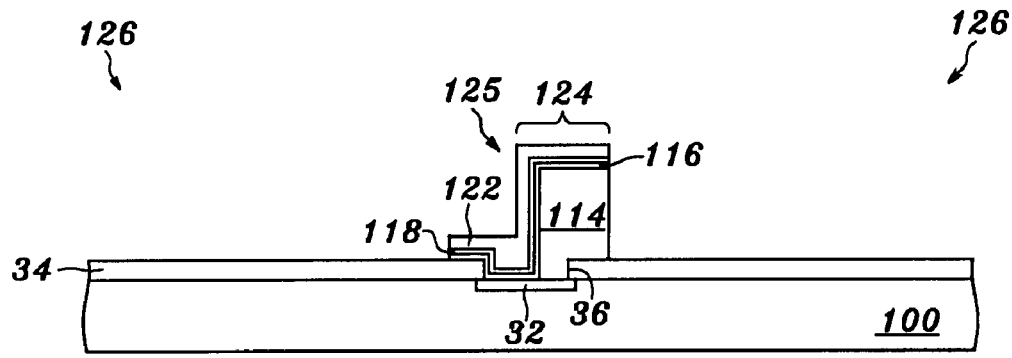

Alternatively, referring to FIG. 7I, after the seed layer 118 shown in FIG. 7D is formed, a photoresist layer 120 having a thickness of between 6 and 100 μm, and preferably of between 10 and 50 μm, is spin-on coated on the seed layer 118. Next, the photoresist layer 120 is patterned with exposure and development processes to form an opening 120a in the photoresist layer 120 exposing the seed layer 118 at the entire top surface and a portion of the sidewall(s) of the polymer bump 114, over the passivation layer 34 and over the first region 152 of the pad 32. Next, the steps as referred to in FIGS. 7F-7G are performed in sequence. Next, referring to FIG. 7J, the semiconductor wafer can be diced into a plurality of individual semiconductor chips 126.

Figure 7K:
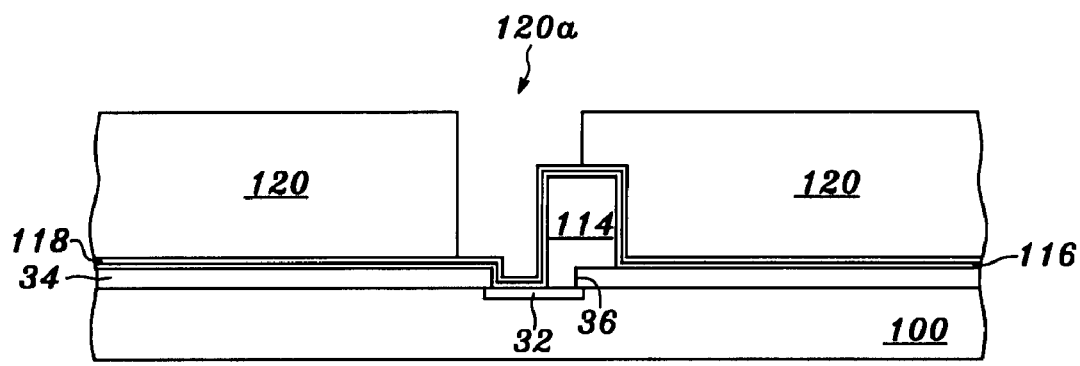
Figure 7L:
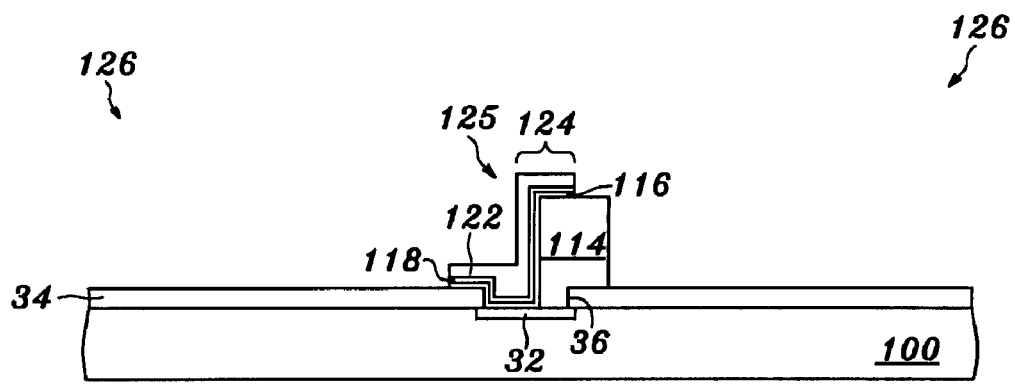

Alternatively, referring to FIG. 7K, after the seed layer 118 is formed, a photoresist layer 120 having a thickness of between 6 and 100 μm, and preferably of between 10 and 50 μm, is spin-on coated on the seed layer 118. Next, the photoresist layer 120 is patterned with the processes of exposure, development, etc., to form an opening 120a in the photoresist layer 120 exposing the seed layer 118 at a portion of the top surface and a portion of the sidewall(s) of the polymer bump 114, over the passivation layer 34 and over the first region 152 of the pad 32. Next, the steps as referred to in FIGS. 7F-7G are performed in sequence. Next, referring to FIG. 7L, the semiconductor wafer can be diced into a plurality of individual semiconductor chips 126.

Aspect 2 of Embodiment 2

Figure 8A:
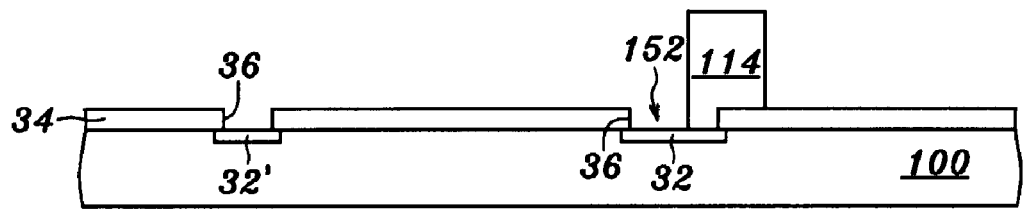
FIGS. 8A through 8L are sectional views showing a process according to another one embodiment of the present invention.
Figure 8B:
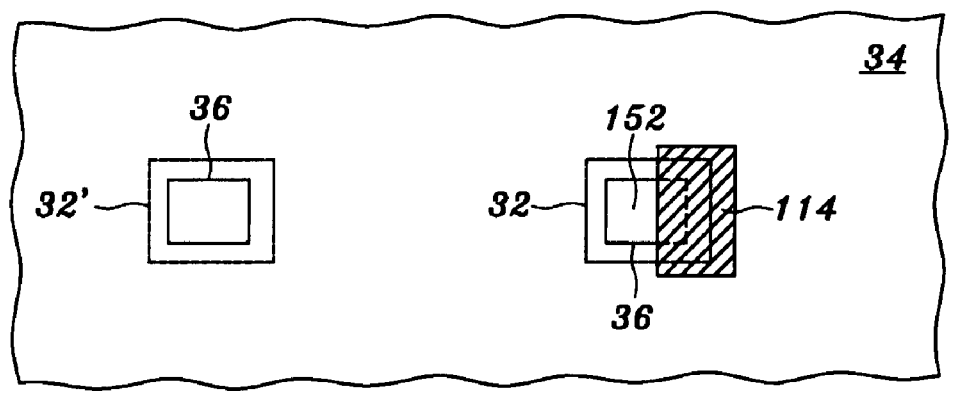

Referring to FIGS. 8A and 8B, after the step shown in FIG. 3A is completed, the polymer layer 112 is patterned with exposure and development processes to form a polymer bump 114 on a portion of the pad 32 exposed by the opening 36 and on the passivation layer 34 close to the pad 32. The top surface of the pad 32 exposed by the opening 36 may have a first region 152 uncovered by the polymer bump 114 and a second region covered by the polymer bump 114. The ratio of the area of the first region 152 to that of the pad 32 is between 0.1 and 0.9, or between 0.05 and 0.5. The specification of the polymer bump 114 shown in FIG. 8A can be referred to as the polymer bump 114 illustrated in FIG. 7A. The process of forming the polymer bump 114 shown in FIG. 8A can be referred to as the process of forming the polymer bump 114 illustrated in FIG. 7A. Further, there may be some of the active devices, such as p-channel MOS devices, n-channel MOS devices, CMOS (Complementary Metal Oxide Semiconductor) devices, BJT (Bipolar Junction Transistor) devices or BiCMOS (Bipolar CMOS) devices, under the polymer bump 114. Alternatively, there may be no active devices under the polymer bump 114.

Figure 8C:
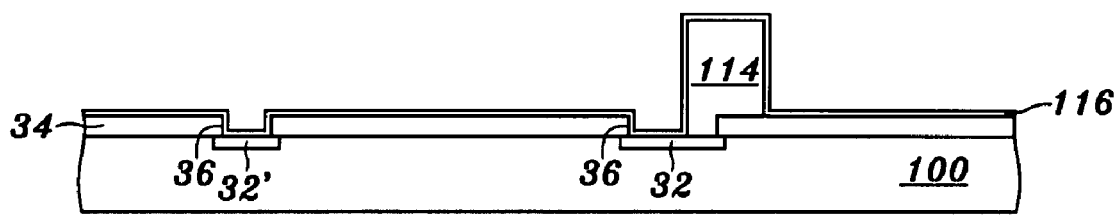

Referring to FIG. 8C, an adhesion/barrier layer 116 having a thickness of between 0.02 and 0.8 μm, and preferably of between 0.05 and 0.2 μm, can be sputtered on the passivation layer 34, on an entire top surface and entire sidewall(s) of the polymer bump 114, on the first region 152 of the pad 32 and on the pad 32', wherein the pads 32 and 32' can be aluminum pads or copper pads. The material of the adhesion/barrier layer 116 may be titanium, a titanium-tungsten alloy, titanium nitride, chromium, tantalum, tantalum nitride or a composite of the abovementioned materials. Alternatively, the adhesion/barrier layer 116 can be formed by an evaporation process, a chemical vapor deposition (CVD) process, a PVD (Physical Vapor Deposition) process or an electroless plating process.

For example, the adhesion/barrier layer 116 may be formed by sputtering a titanium layer with a thickness of between 0.02 and 0.8 μm, and preferably of between 0.05 and 0.2 μm, on the passivation layer 34, on the entire top surface and entire sidewall(s) of the polymer bump 114, on the first region 152 of the pad 32 and on the pad 32', wherein the pads 32 and 32' are principally made of aluminum. Alternatively, the adhesion/barrier layer 116 may be formed by sputtering a titanium-tungsten-alloy layer with a thickness of between 0.02 and 0.8 μm, and preferably of between 0.05 and 0.2 μm, on the passivation layer 34, on the entire top surface and entire sidewall(s) of the polymer bump 114, on the first region 152 of the pad 32 and on the pad 32', wherein the pads 32 and 32' are principally made of aluminum. Alternatively, the adhesion/barrier layer 116 may be formed by sputtering a titanium-nitride layer with a thickness of between 0.02 and 0.8 µm, and preferably of between 0.05 and 0.2 µm, on the passivation layer 34, on the entire top surface and entire sidewall(s) of the polymer bump 114, on the first region 152 of the pad 32 and on the pad 32', wherein the pads 32 and 32' are principally made of aluminum. Alternatively, the adhesion/barrier layer 116 may be formed by sputtering a chromium layer with a thickness of between 0.02 and 0.8 µm, and preferably of between 0.05 and 0.2 µm, on the passivation layer 34, on the entire top surface and entire sidewall(s) of the polymer bump 114, on the first region 152 of the pad 32 and on the pad 32', wherein the pads 32 and 32' are principally made of aluminum. Alternatively, the adhesion/barrier layer 116 may be formed by sputtering a tantalum-nitride layer with a thickness of between 0.02 and 0.8 µm, and preferably of between 0.05 and 0.2 µm, on the passivation layer 34, on the entire top surface and entire sidewall(s) of the polymer bump 114, on the first region 152 of the pad 32 and on the pad 32', wherein the pads 32 and 32' are principally made of aluminum. Alternatively, the adhesion/barrier layer 116 may be formed by sputtering a tantalum layer with a thickness of between 0.02 and 0.8 µm, and preferably of between 0.05 and 0.2 µm, on the passivation layer 34, on the entire top surface and entire sidewall(s) of the polymer bump 114, on the first region 152 of the pad 32 and on the pad 32', wherein the pads 32 and 32' are principally made of aluminum.

For example, the adhesion/barrier layer 116 may be formed by sputtering a titanium layer with a thickness of between 0.02 and 0.8 µm, and preferably of between 0.05 and 0.2 µm, on the passivation layer 34, on the entire top surface and entire sidewall(s) of the polymer bump 114, on the first region 152 of the pad 32 and on the pad 32', wherein the pads 32 and 32' are principally made of copper. Alternatively, the adhesion/barrier layer 116 may be formed by sputtering a titanium-tungsten-alloy layer with a thickness of between 0.02 and 0.8 µm, and preferably of between 0.05 and 0.2 µm, on the passivation layer 34, on the entire top surface and entire sidewall(s) of the polymer bump 114, on the first region 152 of the pad 32 and on the pad 32', wherein the pads 32 and 32' are principally made of copper. Alternatively, the adhesion/barrier layer 116 may be formed by sputtering a titanium-nitride layer with a thickness of between 0.02 and 0.8 µm, and preferably of between 0.05 and 0.2 µm, on the passivation layer 34, on the entire top surface and entire sidewall(s) of the polymer bump 114, on the first region 152 of the pad 32 and on the pad 32', wherein the pads 32 and 32' are principally made of copper. Alternatively, the adhesion/barrier layer 116 may be formed by sputtering a chromium layer with a thickness of between 0.02 and 0.8 µm, and preferably of between 0.05 and 0.2 µm, on the passivation layer 34, on the entire top surface and entire sidewall(s) of the polymer bump 114, on the first region 152 of the pad 32 and on the pad 32', wherein the pads 32 and 32' are principally made of copper. Alternatively, the adhesion/barrier layer 116 may be formed by sputtering a tantalum-nitride layer with a thickness of between 0.02 and 0.8 µm, and preferably of between 0.05 and 0.2 µm, on the passivation layer 34, on the entire top surface and entire sidewall(s) of the polymer bump 114, on the first region 152 of the pad 32 and on the pad 32', wherein the pads 32 and 32' are principally made of copper. Alternatively, the adhesion/barrier layer 116 may be formed by sputtering a tantalum layer with a thickness of between 0.02 and 0.8 µm, and preferably of between 0.05 and 0.2 µm, on the passivation layer 34, on the entire top surface and entire sidewall(s) of the polymer bump 114, on the first region 152 of the pad 32 and on the pad 32', wherein the pads 32 and 32' are principally made of copper.

Figure 8D:
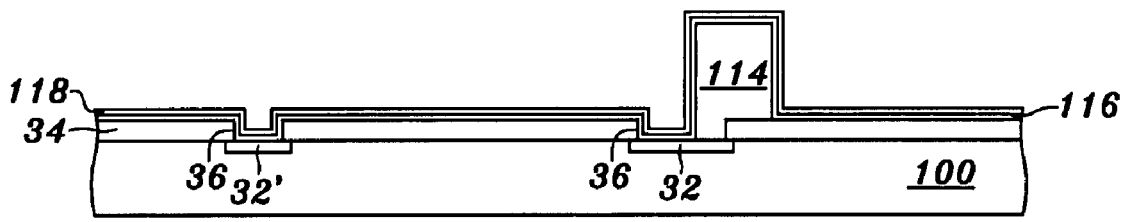

Referring to FIG. 8D, a seed layer 118 having a thickness of between 0.005 and 2 µm, and preferably of between 0.1 and 0.7 µm, can be sputtered on the adhesion/barrier layer 116. Alternatively, the seed layer 118 can be formed by a vapor deposition method, an electroless plating method or a PVD (Physical Vapor Deposition) method. The specification of the seed layer 118 shown in FIG. 8D can be referred to as the seed layer 118 illustrated in FIG. 2D. The process of forming the seed layer 118 shown in FIG. 8D can be referred to as the process of forming the seed layer 118 illustrated in FIG. 2D.

Figure 8E:
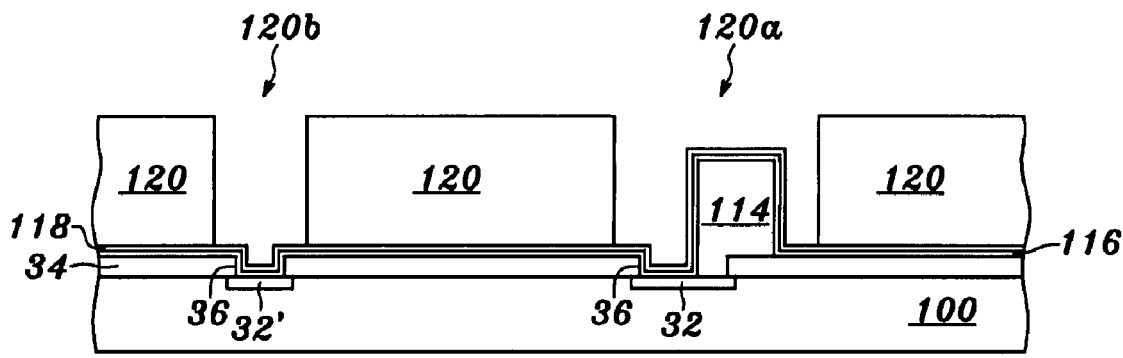

Referring to FIG. 8E, a photoresist layer 120, such as positive-type photoresist layer, having a thickness of between 6 and 100 µm, and preferably of between 10 and 50 µm, is spin-on coated on the seed layer 118. Next, the photoresist layer 120 is patterned with exposure and development processes to form an opening 120a in the photoresist layer 120 exposing the seed layer 118 at the entire top surface and entire sidewall(s) of the polymer bump 114, over the passivation layer 34 and over the first region 152 of the pad 32, and to form an opening 120b in the photoresist layer 120 exposing the seed layer 118 over the pad 32' and over the passivation layer 34 close to the pad 32'. A 1X stepper or 1X contact aligner can be used to expose the photoresist layer 120 during the process of exposure.

For example, the photoresist layer 120 can be formed by spin-on coating a positive-type photosensitive polymer layer having a thickness of between 7 and 90 µm, and preferably of between 8 and 45 µm, on the seed layer 118, then exposing the photosensitive polymer layer using a 1X stepper or 1X contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants form the seed layer 118 with an $O_2$ plasma or a plasma containing fluorine of below 200 PPM and oxygen, such that the photoresist layer 120 can be patterned with an opening 120a in the photoresist layer 120 exposing the seed layer 118 at the entire top surface and entire sidewall(s) of the polymer bump 114, over the passivation layer 34 and over the first region 152 of the pad 32, and with an opening 120b in the photoresist layer 120 exposing the seed layer 118 over the pad 32' and over the passivation layer 34 close to the pad 32'.

Figure 8F:
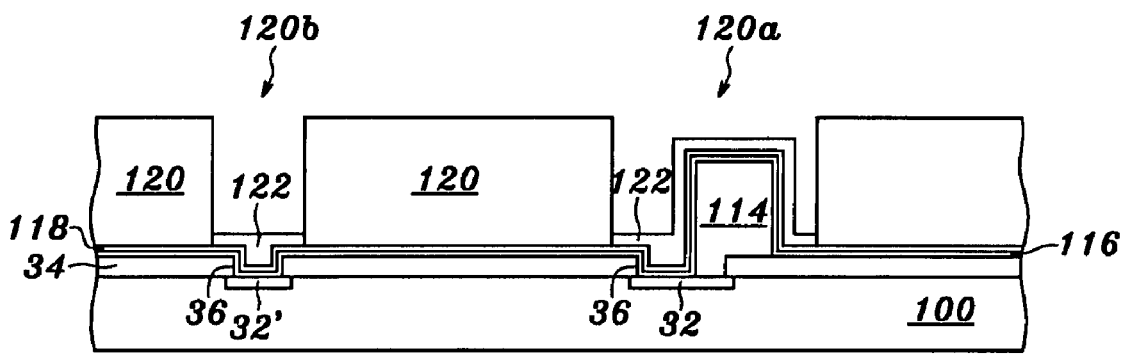

Referring to FIG. 8F, a metal layer 122 having a thickness of between 1 and 20 µm, and preferably of between 1.5 and 15 µm, can be electroplated and/or electroless plated over the seed layer 118 exposed by the openings 120a and 120b. The specification of the metal layer 122 shown in FIG. 8F can be referred to as the metal layer 122 illustrated in FIG. 2F. The process of forming the metal layer 122 shown in FIG. 8F can be referred to as the process of forming the metal layer 122 illustrated in FIG. 2F.

Figure 8G:
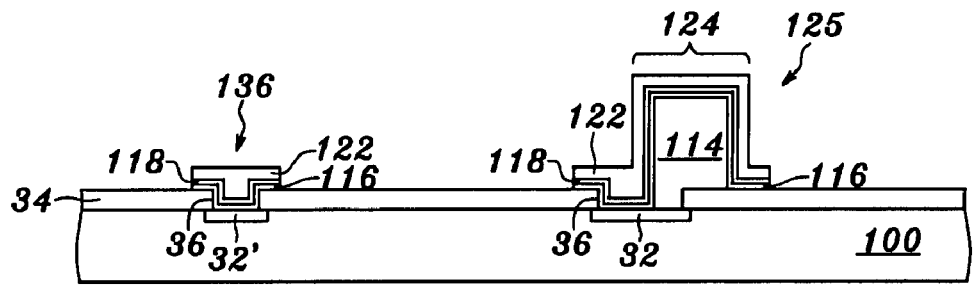

Referring to FIG. 8G, after the metal layer 122 is formed, most of the photoresist layer 120 can be removed using an organic solution with amide. However, some residuals from the photoresist layer 120 could remain on the metal layer 122 and on the seed layer 118. Thereafter, the residuals can be removed from the metal layer 122 and from the seed layer 118 with a plasma, such as $O_2$ plasma or plasma containing fluorine of below 200 PPM and oxygen.

Next, the seed layer 118 and the adhesion/barrier layer 116 not under the metal layer 122 are subsequently removed with a dry etching method or a wet etching method. The process of removing the seed layer 118 and the adhesion/barrier layer 116 not under the metal layer 122, as shown in FIG. 8G, can be referred to as the process of removing the seed layer 118 and the adhesion/barrier layer 116 not under the metal layer 122, as illustrated in FIG. 2G.

Thereby, a metal trace 125, formed with the adhesion/barrier layer 116, the seed layer 118 and the metal layer 122, includes a bonding pad 124 on the top surface of the polymer bump 114, and a bonding pad 136, formed with the adhesion/barrier layer 116, the seed layer 118 and the metal layer 122, is on the pad 32'. The bonding pad 124 is used to be connected to a semiconductor chip via a flip chip (FC) mothed. The bonding pad 136 is used to be connected to an external circuit via a wirebonding process, a solder bonding process or a tape-automated-bonding (TAB) process, for example, such as another semiconductor chip, a flexible substrate comprising a polymer layer (such as polyimide) having a thickness of between 30 and 200 μm and not comprising any polymer layer with glass fiber, a glass substrate, a ceramic substrate comprising a ceramic material as insulating layers between circuit layers, a silicon substrate, an organic substrate, a printed circuit board (PCB) or a ball grid array (BGA) substrate.

Figure 8H:
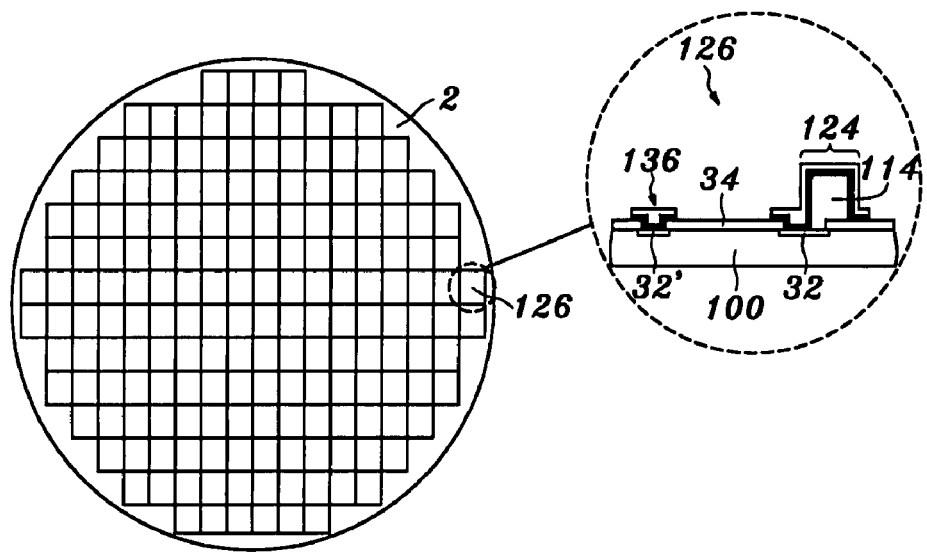

Referring to FIG. 8H, after the seed layer 118 and the adhesion/barrier layer 116 not under the metal layer 122 are removed, a semiconductor wafer formed with the polymer bump 114 and the metal layers 116, 118 and 122 can be diced into a plurality of individual semiconductor chips 126.

Figure 8I:
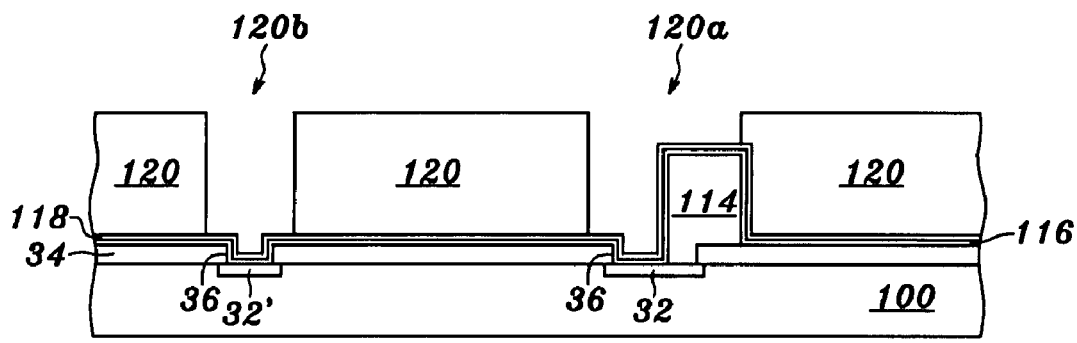
Figure 8J:
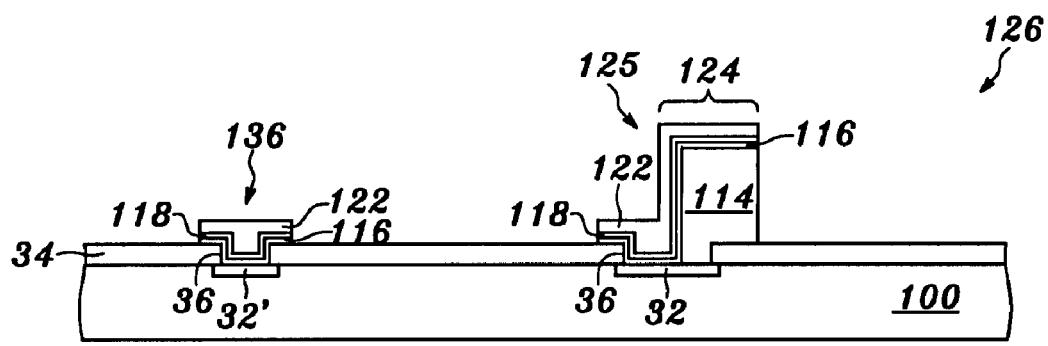

Alternatively, referring to FIG. 8I, after the seed layer 118 is formed, a photoresist layer 120 having a thickness of between 6 and 100 μm, and preferably of between 10 and 50 μm, is spin-on coated on the seed layer 118. Next, the photoresist layer 120 is patterned with exposure and development processes to form an opening 120a in the photoresist layer 120 exposing the seed layer 118 at the entire top surface and a portion of the sidewall(s) of the polymer bump 114, over the passivation layer 34 and over the first region 152 of the pad 32, and to form an opening 120b in the photoresist layer 120 exposing the seed layer 118 over the pad 32' and over the passivation layer 34 close to the pad 32'. Next, the steps as referred to in FIGS. 8F-8G are performed in sequence. Next, referring to FIG. 8J, the semiconductor wafer can be diced into a plurality of individual semiconductor chips 126.

Figure 8K:
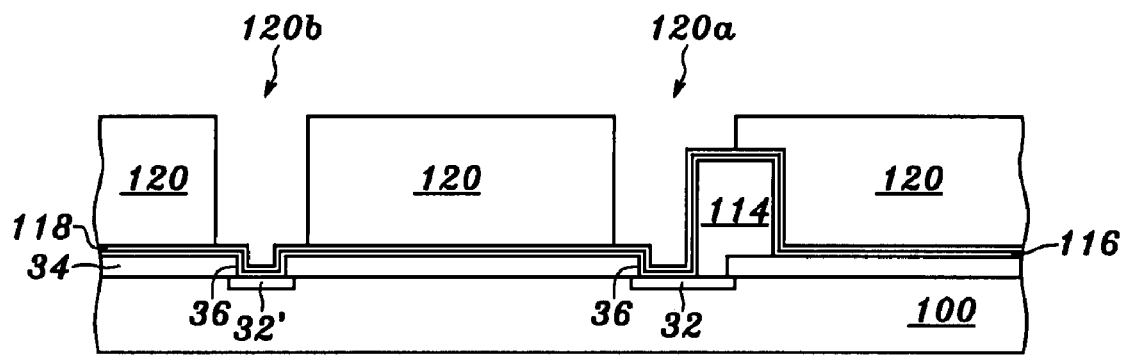
Figure 8L:
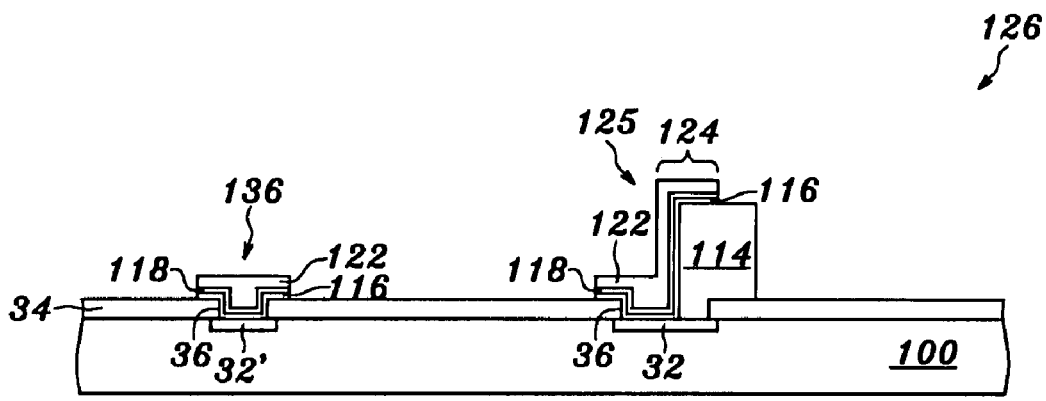

Alternatively, referring to FIG. 8K, after the seed layer 118 is formed, a photoresist layer 120 having a thickness of between 6 and 100 μm, and preferably of between 10 and 50 μm, is spin-on coated on the seed layer 118. Next, the photoresist layer 120 is patterned with exposure and development processes to form an opening 120a in the photoresist layer 120 exposing the seed layer 118 at a portion of the top surface and a portion of the sidewall(s) of the polymer bump 114, over the passivation layer 34 and over the first region 152 of the pad 32, and to form an opening 120b in the photoresist layer 120 exposing the seed layer 118 over the pad 32' and over the passivation layer 34 close to the pad 32'. Next, the steps as referred to in FIGS. 8F-8G are performed in sequence. Next, referring to FIG. 8L, the semiconductor wafer can be diced into a plurality of individual semiconductor chips 126.

Aspect 3 of Embodiment 2

Figure 9A:
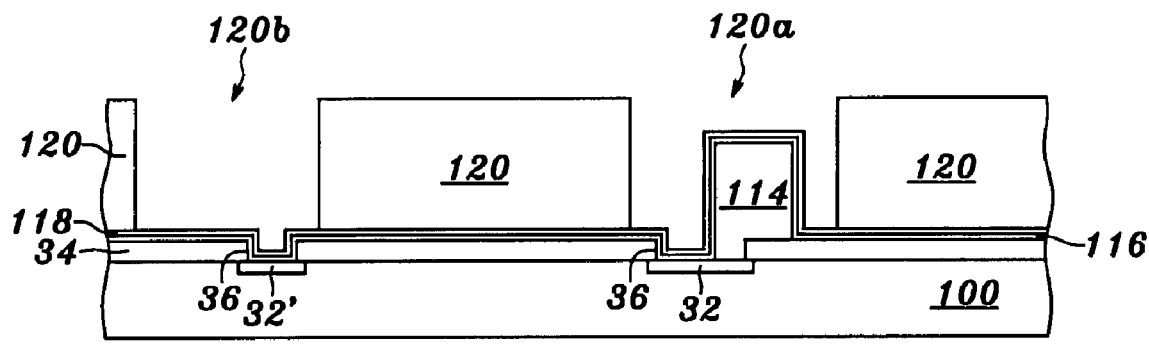
FIGS. 9A through 9I are sectional views showing a process according to another one embodiment of the present invention.

Referring to FIG. 9A, after the step shown in FIG. 8D is completed, a photoresist layer 120, such as positive-type photoresist layer, having a thickness of between 6 and 100 μm, and preferably of between 10 and 50 μm, is spin-on coated on the seed layer 118. Next, the photoresist layer 120 is patterned with exposure and development processes to form an opening 120a in the photoresist layer 120 exposing the seed layer 118 at the entire top surface and entire sidewall(s) of the polymer bump 114, over the passivation layer 34 and over the first region 152 of the pad 32, and to form an opening 120b in the photoresist layer 120 exposing the seed layer 118 over the passivation layer 34 and over the pad 32'. A 1X stepper or 1X contact aligner can be used to expose the photoresist layer 120 during the process of exposure. The process of forming the photoresist layer 120 and the openings 120a and 120b, as shown in FIG. 9A, can be referred to as the process of forming the photoresist layer 120 and the openings 120a and 120b, as illustrated in FIG. 8E.

Figure 9B:
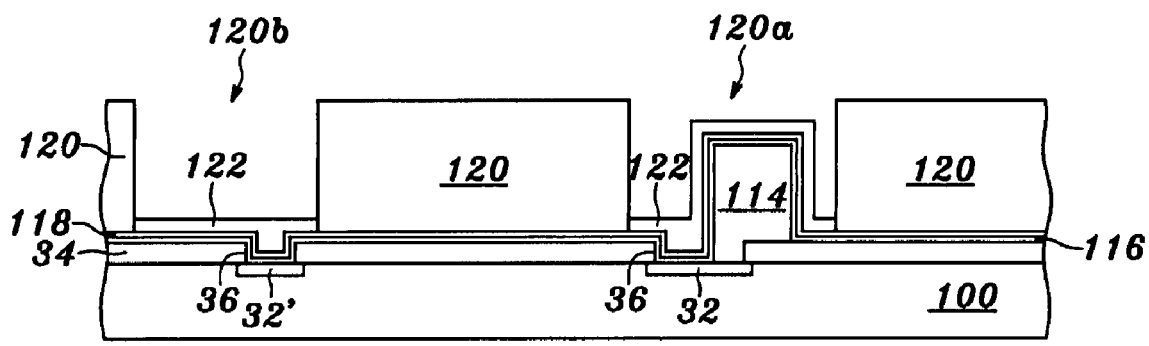

Referring to FIG. 9B, a metal layer 122 having a thickness of between 1 and 20 μm, and preferably of between 1.5 and 15 μm, can be electroplated and/or electroless plated over the seed layer 118 exposed by the openings 120a and 120b. The specification of the metal layer 122 shown in FIG. 9B can be referred to as the metal layer 122 illustrated in FIG. 2F. The process of forming the metal layer 122 shown in FIG. 9B can be referred to as the process of forming the metal layer 122 illustrated in FIG. 2F.

Figure 9C:
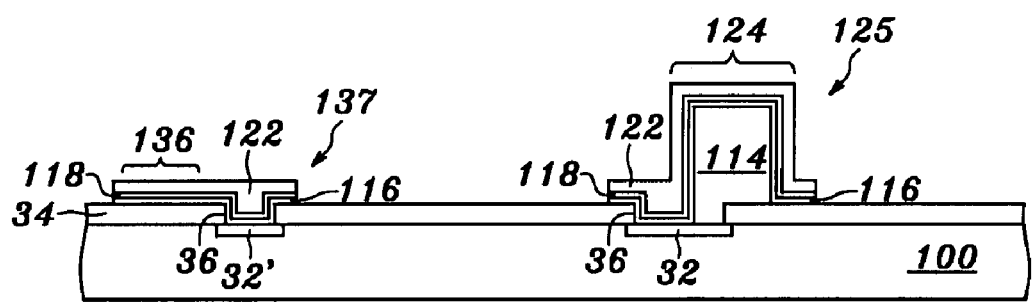

Referring to FIG. 9C, after the metal layer 122 is formed, most of the photoresist layer 120 can be removed using an organic solution with amide. However, some residuals from the photoresist layer 120 could remain on the metal layer 122 and on the seed layer 118. Thereafter, the residuals can be removed from the metal layer 122 and from the seed layer 118 with a plasma, such as $O_2$ plasma or plasma containing fluorine of below 200 PPM and oxygen.

Next, the seed layer 118 and the adhesion/barrier layer 116 not under the metal layer 122 are subsequently removed with a dry etching method or a wet etching method. The process of removing the seed layer 118 and the adhesion/barrier layer 116 not under the metal layer 122, as shown in FIG. 9C, can be referred to as the process of removing the seed layer 118 and the adhesion/barrier layer 116 not under the metal layer 122, as illustrated in FIG. 2G.

Figure 9D:
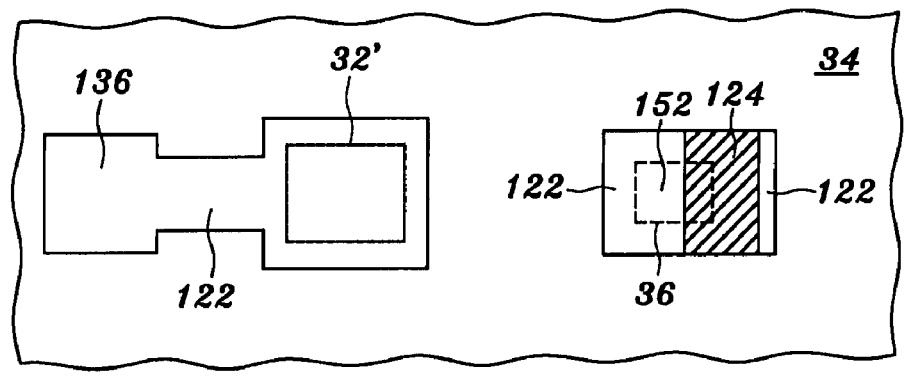

Thereby, referring to FIGS. 9C and 9D, at least two metal traces 125 and 137 are formed with the adhesion/barrier layer 116, the seed layer 118 and the metal layer 122, including a bonding pad 124 on the top surface of the polymer bump 114, and a bonding pad 136 on the passivation layer 34, connected to the pad 32' through the opening 36. The bonding pad 124 is used to be connected to a semiconductor chip via a flip chip (FC) mothed, and from a top perspective view, the position of the bonding pad 124 is different from that of the first region 152 of the pad 32, to which the metal trace 125 is connected. The bonding pad 136 is used to be connected to an external circuit via a wirebonding process, a solder bonding process or a tape-automated-bonding (TAB) process, for example. From a top perspective view, the position of the bonding pad 136 may be different from that of the pad 32'. Alternatively, from a top perspective view, the position of the bonding pad 136 may be the same as that of the pad 32'. The external circuit may be another semiconductor chip, a flexible substrate comprising a polymer layer (such as polyimide) having a thickness of between 30 and 200 μm and not comprising any polymer layer with glass fiber, a glass substrate, a ceramic substrate comprising a ceramic material as insulating layers between circuit layers, a silicon substrate, an organic substrate, a printed circuit board (PCB) or a ball grid array (BGA) substrate.

Figure 9E:
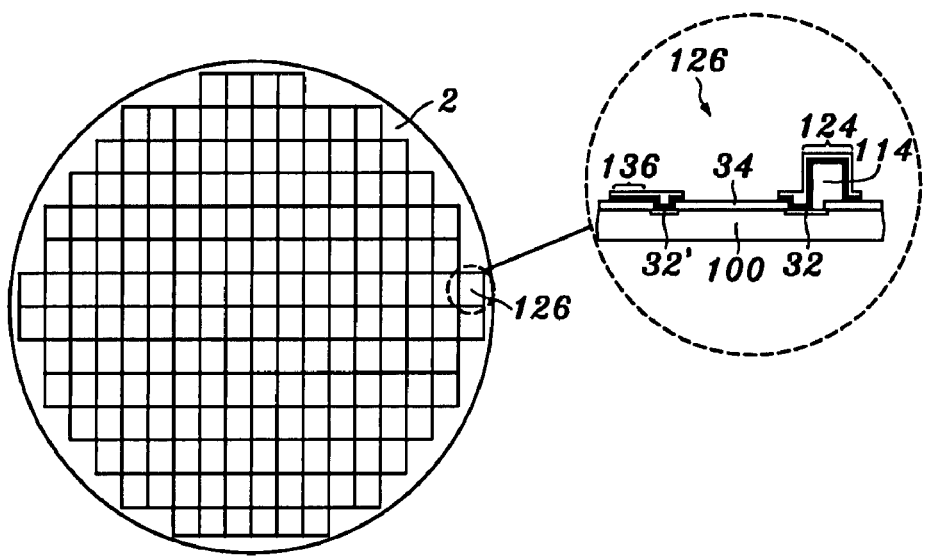

Referring to FIG. 9E, after the seed layer 118 and the adhesion/barrier layer 116 not under the metal layer 122 are removed, a semiconductor wafer formed with the polymer bump 114 and the metal layers 116, 118 and 122 can be diced into a plurality of individual semiconductor chips 126.

Figure 9F:
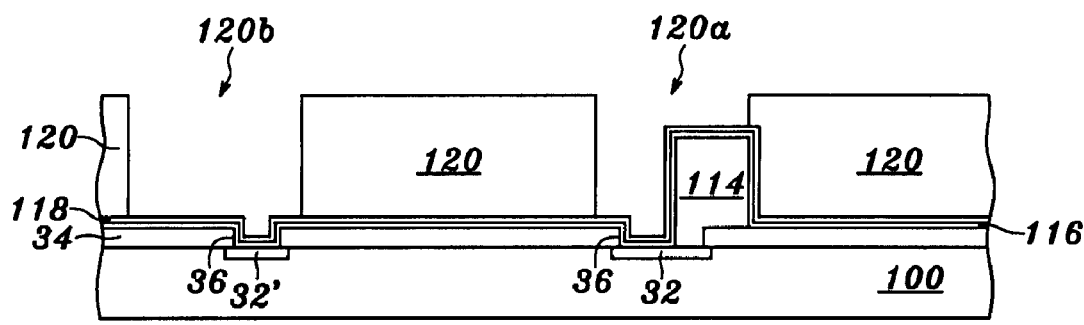
Figure 9G:
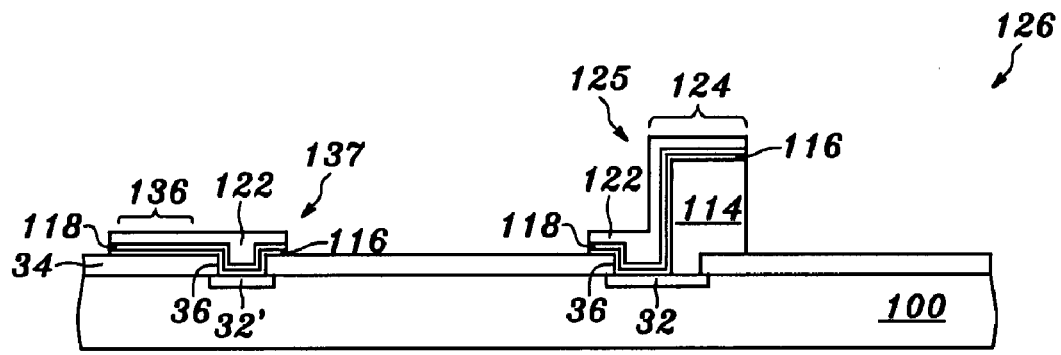

Alternatively, referring to FIG. 9F, after the seed layer 118 is formed, a photoresist layer 120 having a thickness of between 6 and 100 µm, and preferably of between 10 and 50 µm, is spin-on coated on the seed layer 118. Next, the photoresist layer 120 is patterned with exposure and development processes to form an opening 120a in the photoresist layer 120 exposing the seed layer 118 at the entire top surface and a portion of the sidewall(s) of the polymer bump 114, over the passivation layer 34 and over the first region 152 of the pad 32, and to form an opening 120b in the photoresist layer 120 exposing the seed layer 118 over the passivation layer 34 and over the pad 32'. Next, the steps as referred to in FIGS. 9B-9C are performed in sequence. Next, referring to FIG. 9G, the semiconductor wafer can be diced into a plurality of individual semiconductor chips 126.

Figure 9H:
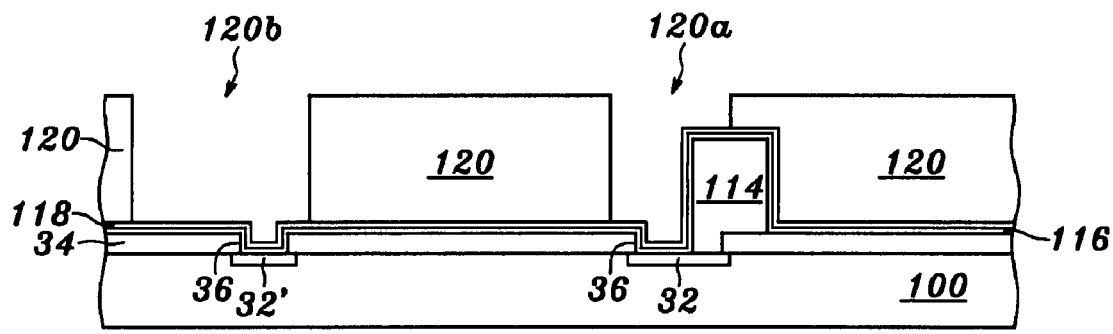
Figure 9I:
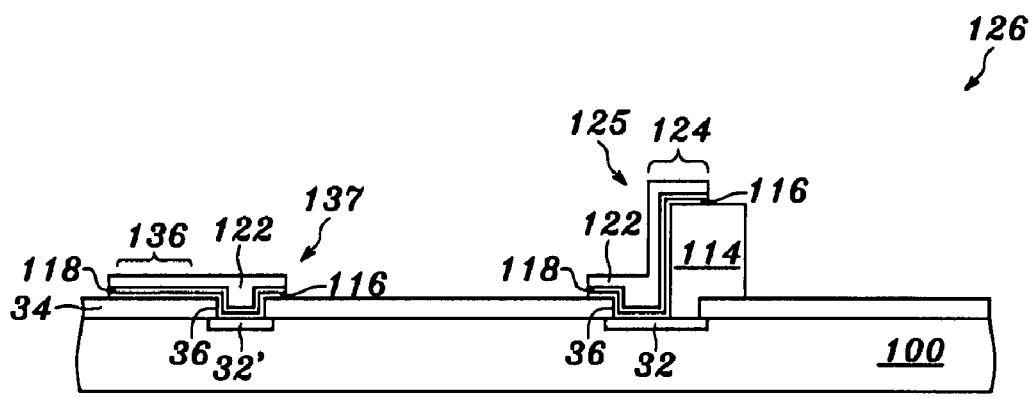

Alternatively, referring to FIG. 9H, after the seed layer 118 is formed, a photoresist layer 120 having a thickness of between 6 and 100 µm, and preferably of between 10 and 50 µm, is spin-on coated on the seed layer 118. Next, the photoresist layer 120 is patterned with exposure and development processes to form an opening 120a in the photoresist layer 120 exposing the seed layer 118 at a portion of the top surface and a portion of the sidewall(s) of the polymer bump 114, over the passivation layer 34 and over the first region 152 of the pad 32, and to form an opening 120b in the photoresist layer 120 exposing the seed layer 118 over the passivation layer 34 and over the pad 32'. Next, the steps as referred to in FIGS. 9B-9C are performed in sequence. Next, referring to FIG. 9I, the semiconductor wafer can be diced into a plurality of individual semiconductor chips 126.

Aspect 4 of Embodiment 2

Figure 10A:
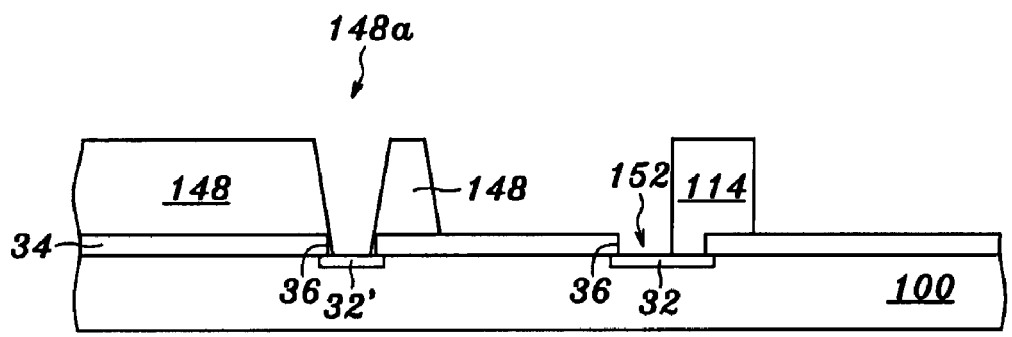
FIGS. 10A through 10K are sectional views showing a process according to another one embodiment of the present invention.
Figure 10B:
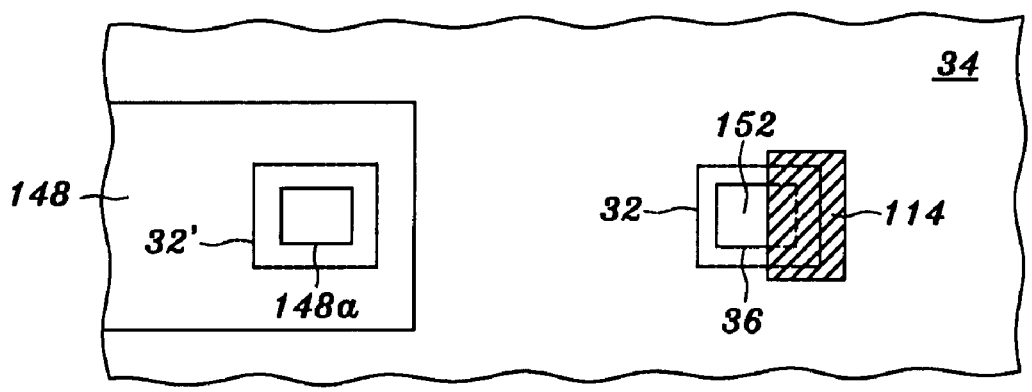

Referring to FIGS. 10A and 10B, after the step shown in FIG. 5A is completed, the polymer layer 112 is patterned with exposure and development processes to form a polymer bump 114 on a portion of the pad 32 exposed by the opening 36 and on the passivation layer 34 close to the pad 32, and to form a polymer island 148 on the passivation layer 34, an opening 148a in the polymer island 148 exposing the pad 32'. The top surface of the pad 32 exposed by the opening 36 may have a first region 152 uncovered by the polymer bump 114 and a second region covered by the polymer bump 114. The ratio of the area of the first region 152 to that of the pad 32 is between 0.1 and 0.9, or between 0.05 and 0.5.

The pad 32' may include a center portion exposed by the opening 148a and a peripheral portion covered with the polymer island 148, as shown in FIG. 10A. Alternatively, the opening 148a may expose the entire upper surface of the pad 32' exposed by the opening 36 in the passivation layer 34 and further may expose the upper surface of the passivation layer 34 near the pad 32'.

The material of the polymer bump 114 and the polymer island 148 may be polyimide (PI), benzocyclobutane (BCB), polyurethane, epoxy resin, a parylene-based polymer, a solder-mask material, an elastomer, or a porous dielectric material. The polymer bump 114 and the polymer island 148 have a thickness of between 5 and 50 µm. The specification of the polymer bump 114 shown in FIG. 10A can be referred to as the polymer bump 114 illustrated in FIG. 7A. Further, there may be some of the active devices, such as p-channel MOS devices, n-channel MOS devices, CMOS (Complementary Metal Oxide Semiconductor) devices, BJT (Bipolar Junction Transistor) devices or BiCMOS (Bipolar CMOS) devices, under the polymer bump 114. Alternatively, there may be no active devices under the polymer bump 114.

For example, the polymer layer 112 can be formed by spin-on coating a negative-type photosensitive polyimide layer, containing ester-typer precursor, having a thickness of between 10 and 100 µm on the passivation layer 34, then baking the spin-on coated polyimide layer, then exposing the baked polyimide layer using a 1X stepper or 1X contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form a polyimide bump on a portion of the pad 32 exposed by the opening 36 and on the passivation layer 34 close to the pad 32, and a polyimide island on the passivation layer 34, an opening in the polyimide island exposing the pad 32' exposed by the opening 36 in the passivation layer 34, then curing or heating the polyimide bump and the polyimide island at a peak temperature of between 290 and 400° C. for a time of between 20 and 150 minutes in a nitrogen ambient or in an oxygen-free ambient, the cured the polyimide bump 114 and the polyimide island 148 having a thickness of between 5 and 50 µm, and then removing the residual polymeric material or other contaminants from the upper surface of the pad 32 exposed by the opening 36 and from the upper surface of the pad 32' exposed by the opening in the polyimide island with an O$_2$ plasma or a plasma containing fluorine of below 200 PPM and oxygen. Thereby, the polymer bump 114 can be formed on a portion of the pad 32 exposed by the opening 36 and on the passivation layer 34 close to the pad 32, and the polyimide island 148 can be formed on the passivation layer 34. Alternatively, the polyimide bump and the polyimide island can be cured or heated at a temperature between 150 and 290° C., and preferably of between 260 and 280° C., for a time of between 20 and 150 minutes in a nitrogen ambient or in an oxygen-free ambient.

Figure 10C:
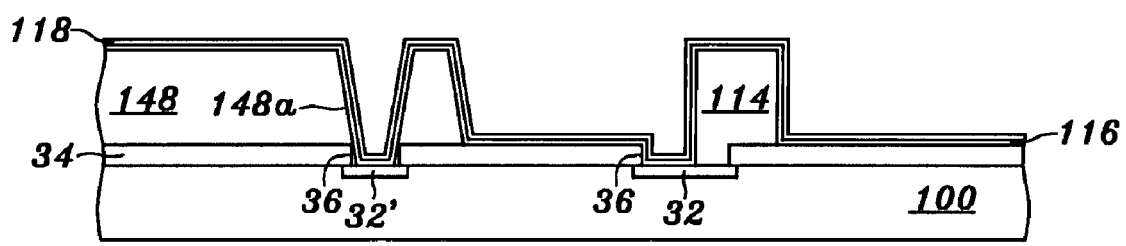

Referring to FIG. 10C, an adhesion/barrier layer 116 having a thickness of between 0.02 and 0.8 µm, and preferably of between 0.05 and 0.2 µm, can be sputtered on an entire top surface and entire sidewall(s) of the polymer bump 114, on the passivation layer 34, on the first region 152 of the pad 32 exposed by the opening 36, on the polymer island 148 and on the pad 32' exposed by the opening 148a. The material of the adhesion/barrier layer 116 may be titanium, a titanium-tungsten alloy, titanium nitride, chromium, tantalum, tantalum nitride or a composite of the abovementioned materials. Alternatively, the adhesion/barrier layer 116 can be formed by an evaporation process, a chemical vapor deposition (CVD) process, a PVD (Physical Vapor Deposition) process or an electroless plating process.

For example, the adhesion/barrier layer 116 may be formed by sputtering a titanium layer with a thickness of between 0.02 and 0.8 µm, and preferably of between 0.05 and 0.2 µm, on the entire top surface and entire sidewall(s) of the polymer bump 114, on the passivation layer 34, on the polymer island 148, on the first region 152 of the pad 32 and on the pad 32' exposed by the opening 148a, wherein the pads 32 and 32' are principally made of aluminum. Alternatively, the adhesion/barrier layer 116 may be formed by sputtering a titanium-tungsten-alloy layer with a thickness of between 0.02 and 0.8 µm, and preferably of between 0.05 and 0.2 µm, on the entire top surface and entire sidewall(s) of the polymer bump 114, on the passivation layer 34, on the polymer island 148, on the first region 152 of the pad 32 and on the pad 32' exposed by the opening 148a, wherein the pads 32 and 32' are principally made of aluminum. Alternatively, the adhesion/barrier layer 116 may be formed by sputtering a titanium-nitride layer with a thickness of between 0.02 and 0.8 μm, and preferably of between 0.05 and 0.2 μm, on the entire top surface and entire sidewall(s) of the polymer bump 114, on the passivation layer 34, on the polymer island 148, on the first region 152 of the pad 32 and on the pad 32' exposed by the opening 148a, wherein the pads 32 and 32' are principally made of aluminum. Alternatively, the adhesion/barrier layer 116 may be formed by sputtering a chromium layer with a thickness of between 0.02 and 0.8 μm, and preferably of between 0.05 and 0.2 μm, on the entire top surface and entire sidewall(s) of the polymer bump 114, on the passivation layer 34, on the polymer island 148, on the first region 152 of the pad 32 and on the pad 32' exposed by the opening 148a, wherein the pads 32 and 32' are principally made of aluminum. Alternatively, the adhesion/barrier layer 116 may be formed by sputtering a tantalum-nitride layer with a thickness of between 0.02 and 0.8 μm, and preferably of between 0.05 and 0.2 μm, on the entire top surface and entire sidewall(s) of the polymer bump 114, on the passivation layer 34, on the polymer island 148, on the first region 152 of the pad 32 and on the pad 32' exposed by the opening 148a, wherein the pads 32 and 32' are principally made of aluminum. Alternatively, the adhesion/barrier layer 116 may be formed by sputtering a tantalum layer with a thickness of between 0.02 and 0.8 μm, and preferably of between 0.05 and 0.2 μm, on the entire top surface and entire sidewall(s) of the polymer bump 114, on the passivation layer 34, on the polymer island 148, on the first region 152 of the pad 32 and on the pad 32' exposed by the opening 148a, wherein the pads 32 and 32' are principally made of aluminum.

For example, the adhesion/barrier layer 116 may be formed by sputtering a titanium layer with a thickness of between 0.02 and 0.8 μm, and preferably of between 0.05 and 0.2 μm, on the entire top surface and entire sidewall(s) of the polymer bump 114, on the passivation layer 34, on the polymer island 148, on the first region 152 of the pad 32 and on the pad 32' exposed by the opening 148a, wherein the pads 32 and 32' are principally made of copper. Alternatively, the adhesion/barrier layer 116 may be formed by sputtering a titanium-tungsten-alloy layer with a thickness of between 0.02 and 0.8 μm, and preferably of between 0.05 and 0.2 μm, on the entire top surface and entire sidewall(s) of the polymer bump 114, on the passivation layer 34, on the polymer island 148, on the first region 152 of the pad 32 and on the pad 32' exposed by the opening 148a, wherein the pads 32 and 32' are principally made of copper. Alternatively, the adhesion/barrier layer 116 may be formed by sputtering a titanium-nitride layer with a thickness of between 0.02 and 0.8 μm, and preferably of between 0.05 and 0.2 μm, on the entire top surface and entire sidewall(s) of the polymer bump 114, on the passivation layer 34, on the polymer island 148, on the first region 152 of the pad 32 and on the pad 32' exposed by the opening 148a, wherein the pads 32 and 32' are principally made of copper. Alternatively, the adhesion/barrier layer 116 may be formed by sputtering a chromium layer with a thickness of between 0.02 and 0.8 μm, and preferably of between 0.05 and 0.2 μm, on the entire top surface and entire sidewall(s) of the polymer bump 114, on the passivation layer 34, on the polymer island 148, on the first region 152 of the pad 32 and on the pad 32' exposed by the opening 148a, wherein the pads 32 and 32' are principally made of copper. Alternatively, the adhesion/barrier layer 116 may be formed by sputtering a tantalum-nitride layer with a thickness of between 0.02 and 0.8 μm, and preferably of between 0.05 and 0.2 μm, on the entire top surface and entire sidewall(s) of the polymer bump 114, on the passivation layer 34, on the polymer island 148, on the first region 152 of the pad 32 and on the pad 32' exposed by the opening 148a, wherein the pads 32 and 32' are principally made of copper. Alternatively, the adhesion/barrier layer 116 may be formed by sputtering a tantalum layer with a thickness of between 0.02 and 0.8 μm, and preferably of between 0.05 and 0.2 μm, on the entire top surface and entire sidewall(s) of the polymer bump 114, on the passivation layer 34, on the polymer island 148, on the first region 152 of the pad 32 and on the pad 32' exposed by the opening 148a, wherein the pads 32 and 32' are principally made of copper.

Next, a seed layer 118 having a thickness of between 0.005 and 2 μm, and preferably of between 0.1 and 0.7 μm, can be sputtered on the adhesion/barrier layer 116. The specification of the seed layer 118 shown in FIG. 10C can be referred to as the seed layer 118 illustrated in FIG. 2D. The process of forming the seed layer 118 shown in FIG. 10C can be referred to as the process of forming the seed layer 118 illustrated in FIG. 2D.

Figure 10D:
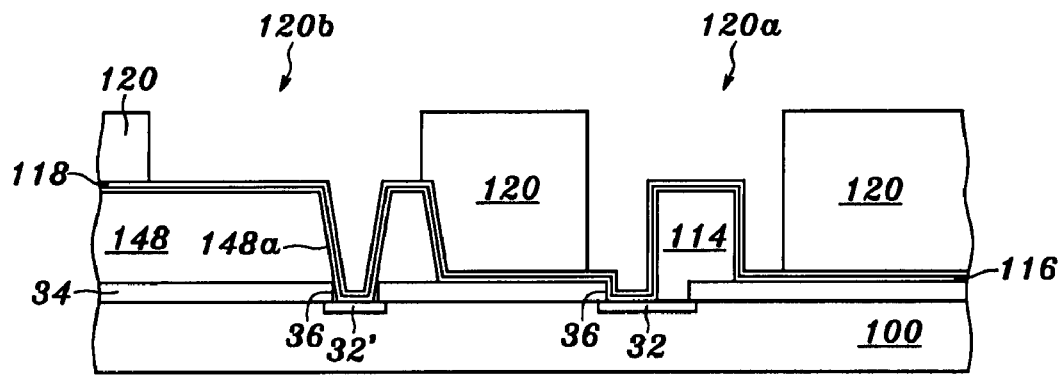

Referring to FIG. 10D, a photoresist layer 120, such as positive-type photoresist layer, having a thickness of between 6 and 100 μm, and preferably of between 10 and 50 μm, is spin-on coated on the seed layer 118. Next, the photoresist layer 120 is patterned with exposure and development processes to form an opening 120a in the photoresist layer 120 exposing the seed layer 118 at the entire top surface and entire sidewall(s) of the polymer bump 114, over the passivation layer 34 and over the first region 152 of the pad 32 exposed by the opening 36, and to form an opening 120b in the photoresist layer 120 exposing the seed layer 118 over the polymer island 148 and over the pad 32' exposed by the opening 148a. A 1X stepper or 1X contact aligner can be used to expose the photoresist layer 120 during the process of exposure.

For example, the photoresist layer 120 can be formed by spin-on coating a positive-type photosensitive polymer layer having a thickness of between 7 and 90 μm, and preferably of between 8 and 45 μm, on the seed layer 118, then exposing the photosensitive polymer layer using a 1X stepper or 1X contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants from the seed layer 118 with an $O_2$ plasma or a plasma containing fluorine of below 200 PPM and oxygen, such that the photoresist layer 120 can be patterned with an opening 120a in the photoresist layer 120 exposing the seed layer 118 at the entire top surface and entire sidewall(s) of the polymer bump 114, over the passivation layer 34 and over the first region 152 of the pad 32 exposed by the opening 36, and with an opening 120b in the photoresist layer 120 exposing the seed layer 118 over the polymer island 148 and over the pad 32' exposed by the opening 148a.

Figure 10E:
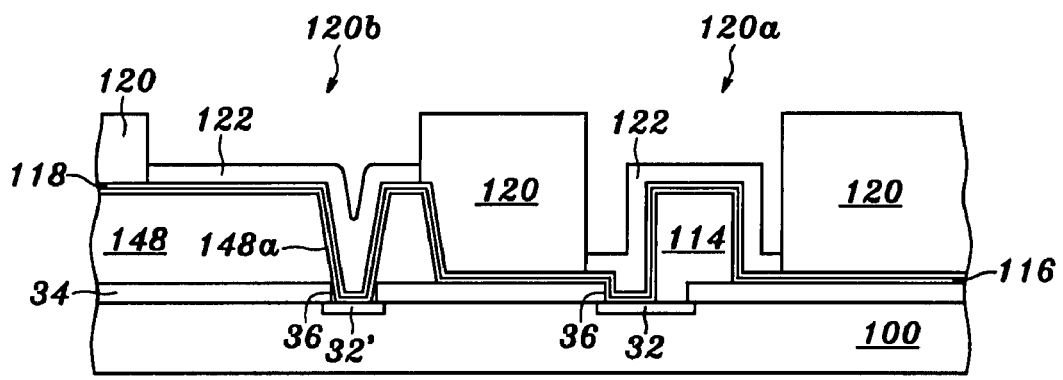

Referring to FIG. 10E, a metal layer 122 having a thickness of between 1 and 20 μm, and preferably of between 1.5 and 15 μm, can be electroplated and/or electroless plated over the seed layer 118 exposed by the openings 120a and 120b. The metal layer 122 may be a single layer of gold, copper, silver, palladium, platinum, rhodium, ruthenium, rhenium or nickel, or a composite layer made of the abovementioned metals. The specification of the metal layer 122 shown in FIG. 10E can be referred to as the metal layer 122 illustrated in FIG. 2F. The process of forming the metal layer 122 shown in FIG. 10E can be referred to as the process of forming the metal layer 122 illustrated in FIG. 2F.

Figure 10F:
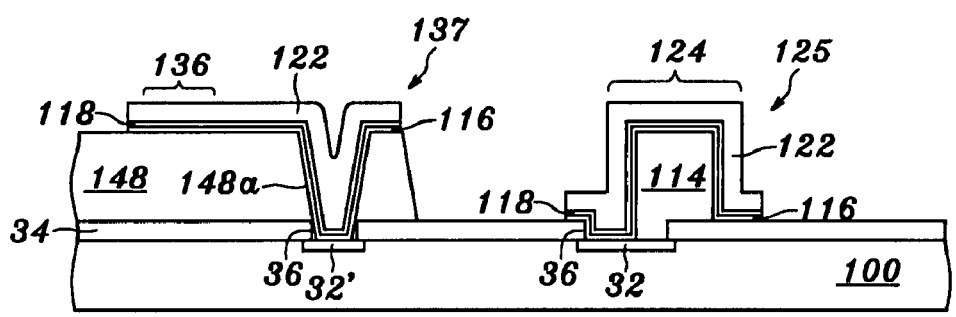

Referring to FIG. 10F, after the metal layer 122 is formed, most of the photoresist layer 120 can be removed using an organic solution with amide. However, some residuals from the photoresist layer 120 could remain on the metal layer 122 and on the seed layer 118. Thereafter, the residuals can be removed from the metal layer 122 and from the seed layer 118 with a plasma, such as $O_2$ plasma or plasma containing fluorine of below 200 PPM and oxygen.

Next, the seed layer 118 and the adhesion/barrier layer 116 not under the metal layer 122 are subsequently removed with a dry etching method or a wet etching method. The process of removing the seed layer 118 and the adhesion/barrier layer 116 not under the metal layer 122, as shown in FIG. 10F, can be referred to as the process of removing the seed layer 118 and the adhesion/barrier layer 116 not under the metal layer 122, as illustrated in FIG. 2G.

Thereby, at least two metal traces 125 and 137 are formed with the adhesion/barrier layer 116, the seed layer 118 and the metal layer 122, including a bonding pad 124 on the top surface of the polymer bump 114, and a bonding pad 136 on the polymer island 148, connected to the pad 32' through the opening 148a. The bonding pad 124 is used to be connected to a semiconductor chip via a flip chip (FC) mothed, and from a top perspective view, the position of the bonding pad 124 is different from that of the first region 152 of the pad 32, to which the metal trace 125 is connected. The bonding pad 136 is used to be connected to an external circuit via a wirebonding process, a solder bonding process or a tape-automated-bonding (TAB) process, for example. From a top perspective view, the position of the bonding pad 136 may be different from that of the pad 32'. Alternatively, from a top perspective view, the position of the bonding pad 136 may be the same as that of the pad 32'. The external circuit may be another semiconductor chip, a flexible substrate comprising a polymer layer (such as polyimide) having a thickness of between 30 and 200 µm and not comprising any polymer layer with glass fiber, a glass substrate, a ceramic substrate comprising a ceramic material as insulating layers between circuit layers, a silicon substrate, an organic substrate, a printed circuit board (PCB) or a ball grid array (BGA) substrate.

Figure 10G:
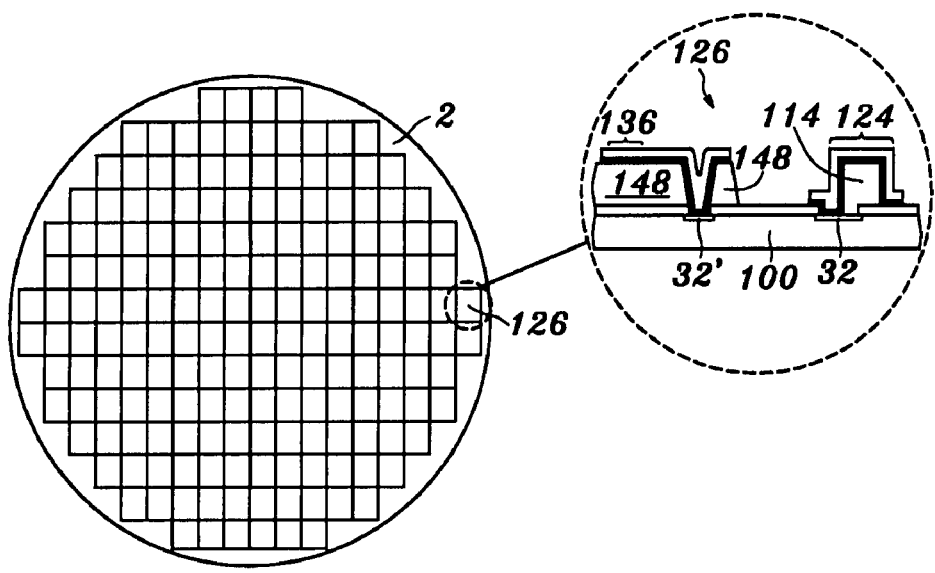

Referring to FIG. 10G, after the seed layer 118 and the adhesion/barrier layer 116 not under the metal layer 122 are removed, a semiconductor wafer formed with the polymer island 148, the polymer bump 114 and the metal layers 116, 118 and 122 can be diced into a plurality of individual semiconductor chips 126.

Figure 10H:
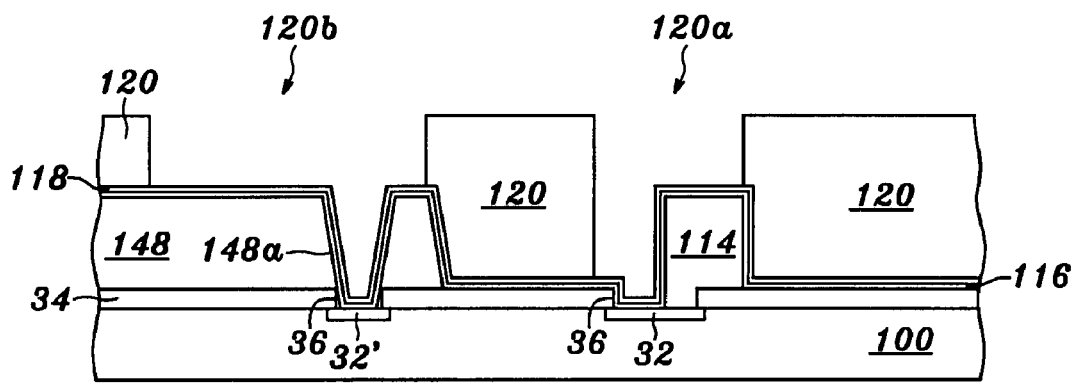
Figure 10I:
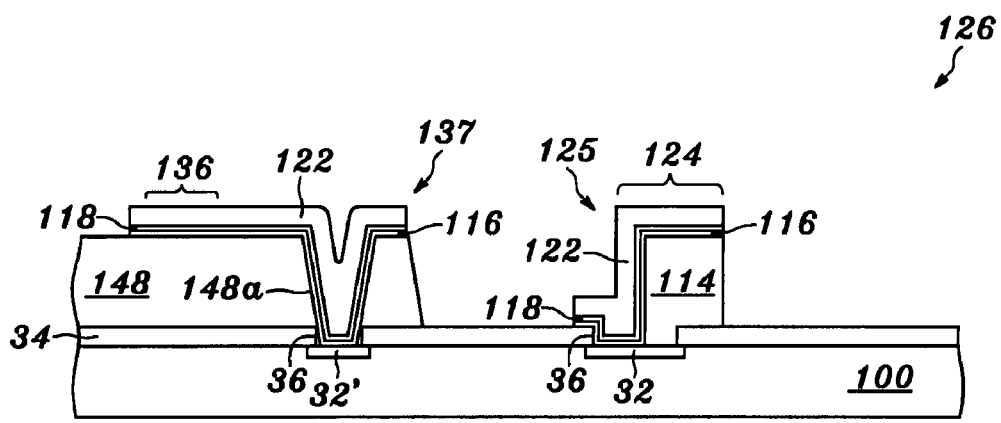

Alternatively, referring to FIG. 10H, after the seed layer 118 is formed, a photoresist layer 120 having a thickness of between 6 and 100 µm, and preferably of between 10 and 50 µm, is spin-on coated on the seed layer 118. Next, the photoresist layer 120 is patterned with exposure and development processes to form an opening 120a in the photoresist layer 120 exposing the seed layer 118 at the entire top surface and a portion of the sidewall(s) of the polymer bump 114, over the passivation layer 34 and over the first region 152 of the pad 32 exposed by the opening 36, and to form an opening 120b in the photoresist layer 120 exposing the seed layer 118 over the polymer island 148 and over the pad 32' exposed by the opening 148a. Next, the steps as referred to in FIGS. 10E-10F are performed in sequence. Next, referring to FIG. 10I, the semiconductor wafer can be diced into a plurality of individual semiconductor chips 126.

Figure 10J:
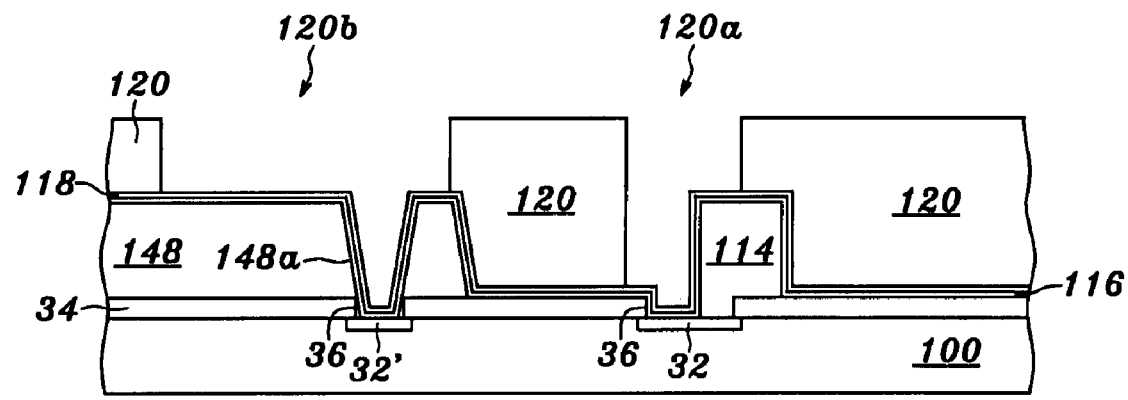
Figure 10K:
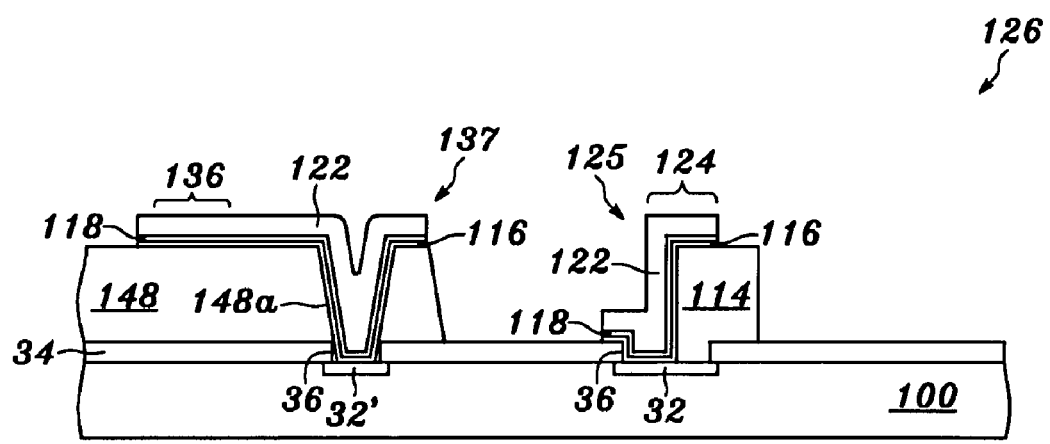

Alternatively, referring to FIG. 10J, after the seed layer 118 is formed, a photoresist layer 120 having a thickness of between 6 and 100 µm, and preferably of between 10 and 50 µm, is spin-on coated on the seed layer 118. Next, the photoresist layer 120 is patterned with exposure and development processes to form an opening 120a in the photoresist layer 120 exposing the seed layer 118 at a portion of the top surface and a portion of the sidewall(s) of the polymer bump 114, over the passivation layer 34 and over the first region 152 of the pad 32 exposed by the opening 36, and to form an opening 120b in the photoresist layer 120 exposing the seed layer 118 over the polymer island 148 and over the pad 32' exposed by the opening 148a. Next, the steps as referred to in FIGS. 10E-10F are performed in sequence. Next, referring to FIG. 10K, the semiconductor wafer can be diced into a plurality of individual semiconductor chips 126.

Aspect 1 of Embodiment 3

Figure 11A:
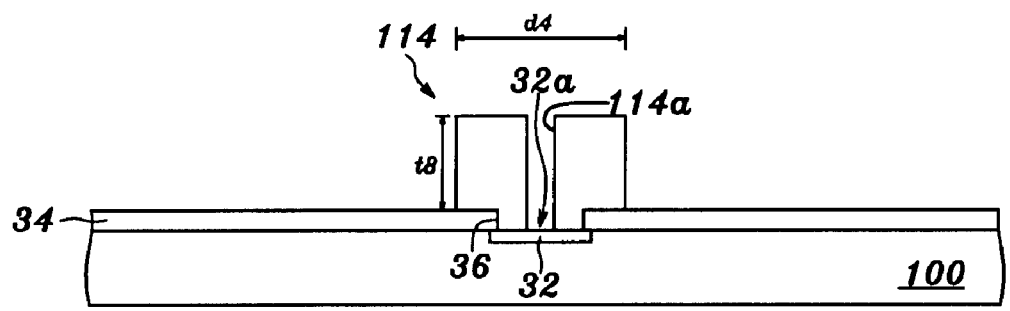
FIGS. 11A through 11K are sectional views showing a process according to another one embodiment of the present invention.

Referring to FIG. 11A, after the step shown in FIG. 2A is completed, the polymer layer 112 is patterned with exposure and development processes to form a polymer bump 114 on the pad 32 exposed by the opening 36 and on the passivation layer 34 close to the pad 32, an opening 114a in the polymer bump 114 exposeing a center region 32a of the pad 32. Alternatively, the polymer bump 114 may be formed by a lamination process or a screen-printing process.

The material of the polymer bump 114 may be polyimide (PI), benzocyclobutane (BCB), polyurethane, epoxy resin, epoxy-based material, a parylene-based polymer, a solder-mask material, an elastomer, silicone or a porous dielectric material. The polymer bump 114 has a thickness t8 of between 5 and 50 micrometers, and preferably of between 5 and 25 micrometers. In this embodiment, the polymer bump 114 may have a transverse dimension d4, from a top view, of between 5 and 60 micrometers, and preferably of between 10 and 40 micrometers. The shape of the polymer bump 114 from a top view may be a circle, and the diameter of the circle-shaped polymer bump 114 may be between 5 and 60 micrometers, and preferably between 10 and 40 micrometers. Alternatively, the shape of the polymer bump 114 from a top view may be a square, and the width of the square-shaped polymer bump 114 may be between 5 and 60 micrometers, and preferably between 10 and 40 micrometers. Alternatively, the shape of the polymer bump 114 from a top view may be a polygon, such as hexagon or octagon, and the polygon-shaped polymer bump 114 may have a width of between 5 and 60 micrometers, and preferably of between 10 and 40 micrometers. Alternatively, the shape of the polymer bump 114 from a top view may be a rectangle, and the rectangle-shaped polymer bump 114 may have a shorter width of between 5 and 60 micrometers, and preferably of between 10 and 40 micrometers. Further, there may be some of the active devices, such as p-channel MOS devices, n-channel MOS devices, CMOS (Complementary Metal Oxide Semiconductor) devices, BJT (Bipolar Junction Transistor) devices or BiCMOS (Bipolar CMOS) devices, under the polymer bump 114. Alternatively, there may be no active devices under the polymer bump 114.

For example, the polymer layer 112 can be formed by spin-on coating a negative-type photosensitive polyimide layer, containing ester-typer precursor, having a thickness of 10 and 100 µm on the passivation layer 34 and on the pad 32 exposed by the opening 36, then baking the spin-on coated polyimide layer, then exposing the baked polyimide layer using a 1X stepper or 1X contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form a polyimide bump on the pad 32 exposed by the opening 36 and on the passivation layer 34 close to the pad 32, an opening in the polyimide bump exposeing a center region 32a of the pad 32, then curing or heating the polyimide bump at a peak temperature of between 290 and 400° C. for a time of between 20 and 150 minutes in a nitrogen ambient or in an oxygen-free ambient, the cured polyimide bump 114 having a thickness t8 of between 5 and 50 μm, and then removing the residual polymeric material or other contaminants from the upper surface of the center region 32a of the pad 32 exposed by the opening 114a with an $O_2$ plasma or a plasma containing fluorine of below 200 PPM and oxygen. Thereby, the polymer bump 114 can be formed on the pad 32 exposed by the opening 36 and on the passivation layer 34 close to the pad 32, an opening 114a in the polymer bump 114 exposeing a center region 32a of the pad 32. Alternatively, the polyimide bump can be cured or heated at a temperature between 150 and 290° C., and preferably of between 260 and 280° C., for a time of between 20 and 150 minutes in a nitrogen ambient or in an oxygen-free ambient.

Figure 11B:
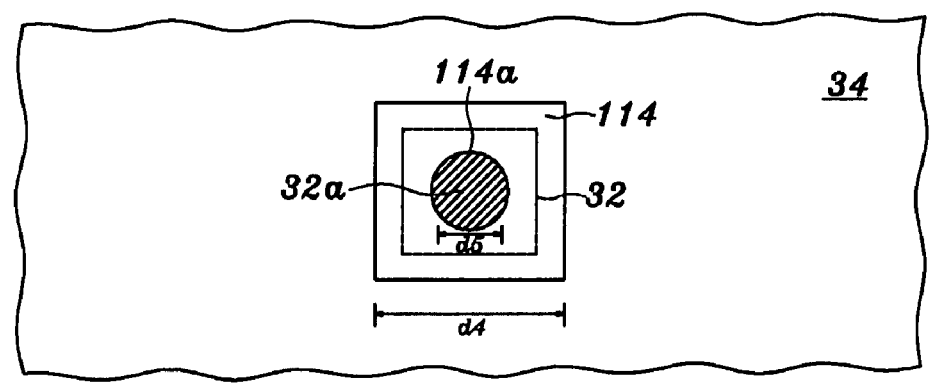

Referring to FIGS. 11A and 11B, from a top view, the ratio of the area of the center region 32a, exposed by the opening 148a, to that of the top surface of the pad 32 is between 0.1 and 0.9, or between 0.05 and 0.5. The opening 114a in the polymer bump 114 may have a transverse dimension d5, from a top view, of between 3 and 20 micrometers, and preferably of between 5 and 10 micrometers. For example, the shape of the opening 114a from a top view may be a circle, and the diameter of the circle-shaped opening 114a may be between 3 and 20 micrometers, and preferably of between 5 and 10 micrometers. Alternatively, the shape of the opening 114a from a top view may be a square, and the width of the square-shaped opening 114a may be between 3 and 20 micrometers, and preferably of between 5 and 10 micrometers. Alternatively, the shape of the opening 114a from a top view may be a polygon, such as hexagon or octagon, and the polygon-shaped opening 114a may have a width of between 3 and 20 micrometers, and preferably of between 5 and 10 micrometers. Alternatively, the shape of the opening 114a from a top view may be a rectangle, and the rectangle-shaped opening 114a may have a shorter width of between 3 and 20 micrometers, and preferably of between 5 and 10 micrometers.

Figure 11C:
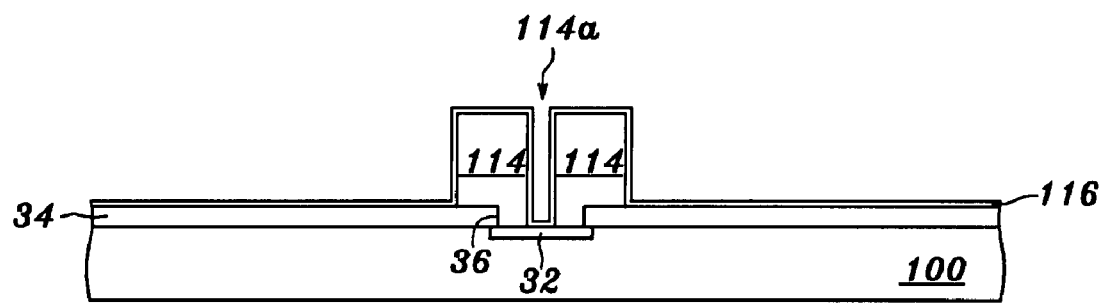

Referring to FIG. 11C, an adhesion/barrier layer 116 having a thickness of between 0.02 and 0.8 μm, and preferably of between 0.05 and 0.2 μm, can be sputtered on an entire top surface and entire sidewall(s) of the polymer bump 114, on the passivation layer 34, on the sidewall(s) of the opening 114a, and on the center region 32a of the pad 32 exposed by the opening 114a. The material of the adhesion/barrier layer 116 may be titanium, a titanium-tungsten alloy, titanium nitride, chromium, tantalum, tantalum nitride or a composite of the abovementioned materials. Alternatively, the adhesion/barrier layer 116 can be formed by an evaporation process, a chemical vapor deposition (CVD) process, a PVD (Physical Vapor Deposition) process or an electroless plating process.

For example, the adhesion/barrier layer 116 may be formed by sputtering a titanium layer with a thickness of between 0.02 and 0.8 μm, and preferably of between 0.05 and 0.2 μm, on the entire top surface and entire sidewall(s) of the polymer bump 114, on the passivation layer 34, on the sidewall(s) of the opening 114a, and on the center region 32a of the pad 32, principally made of aluminum, exposed by the opening 114a. Alternatively, the adhesion/barrier layer 116 may be formed by sputtering a titanium-tungsten-alloy layer with a thickness of between 0.02 and 0.8 μm, and preferably of between 0.05 and 0.2 μm, on the entire top surface and entire sidewall(s) of the polymer bump 114, on the passivation layer 34, on the sidewall(s) of the opening 114a, and on the center region 32a of the pad 32, principally made of aluminum, exposed by the opening 114a. Alternatively, the adhesion/barrier layer 116 may be formed by sputtering a titanium-nitride layer with a thickness of between 0.02 and 0.8 μm, and preferably of between 0.05 and 0.2 μm, on the entire top surface and entire sidewall(s) of the polymer bump 114, on the passivation layer 34, on the sidewall(s) of the opening 114a, and on the center region 32a of the pad 32, principally made of aluminum, exposed by the opening 114a. Alternatively, the adhesion/barrier layer 116 may be formed by sputtering a chromium layer with a thickness of between 0.02 and 0.8 μm, and preferably of between 0.05 and 0.2 μm, on the entire top surface and entire sidewall(s) of the polymer bump 114, on the passivation layer 34, on the sidewall(s) of the opening 114a, and on the center region 32a of the pad 32, principally made of aluminum, exposed by the opening 114a. Alternatively, the adhesion/barrier layer 116 may be formed by sputtering a tantalum-nitride layer with a thickness of between 0.02 and 0.8 μm, and preferably of between 0.05 and 0.2 μm, on the entire top surface and entire sidewall(s) of the polymer bump 114, on the passivation layer 34, on the sidewall(s) of the opening 114a, and on the center region 32a of the pad 32, principally made of aluminum, exposed by the opening 114a. Alternatively, the adhesion/barrier layer 116 may be formed by sputtering a tantalum layer with a thickness of between 0.02 and 0.8 μm, and preferably of between 0.05 and 0.2 μm, on the entire top surface and entire sidewall(s) of the polymer bump 114, on the passivation layer 34, on the sidewall(s) of the opening 114a, and on the center region 32a of the pad 32, principally made of aluminum, exposed by the opening 114a.

For example, the adhesion/barrier layer 116 may be formed by sputtering a titanium layer with a thickness of between 0.02 and 0.8 μm, and preferably of between 0.05 and 0.2 μm, on the entire top surface and entire sidewall(s) of the polymer bump 114, on the passivation layer 34, on the sidewall(s) of the opening 114a, and on the center region 32a of the pad 32, principally made of copper, exposed by the opening 114a. Alternatively, the adhesion/barrier layer 116 may be formed by sputtering a titanium-tungsten-alloy layer with a thickness of between 0.02 and 0.8 μm, and preferably of between 0.05 and 0.2 μm, on the entire top surface and entire sidewall(s) of the polymer bump 114, on the passivation layer 34, on the sidewall(s) of the opening 114a, and on the center region 32a of the pad 32, principally made of copper, exposed by the opening 114a. Alternatively, the adhesion/barrier layer 116 may be formed by sputtering a titanium-nitride layer with a thickness of between 0.02 and 0.8 μm, and preferably of between 0.05 and 0.2 μm, on the entire top surface and entire sidewall(s) of the polymer bump 114, on the passivation layer 34, on the sidewall(s) of the opening 114a, and on the center region 32a of the pad 32, principally made of copper, exposed by the opening 114a. Alternatively, the adhesion/barrier layer 116 may be formed by sputtering a chromium layer with a thickness of between 0.02 and 0.8 μm, and preferably of between 0.05 and 0.2 μm, on the entire top surface and entire sidewall(s) of the polymer bump 114, on the passivation layer 34, on the sidewall(s) of the opening 114a, and on the center region 32a of the pad 32, principally made of copper, exposed by the opening 114a. Alternatively, the adhesion/barrier layer 116 may be formed by sputtering a tantalum-nitride layer with a thickness of between 0.02 and 0.8 μm, and preferably of between 0.05 and 0.2 μm, on the entire top surface and entire sidewall(s) of the polymer bump 114, on the passivation layer 34, on the sidewall(s) of the opening 114a, and on the center region 32a of the pad 32, principally made of copper, exposed by the opening 114a. Alternatively, the adhesion/barrier layer 116 may be formed by sputtering a tantalum layer with a thickness of between 0.02 and 0.8 μm, and preferably of between 0.05 and 0.2 μm, on the entire top surface and entire sidewall(s) of the polymer bump 114, on the passivation layer 34, on the sidewall(s) of the opening 114a, and on the center region 32a of the pad 32, principally made of copper, exposed by the opening 114a.

Figure 11D:
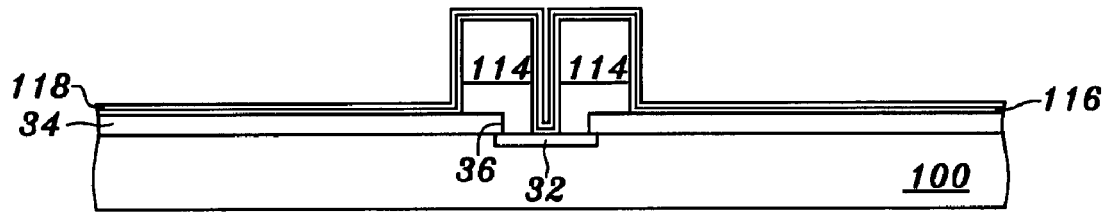

Referring to FIG. 11D, a seed layer 118 having a thickness of between 0.005 and 2 μm, and preferably of between 0.1 and 0.7 μm, can be sputtered on the adhesion/barrier layer 116. Alternatively, the seed layer 118 can be formed by a vapor deposition method, an electroless plating method or a PVD (Physical Vapor Deposition) method. The specification of the seed layer 118 shown in FIG. 11D can be referred to as the seed layer 118 illustrated in FIG. 2D. The process of forming the seed layer 118 shown in FIG. 11D can be referred to as the process of forming the seed layer 118 illustrated in FIG. 2D.

Figure 11E:
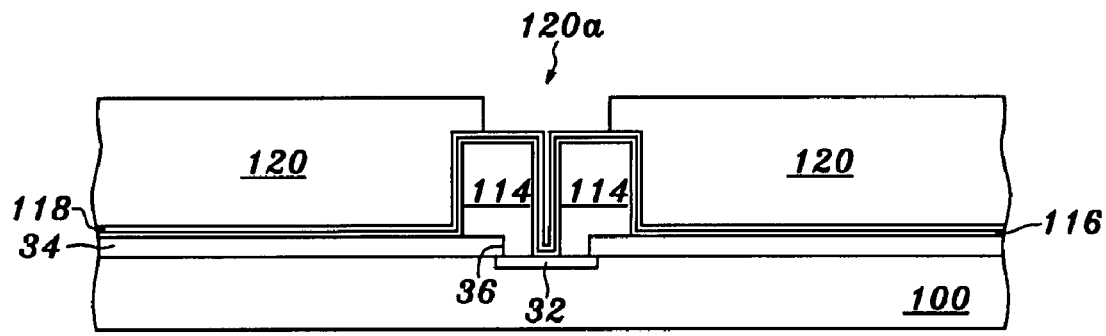

Referring to FIG. 11E, a photoresist layer 120, such as positive-type photoresist layer, having a thickness of between 6 and 100 μm, and preferably of between 10 and 50 μm, is spin-on coated on the seed layer 118. Next, the photoresist layer 120 is patterned with exposure and development processes to form an opening 120a in the photoresist layer 120 exposing the seed layer 118 over the top surface of the polymer bump 114, at the sidewall(s) of the opening 114a, and over the center region 32a of the pad 32. A 1X stepper or 1X contact aligner can be used to expose the photoresist layer 120 during the process of exposure.

For example, the photoresist layer 120 can be formed by spin-on coating a positive-type photosensitive polymer layer having a thickness of between 7 and 90 μm, and preferably of between 8 and 45 μm, on the seed layer 118, then exposing the photosensitive polymer layer using a 1X stepper or 1X contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants from the seed layer 118 with an $O_2$ plasma or a plasma containing fluorine of below 200 PPM and oxygen, such that the photoresist layer 120 can be patterned with an opening 120a in the photoresist layer 120 exposing the seed layer 118 over the top surface of the polymer bump 114, at the sidewall(s) of the opening 114a, and over the center region 32a of the pad 32.

Figure 11F:
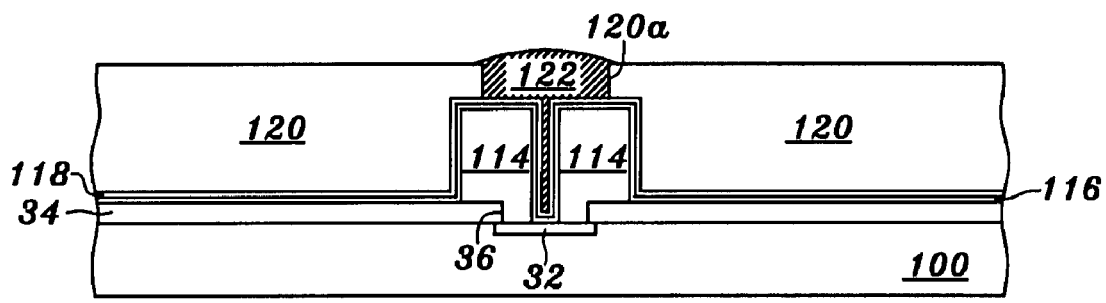

Referring to FIG. 11F, a metal layer 122 having a thickness of between 2.5 and 20 μm, and preferably of between 4 and 15 μm, can be electroplated and/or electroless plated over the seed layer 118 exposed by the opening 120a until the metal layer 122 is electroplated and/or electroless plated with a portion over the opening 120a and on a top surface of the photoresist layer 120 close to the opening 120a. Thereby, the metal layer 120 is shaped like a mushroom.

The metal layer 122 may be a single layer of gold, copper, silver, palladium, platinum, rhodium, ruthenium, rhenium or nickel, or a composite layer made of the abovementioned metals. For example, the metal layer 122 may be formed by electroplating a gold layer with a thickness of between 2.5 and 20 μm, and preferably of between 4 and 15 μm, on the seed layer 118, made of gold, exposed by the opening 120a until the gold layer is electroplated with a portion over the opening 120a and on a top surface of the photoresist layer 120 close to the opening 120a. Alternatively, the metal layer 122 may be formed by electroplating a copper layer with a thickness of between 2.5 and 20 μm, and preferably of between 4 and 15 μm, on the seed layer 118, made of copper, exposed by the opening 120a until the copper layer is electroplated with a portion over the opening 120a and on a top surface of the photoresist layer 120 close to the opening 120a. Alternatively, the metal layer 122 may be formed by electroplating a silver layer with a thickness of between 2.5 and 20 μm, and preferably of between 4 and 15 μm, on the seed layer 118, made of silver, exposed by the opening 120a until the silver layer is electroplated with a portion over the opening 120a and on a top surface of the photoresist layer 120 close to the opening 120a. Alternatively, the metal layer 122 may be formed by electroplating a palladium layer with a thickness of between 2.5 and 20 μm, and preferably of between 4 and 15 μm, on the seed layer 118, made of palladium, exposed by the opening 120a until the palladium layer is electroplated with a portion over the opening 120a and on a top surface of the photoresist layer 120 close to the opening 120a.

Figure 11G:
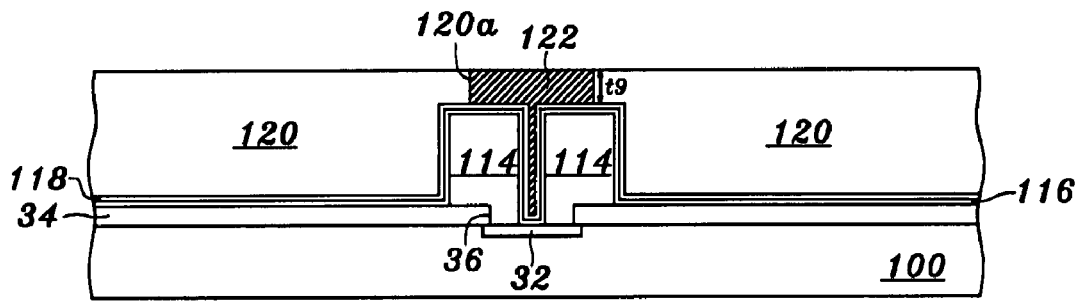

Referring to FIG. 11G, the metal layer 122 can be polished via a mechanical polishing process or a chemical mechanical polishing (CMP) process until the entire portion of the metal layer 122 outside the opening 120a in the photoresist layer 120 is removed, thereby a top surface of the metal layer 122 being plaraized. The top surface of the metal layer 122 may be dished with a lowest point in the center part thereof, lower than a top surface of the photoresist layer 120, having a difference in height form the top surface of the photoresist layer 120 within the range of 1,500 angstroms. The polished metal layer 122 has a thickness t9 of between 2 and 10 micrometers, and preferably of between 3.5 and 6.5 micrometers.

Figure 11H:
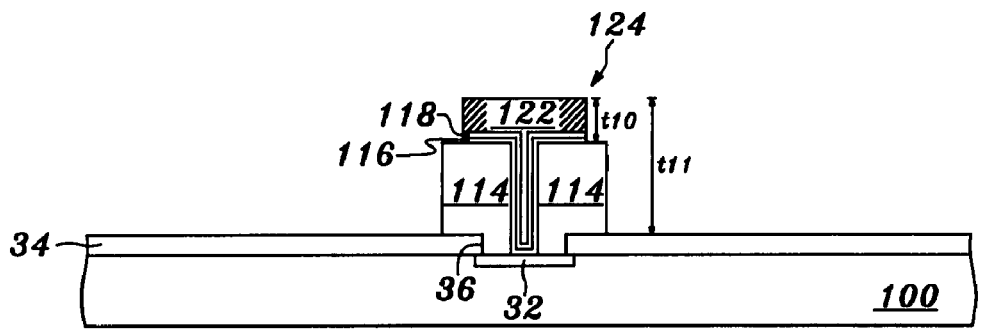

Referring to FIG. 11H, after the metal layer 122 is polished, most of the photoresist layer 120 can be removed using an organic solution with amide. However, some residuals from the photoresist layer 120 could remain on the metal layer 122 and on the seed layer 118. Thereafter, the residuals can be removed from the metal layer 122 and from the seed layer 118 with a plasma, such as $O_2$ plasma or plasma containing fluorine of below 200 PPM and oxygen.

Next, the seed layer 118 and the adhesion/barrier layer 116 not under the metal layer 122 are subsequently removed with a dry etching method or a wet etching method. The process of removing the seed layer 118 and the adhesion/barrier layer 116 not under the metal layer 122, as shown in FIG. 11H, can be referred to as the process of removing the seed layer 118 and the adhesion/barrier layer 116 not under the metal layer 122, as illustrated in FIG. 2G.

Thereby, a bonding pad 124, formed with the adhesion/barrier layer 116, the seed layer 118 and the polished metal layer 122, is on the top surface of the polymer bump 114, and the bonding pad 124 has a thickness t10 of between 2 and 10 micrometers, and preferably of between 3.5 and 6.5 micrometers. The thickness t11 of the bonding pad 124 and the polymer bump 114 is between 10 and 20 μm, and preferably of between 12 and 18 μm.

The bonding pad 124 is used to be connected to an external circuit, such as a semiconductor chip or wafer, a flexible substrate comprising a polymer layer (such as polyimide) having a thickness of between 30 and 200 μm and not comprising any polymer layer with glass fiber, a glass substrate, a ceramic substrate comprising a ceramic material as insulating layers between circuit layers, a silicon substrate or an organic substrate. Alternatively, the bonding pad 124 can be connected to a printed circuit board (PCB) via a TAB (tape automated bonding) method.

Figure 11I:
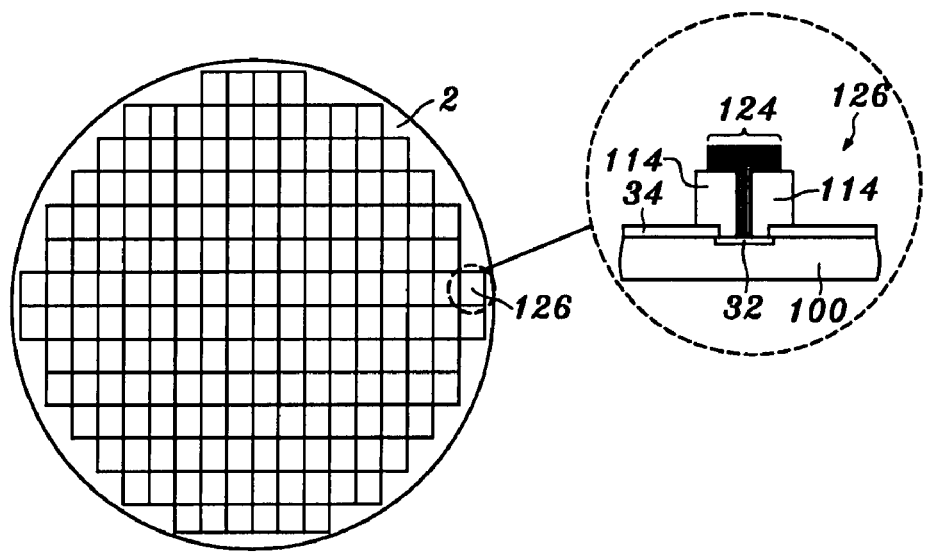

Referring to FIG. 11I, after the seed layer 118 and the adhesion/barrier layer 116 not under the metal layer 122 are removed, a semiconductor wafer formed with the polymer bump 114 and the bonding pad 124 can be diced into a plurality of individual semiconductor chips 126.

Figure 11J:
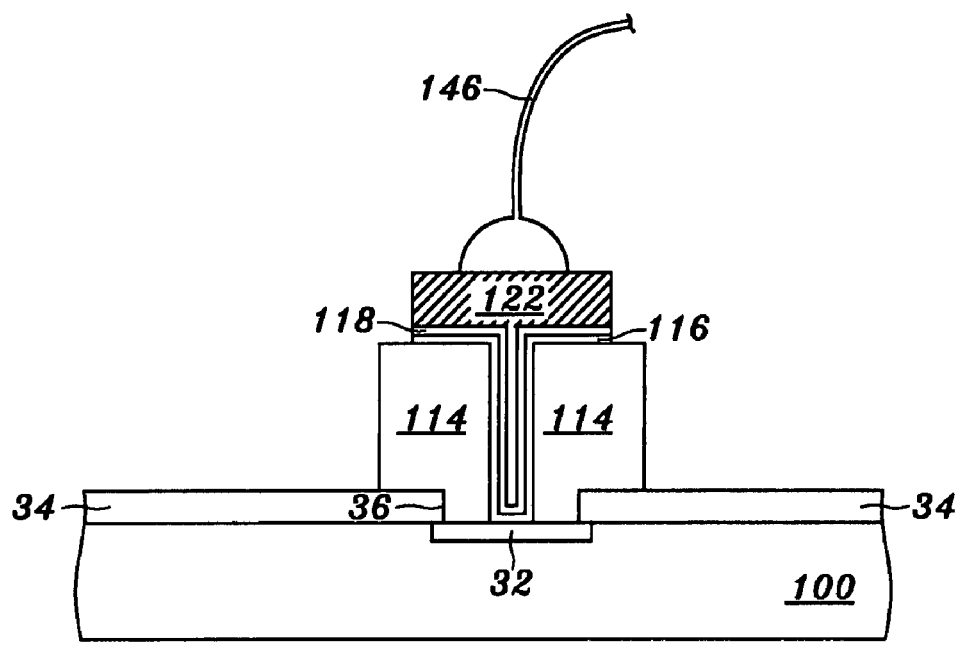

Referring to FIG. 11J, via a wirebonding process, a wire 146, such as gold wire, copper wire or aluminum wire, can be bonded to the bonding pad 124 on the polymer bump 114. For example, a gold wire is bonded to the gold layer of the bonding pad 124 on the polymer bump 114. Alternatively, a copper wire is bonded to the copper layer of the bonding pad 124 on the polymer bump 114.

Figure 11K:
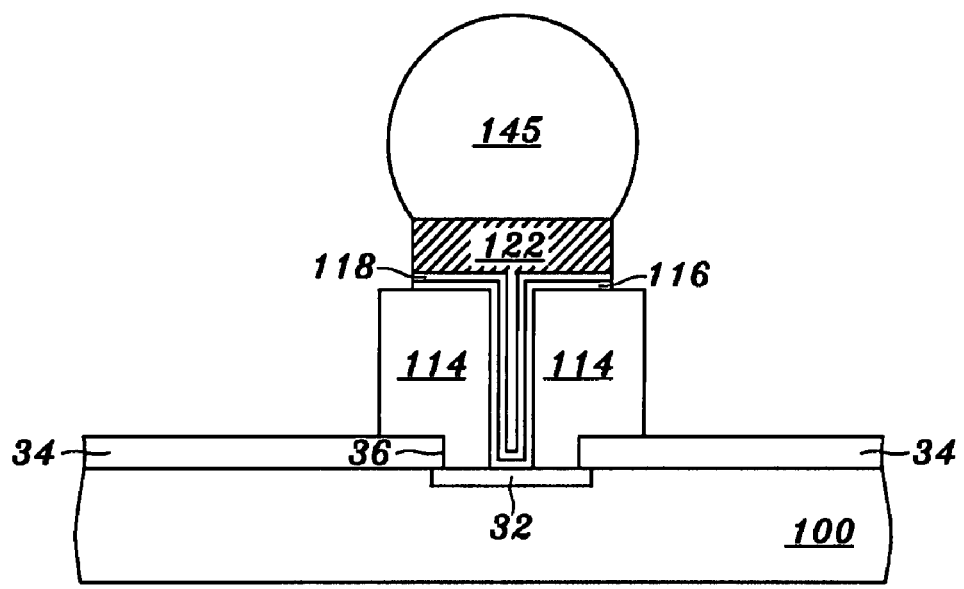

Referring to FIG. 11K, via a solder bonding process, a tin-containing ball or bump 145 can be planted onto the bonding pad 124 on the polymer bump 114. The material of the tin-containing ball or bump 145 may be a tin-lead alloy, a tin-silver alloy, a tin-silver-copper alloy or a lead-free alloy. Using a tin-lead solder for illustration, the weight ratio of tin to lead can be adjusted accordingly. A typical weight ratio of lead to tin is 90/10, 95/5, 97/3 or 37/63, etc. For example, the tin-containing ball or bump 145 is planted onto the gold layer of the bonding pad 124 on the polymer bump 114.

Aspect 2 of Embodiment 3

Figure 12A:
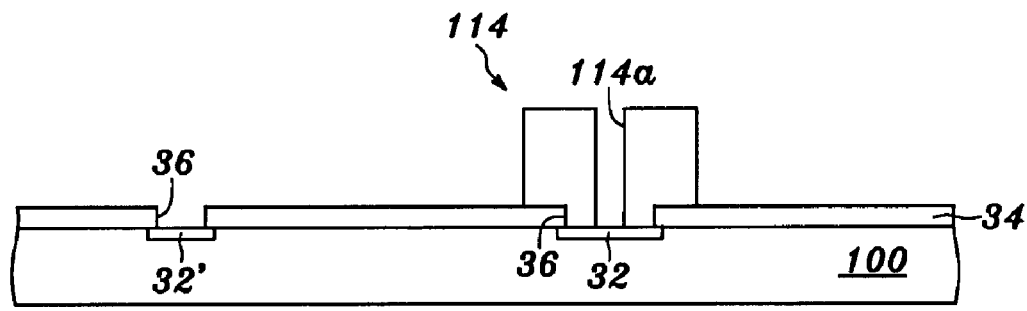
FIGS. 12A through 12I are sectional views showing a process according to another one embodiment of the present invention.
Figure 12B:
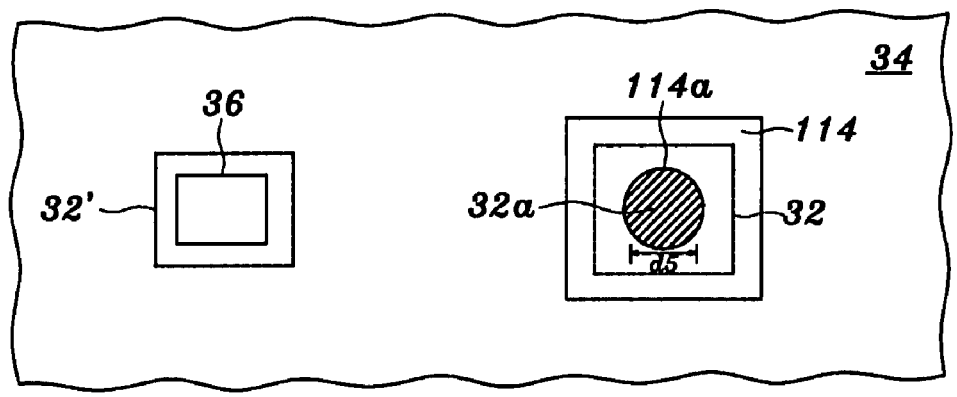

Referring to FIGS. 12A and 12B, after the step shown in FIG. 3A is completed, the polymer layer 112 is patterned with exposure and development processes to form a polymer bump 114 on the pad 32 exposed by the opening 36 and on the passivation layer 34 close to the pad 32, an opening 114a in the polymer bump 114 exposeing a center region 32a of the pad 32. The specification of the polymer bump 114 and the opening 114a shown in FIGS. 12A and 12B can be referred to as the polymer bump 114 and the opening 114a illustrated in FIGS. 11A and 11B. The process of forming the polymer bump 114 and the opening 114a shown in FIG. 12A can be referred to as the process of forming the polymer bump 114 and the opening 114a illustrated in FIG. 11A. Further, there may be some of the active devices, such as p-channel MOS devices, n-channel MOS devices, CMOS (Complementary Metal Oxide Semiconductor) devices, BJT (Bipolar Junction Transistor) devices or BiCMOS (Bipolar CMOS) devices, under the polymer bump 114. Alternatively, there may be no active devices under the polymer bump 114.

Figure 12C:
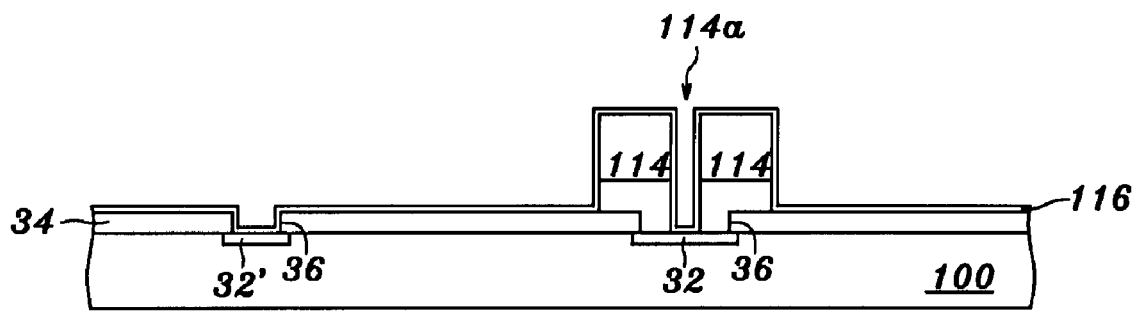

Referring to FIG. 12C, an adhesion/barrier layer 116 having a thickness of between 0.02 and 0.8 µm, and preferably of between 0.05 and 0.2 µm, can be sputtered on the passivation layer 34, on an entire top surface and entire sidewall(s) of the polymer bump 114, on the sidewall(s) of the opening 114a, on the center region 32a of the pad 32 exposed by the opening 114a, and on the pad 32' exposed by the opening 36, wherein the pads 32 and 32' can be aluminum pads or copper pads. The material of the adhesion/barrier layer 116 may be titanium, a titanium-tungsten alloy, titanium nitride, chromium, tantalum, tantalum nitride or a composite of the abovementioned materials. Alternatively, the adhesion/barrier layer 116 can be formed by an evaporation process, a chemical vapor deposition (CVD) process, a PVD (Physical Vapor Deposition) process or an electroless plating process.

For example, the adhesion/barrier layer 116 may be formed by sputtering a titanium layer with a thickness of between 0.02 and 0.8 µm, and preferably of between 0.05 and 0.2 µm, on the passivation layer 34, on the entire top surface and entire sidewall(s) of the polymer bump 114, on the sidewall(s) of the opening 114a, on the center region 32a of the pad 32 exposed by the opening 114a, and on the pad 32' exposed by the opening 36, wherein the pads 32 and 32' are principally made of aluminum. Alternatively, the adhesion/barrier layer 116 may be formed by sputtering a titanium-tungsten-alloy layer with a thickness of between 0.02 and 0.8 µm, and preferably of between 0.05 and 0.2 µm, on the passivation layer 34, on the entire top surface and entire sidewall(s) of the polymer bump 114, on the sidewall(s) of the opening 114a, on the center region 32a of the pad 32 exposed by the opening 114a, and on the pad 32' exposed by the opening 36, wherein the pads 32 and 32' are principally made of aluminum. Alternatively, the adhesion/barrier layer 116 may be formed by sputtering a titanium-nitride layer with a thickness of between 0.02 and 0.8 µm, and preferably of between 0.05 and 0.2 µm, on the passivation layer 34, on the entire top surface and entire sidewall(s) of the polymer bump 114, on the sidewall(s) of the opening 114a, on the center region 32a of the pad 32 exposed by the opening 114a, and on the pad 32' exposed by the opening 36, wherein the pads 32 and 32' are principally made of aluminum. Alternatively, the adhesion/barrier layer 116 may be formed by sputtering a chromium layer with a thickness of between 0.02 and 0.8 µm, and preferably of between 0.05 and 0.2 µm, on the passivation layer 34, on the entire top surface and entire sidewall(s) of the polymer bump 114, on the sidewall(s) of the opening 114a, on the center region 32a of the pad 32 exposed by the opening 114a, and on the pad 32' exposed by the opening 36, wherein the pads 32 and 32' are principally made of aluminum. Alternatively, the adhesion/barrier layer 116 may be formed by sputtering a tantalum-nitride layer with a thickness of between 0.02 and 0.8 µm, and preferably of between 0.05 and 0.2 µm, on the passivation layer 34, on the entire top surface and entire sidewall(s) of the polymer bump 114, on the sidewall(s) of the opening 114a, on the center region 32a of the pad 32 exposed by the opening 114a, and on the pad 32' exposed by the opening 36, wherein the pads 32 and 32' are principally made of aluminum. Alternatively, the adhesion/barrier layer 116 may be formed by sputtering a tantalum layer with a thickness of between 0.02 and 0.8 µm, and preferably of between 0.05 and 0.2 µm, on the passivation layer 34, on the entire top surface and entire sidewall(s) of the polymer bump 114, on the sidewall(s) of the opening 114a, on the center region 32a of the pad 32 exposed by the opening 114a, and on the pad 32' exposed by the opening 36, wherein the pads 32 and 32' are principally made of aluminum.

For example, the adhesion/barrier layer 116 may be formed by sputtering a titanium layer with a thickness of between 0.02 and 0.8 µm, and preferably of between 0.05 and 0.2 µm, on the passivation layer 34, on the entire top surface and entire sidewall(s) of the polymer bump 114, on the sidewall(s) of the opening 114a, on the center region 32a of the pad 32 exposed by the opening 114a, and on the pad 32' exposed by the opening 36, wherein the pads 32 and 32' are principally made of copper. Alternatively, the adhesion/barrier layer 116 may be formed by sputtering a titanium-tungsten-alloy layer with a thickness of between 0.02 and 0.8 µm, and preferably of between 0.05 and 0.2 µm, on the passivation layer 34, on the entire top surface and entire sidewall(s) of the polymer bump 114, on the sidewall(s) of the opening 114a, on the center region 32a of the pad 32 exposed by the opening 114a, and on the pad 32' exposed by the opening 36, wherein the pads 32 and 32' are principally made of copper. Alternatively, the adhesion/barrier layer 116 may be formed by sputtering a titanium-nitride layer with a thickness of between 0.02 and 0.8 µm, and preferably of between 0.05 and 0.2 µm, on the passivation layer 34, on the entire top surface and entire sidewall(s) of the polymer bump 114, on the sidewall(s) of the opening 114a, on the center region 32a of the pad 32 exposed by the opening 114a, and on the pad 32' exposed by the opening 36, wherein the pads 32 and 32' are principally made of copper. Alternatively, the adhesion/barrier layer 116 may be formed by sputtering a chromium layer with a thickness of between 0.02 and 0.8 μm, and preferably of between 0.05 and 0.2 μm, on the passivation layer 34, on the entire top surface and entire sidewall(s) of the polymer bump 114, on the sidewall(s) of the opening 114a, on the center region 32a of the pad 32 exposed by the opening 114a, and on the pad 32' exposed by the opening 36, wherein the pads 32 and 32' are principally made of copper. Alternatively, the adhesion/barrier layer 116 may be formed by sputtering a tantalum-nitride layer with a thickness of between 0.02 and 0.8 μm, and preferably of between 0.05 and 0.2 μm, on the passivation layer 34, on the entire top surface and entire sidewall(s) of the polymer bump 114, on the sidewall(s) of the opening 114a, on the center region 32a of the pad 32 exposed by the opening 114a, and on the pad 32' exposed by the opening 36, wherein the pads 32 and 32' are principally made of copper. Alternatively, the adhesion/barrier layer 116 may be formed by sputtering a tantalum layer with a thickness of between 0.02 and 0.8 μm, and preferably of between 0.05 and 0.2 μm, on the passivation layer 34, on the entire top surface and entire sidewall(s) of the polymer bump 114, on the sidewall(s) of the opening 114a, on the center region 32a of the pad 32 exposed by the opening 114a, and on the pad 32' exposed by the opening 36, wherein the pads 32 and 32' are principally made of copper.

Figure 12D:
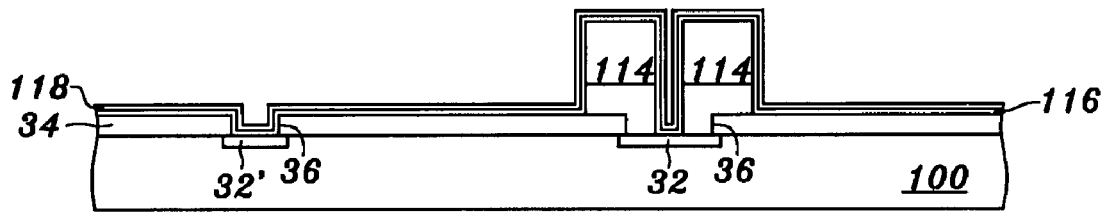

Referring to FIG. 12D, a seed layer 118 having a thickness of between 0.005 and 2 μm, and preferably of between 0.1 and 0.7 μm, can be sputtered on the adhesion/barrier layer 116. Alternatively, the seed layer 118 can be formed by a vapor deposition method, an electroless plating method or a PVD (Physical Vapor Deposition) method. The specification of the seed layer 118 shown in FIG. 12D can be referred to as the seed layer 118 illustrated in FIG. 2D. The process of forming the seed layer 118 shown in FIG. 12D can be referred to as the process of forming the seed layer 118 illustrated in FIG. 2D.

Figure 12E:
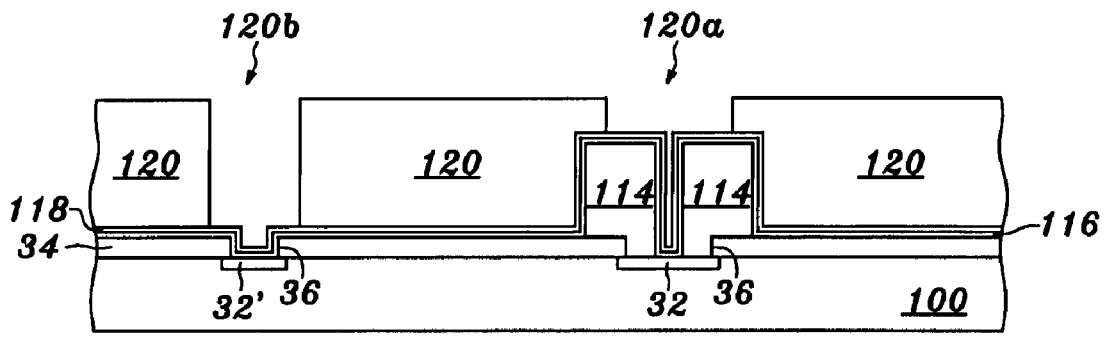

Referring to FIG. 12E, a photoresist layer 120, such as positive-type photoresist layer, having a thickness of between 6 and 100 μm, and preferably of between 10 and 50 μm, is spin-on coated on the seed layer 118. Next, the photoresist layer 120 is patterned with exposure and development processes to form an opening 120a in the photoresist layer 120 exposing the seed layer 118 over the top surface of the polymer bump 114, at the sidewall(s) of the opening 114a, and over the center region 32a of the pad 32, and to form an opening 120b in the photoresist layer 120 exposing the seed layer 118 over the pad 32' and over the passivation layer 34 close to the pad 32'. A 1X stepper or 1X contact aligner can be used to expose the photoresist layer 120 during the process of exposure.

For example, the photoresist layer 120 can be formed by spin-on coating a positive-type photosensitive polymer layer having a thickness of between 7 and 90 μm, and preferably of between 8 and 45 μm, on the seed layer 118, then exposing the photosensitive polymer layer using a 1X stepper or 1X contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants form the seed layer 118 with an $O_2$ plasma or a plasma containing fluorine of below 200 PPM and oxygen, such that the photoresist layer 120 can be patterned with an opening 120a in the photoresist layer 120 exposing the seed layer 118 over the top surface of the polymer bump 114, at the sidewall(s) of the opening 114a, and over the center region 32a of the pad 32, and with an opening 120b in the photoresist layer 120 exposing the seed layer 118 over the pad 32' and over the passivation layer 34 close to the pad 32'.

Figure 12F:
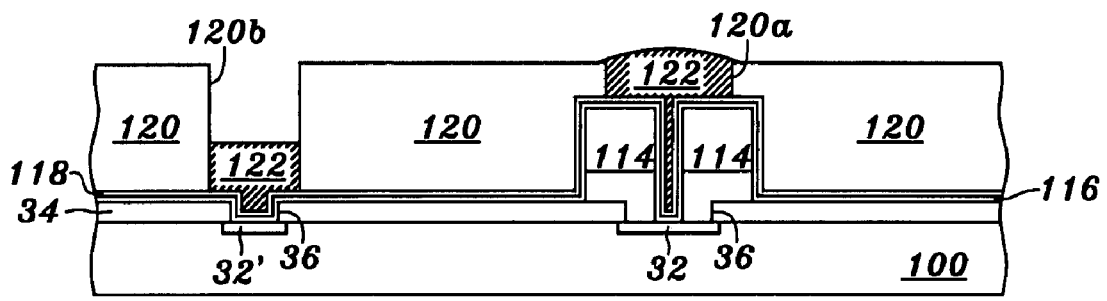

Referring to FIG. 12F, a metal layer 122 having a thickness of between 1 and 20 μm, and preferably of between 1.5 and 15 μm, can be electroplated and/or electroless plated over the seed layer 118 exposed by the openings 120a and 120b until the metal layer 122 is electroplated and/or electroless plated with a portion over the opening 120a and on a top surface of the photoresist layer 120 close to the opening 120a. Thereby, the metal layer 120, formed over the polymer bump 114, is shaped like a mushroom.

The metal layer 122 may be a single layer of gold, copper, silver, palladium, platinum, rhodium, ruthenium, rhenium or nickel, or a composite layer made of the abovementioned metals. For example, the metal layer 122 may be formed by electroplating a gold layer with a thickness of between 2.5 and 20 μm, and preferably of between 4 and 15 μm, on the seed layer 118, made of gold, exposed by the openings 120a and 120b until the gold layer is electroplated with a portion over the opening 120a and on a top surface of the photoresist layer 120 close to the opening 120a. Alternatively, the metal layer 122 may be formed by electroplating a copper layer with a thickness of between 2.5 and 20 μm, and preferably of between 4 and 15 μm, on the seed layer 118, made of copper, exposed by the openings 120a and 120b until the copper layer is electroplated with a portion over the opening 120a and on a top surface of the photoresist layer 120 close to the opening 120a. Alternatively, the metal layer 122 may be formed by electroplating a silver layer with a thickness of between 2.5 and 20 μm, and preferably of between 4 and 15 μm, on the seed layer 118, made of silver, exposed by the openings 120a and 120b until the silver layer is electroplated with a portion over the opening 120a and on a top surface of the photoresist layer 120 close to the opening 120a. Alternatively, the metal layer 122 may be formed by electroplating a palladium layer with a thickness of between 2.5 and 20 μm, and preferably of between 4 and 15 μm, on the seed layer 118, made of palladium, exposed by the openings 120a and 120b until the palladium layer is electroplated with a portion over the opening 120a and on a top surface of the photoresist layer 120 close to the opening 120a.

Figure 12G:
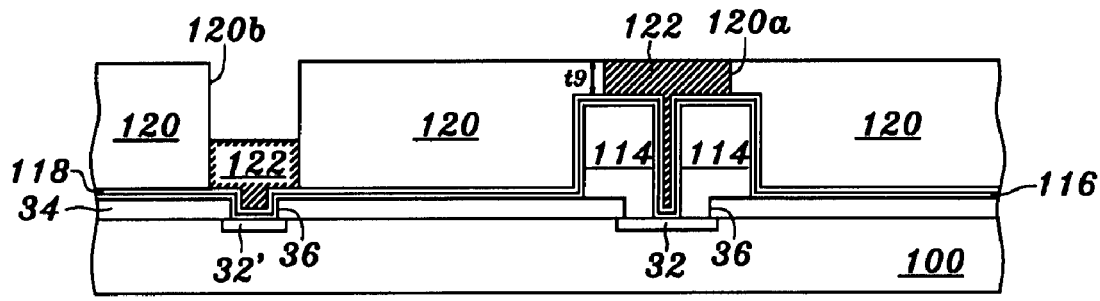

Referring to FIG. 12G, the metal layer 122, formed over the polymer bump 114, can be polished via a mechanical polishing process or a chemical mechanical polishing (CMP) process until the entire portion of the metal layer 122 outside the opening 120a in the photoresist layer 120 is removed, thereby a top surface of the metal layer 122 being plaraized. The polished metal layer 122 has a thickness t9 of between 2 and 10 micrometers, and preferably of between 3.5 and 6.5 micrometers.

Figure 12H:
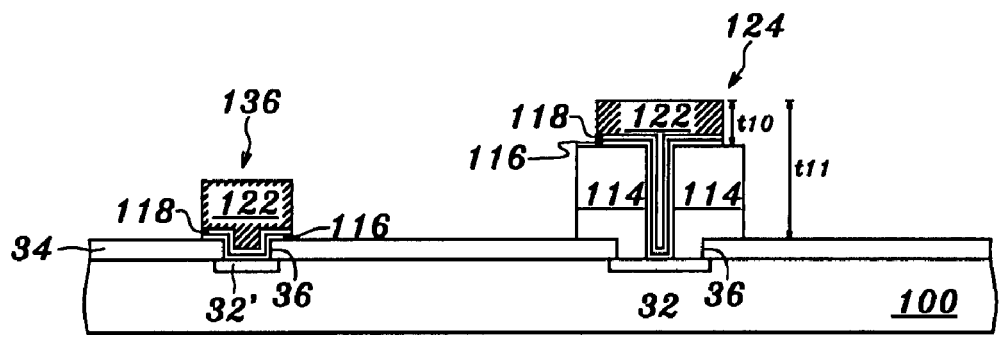

Referring to FIG. 12H, after the metal layer 122 is polished, most of the photoresist layer 120 can be removed using an organic solution with amide. However, some residuals from the photoresist layer 120 could remain on the metal layer 122 and on the seed layer 118. Thereafter, the residuals can be removed from the metal layer 122 and from the seed layer 118 with a plasma, such as $O_2$ plasma or plasma containing fluorine of below 200 PPM and oxygen.

Next, the seed layer 118 and the adhesion/barrier layer 116 not under the metal layer 122 are subsequently removed with a dry etching method or a wet etching method. The process of removing the seed layer 118 and the adhesion/barrier layer 116 not under the metal layer 122, as shown in FIG. 12H, can be referred to as the process of removing the seed layer 118 and the adhesion/barrier layer 116 not under the metal layer 122, as illustrated in FIG. 2G.

Thereby, a bonding pad 124, formed with the adhesion/barrier layer 116, the seed layer 118 and the polished metal layer 122, is on the top surface of the polymer bump 114, and the bonding pad 124 has a thickness t10 of between 2 and 10 micrometers, and preferably of between 3.5 and 6.5 micrometers. The bonding pad 124 is used to be connected to a semiconductor chip via a flip chip (FC) mothed. The thickness t11 of the bonding pad 124 and the polymer bump 114 is between 10 and 20 μm, and preferably of between 12 and 18 μm.

A bonding pad 136, formed with the adhesion/barrier layer 116, the seed layer 118 and the metal layer 122, is on the pad 32'. The bonding pad 136 is used to be connected to an external circuit via a wirebonding process, a solder bonding process or a tape-automated-bonding (TAB) process, for example. The external circuit may be another semiconductor chip, a flexible substrate comprising a polymer layer (such as polyimide) having a thickness of between 30 and 200 μm and not comprising any polymer layer with glass fiber, a glass substrate, a ceramic substrate comprising a ceramic material as insulating layers between circuit layers, a silicon substrate, an organic substrate, a printed circuit board (PCB) or a ball grid array (BGA) substrate.

Figure 12I:
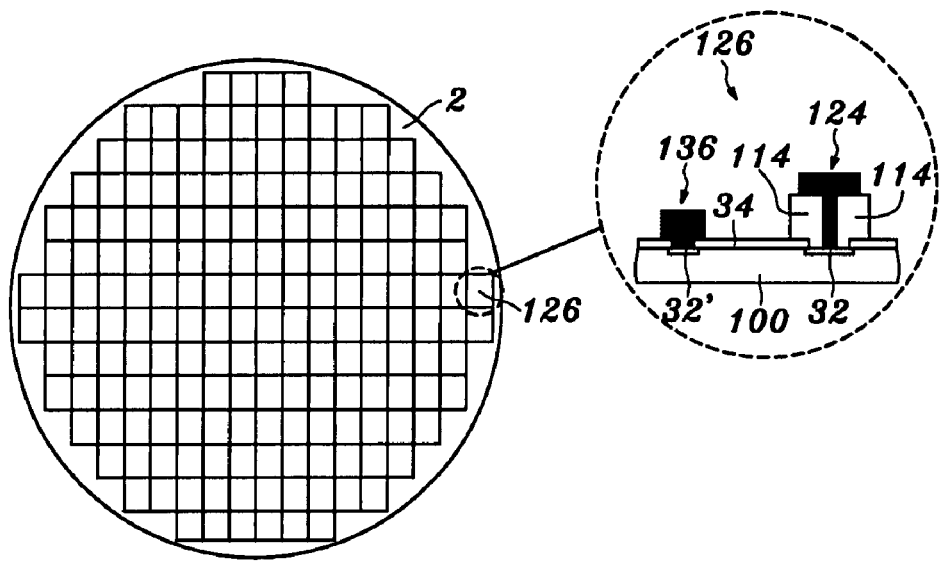

Referring to FIG. 12I, after the seed layer 118 and the adhesion/barrier layer 116 not under the metal layer 122 are removed, a semiconductor wafer formed with the polymer bump 114 and the metal layers 116, 118 and 122 can be diced into a plurality of individual semiconductor chips 126.

Aspect 3 of Embodiment 3

Figure 13A:
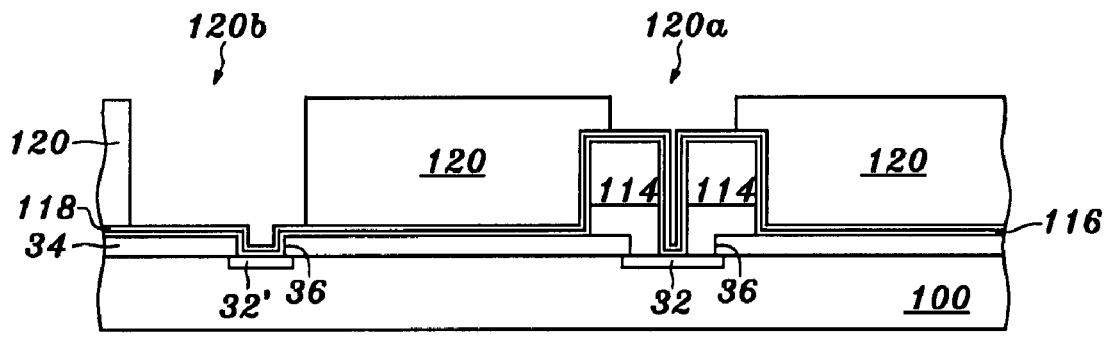
FIGS. 13A through 13F are sectional views showing a process according to another one embodiment of the present invention.

Referring to FIG. 13A, after the step shown in FIG. 12D is completed, a photoresist layer 120, such as positive-type photoresist layer, having a thickness of between 6 and 100 μm, and preferably of between 10 and 50 μm, is spin-on coated on the seed layer 118. Next, the photoresist layer 120 is patterned with exposure and development processes to form an opening 120a in the photoresist layer 120 exposing the seed layer 118 over the top surface of the polymer bump 114, at the sidewall(s) of the opening 114a, and over the center region 32a of the pad 32, and to form an opening 120b in the photoresist layer 120 exposing the seed layer 118 over the passivation layer 34 and over the pad 32'. A 1X stepper or 1X contact aligner can be used to expose the photoresist layer 120 during the process of exposure. The process of forming the photoresist layer 120 and the openings 120a and 120b, as shown in FIG. 13A, can be referred to as the process of forming the photoresist layer 120 and the openings 120a and 120b, as illustrated in FIG. 12E.

Figure 13B:
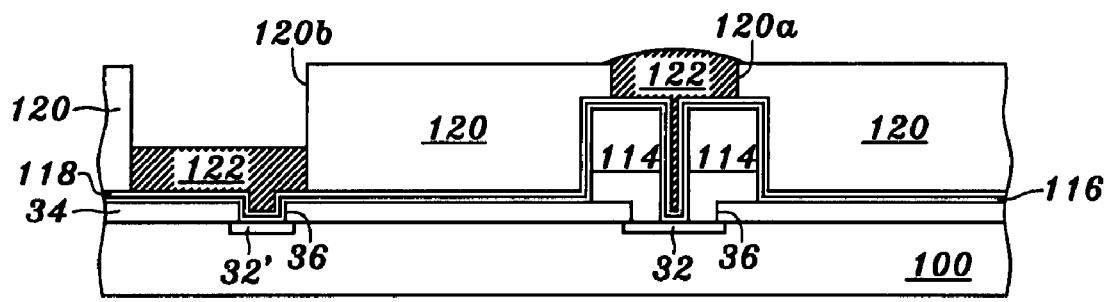

Referring to FIG. 13B, a metal layer 122 having a thickness of between 1 and 20 μm, and preferably of between 1.5 and 15 μm, can be electroplated and/or electroless plated over the seed layer 118 exposed by the openings 120a and 120b until the metal layer 122 is electroplated and/or electroless plated with a portion over the opening 120a and on a top surface of the photoresist layer 120 close to the opening 120a. Thereby, the metal layer 120, formed over the polymer bump 114, is shaped like a mushroom. The specification of the metal layer 122 shown in FIG. 13B can be referred to as the metal layer 122 illustrated in FIG. 12F. The process of forming the metal layer 122 shown in FIG. 13B can be referred to as the process of forming the metal layer 122 illustrated in FIG. 12F.

Figure 13C:
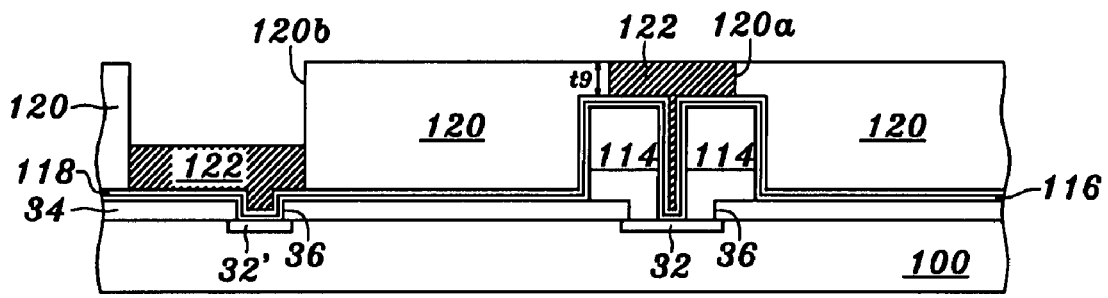

Referring to FIG. 13C, the metal layer 122, formed over the polymer bump 114, can be polished via a mechanical polishing process or a chemical mechanical polishing (CMP) process until the entire portion of the metal layer 122 outside the opening 120a in the photoresist layer 120 is removed, thereby a top surface of the metal layer 122 being plaraized. The polished metal layer 122 has a thickness t9 of between 2 and 10 micrometers, and preferably of between 3.5 and 6.5 micrometers.

Figure 13D:
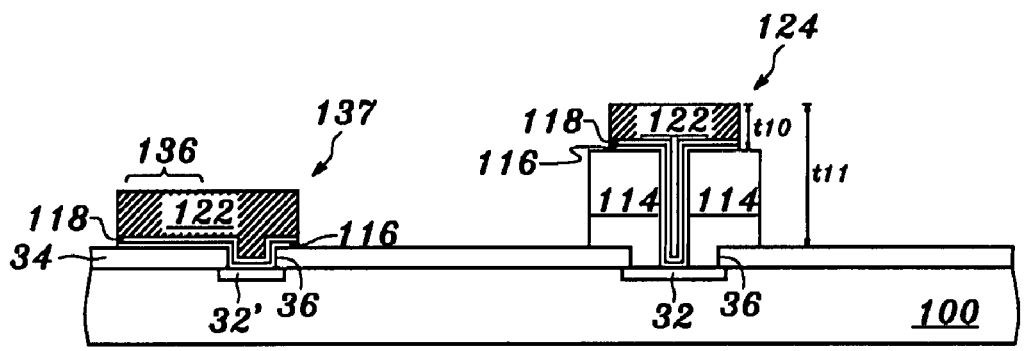

Referring to FIG. 13D, after the metal layer 122 is polished, most of the photoresist layer 120 can be removed using an organic solution with amide. However, some residuals from the photoresist layer 120 could remain on the metal layer 122 and on the seed layer 118. Thereafter, the residuals can be removed from the metal layer 122 and from the seed layer 118 with a plasma, such as $O_2$ plasma or plasma containing fluorine of below 200 PPM and oxygen.

Next, the seed layer 118 and the adhesion/barrier layer 116 not under the metal layer 122 are subsequently removed with a dry etching method or a wet etching method. The process of removing the seed layer 118 and the adhesion/barrier layer 116 not under the metal layer 122, as shown in FIG. 13D, can be referred to as the process of removing the seed layer 118 and the adhesion/barrier layer 116 not under the metal layer 122, as illustrated in FIG. 2G.

Figure 13E:
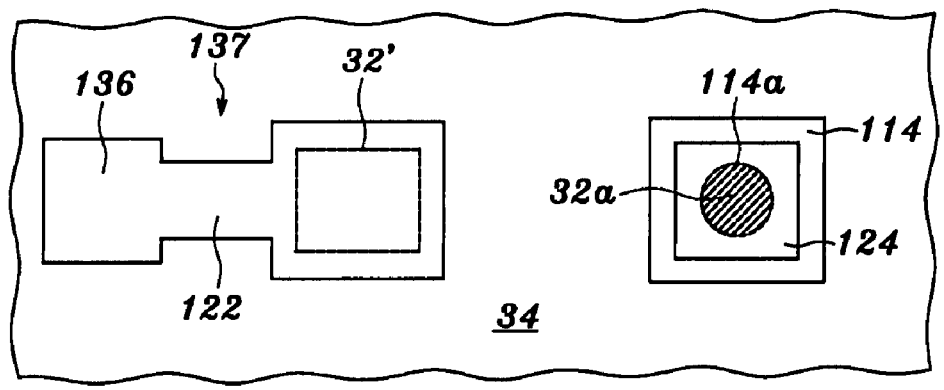

Thereby, referring to FIGS. 13D and 13E, a bonding pad 124, formed with the adhesion/barrier layer 116, the seed layer 118 and the polished metal layer 122, is on the top surface of the polymer bump 114, and the bonding pad 124 has a thickness t10 of between 2 and 10 micrometers, and preferably of between 3.5 and 6.5 micrometers. The bonding pad 124 is used to be connected to a semiconductor chip via a flip chip (FC) mothed. The thickness t11 of the bonding pad 124 and the polymer bump 114 is between 10 and 20 μm, and preferably of between 12 and 18 μm.

A metal trace 137, formed with the adhesion/barrier layer 116, the seed layer 118 and the metal layer 122, includes a bonding pad 136 on the passivation layer 34 The bonding pad 136 is used to be connected to an external circuit via a wirebonding process, a solder bonding process or a tape-automated-bonding (TAB) process, for example. The external circuit may be another semiconductor chip, a flexible substrate comprising a polymer layer (such as polyimide) having a thickness of between 30 and 200 μm and not comprising any polymer layer with glass fiber, a glass substrate, a ceramic substrate comprising a ceramic material as insulating layers between circuit layers, a silicon substrate, an organic substrate, a printed circuit board (PCB) or a ball grid array (BGA) substrate.

Figure 13F:
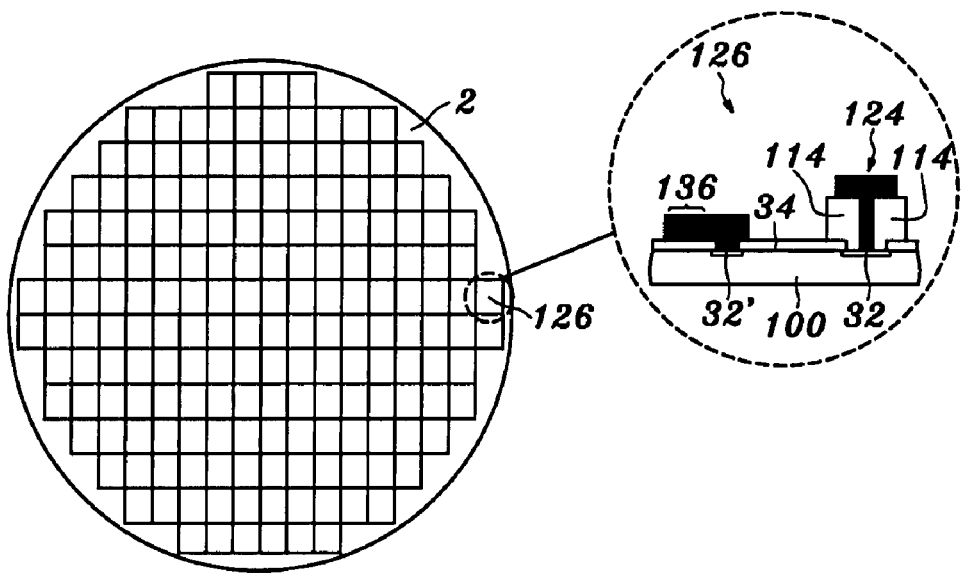

Referring to FIG. 13F, after the seed layer 118 and the adhesion/barrier layer 116 not under the metal layer 122 are removed, a semiconductor wafer formed with the polymer bump 114 and the metal layers 116, 118 and 122 can be diced into a plurality of individual semiconductor chips 126.

Embodiment 4

The bonding pad 124 on the polymer bump 114 shown in FIG. 2H can be used to be connected to a glass substrate or to a flexible film, and various methods for connecting the bonding pad 124 on the polymer bump 114 to the glass substrate or to the flexible film are described as below.

Figure 14A:
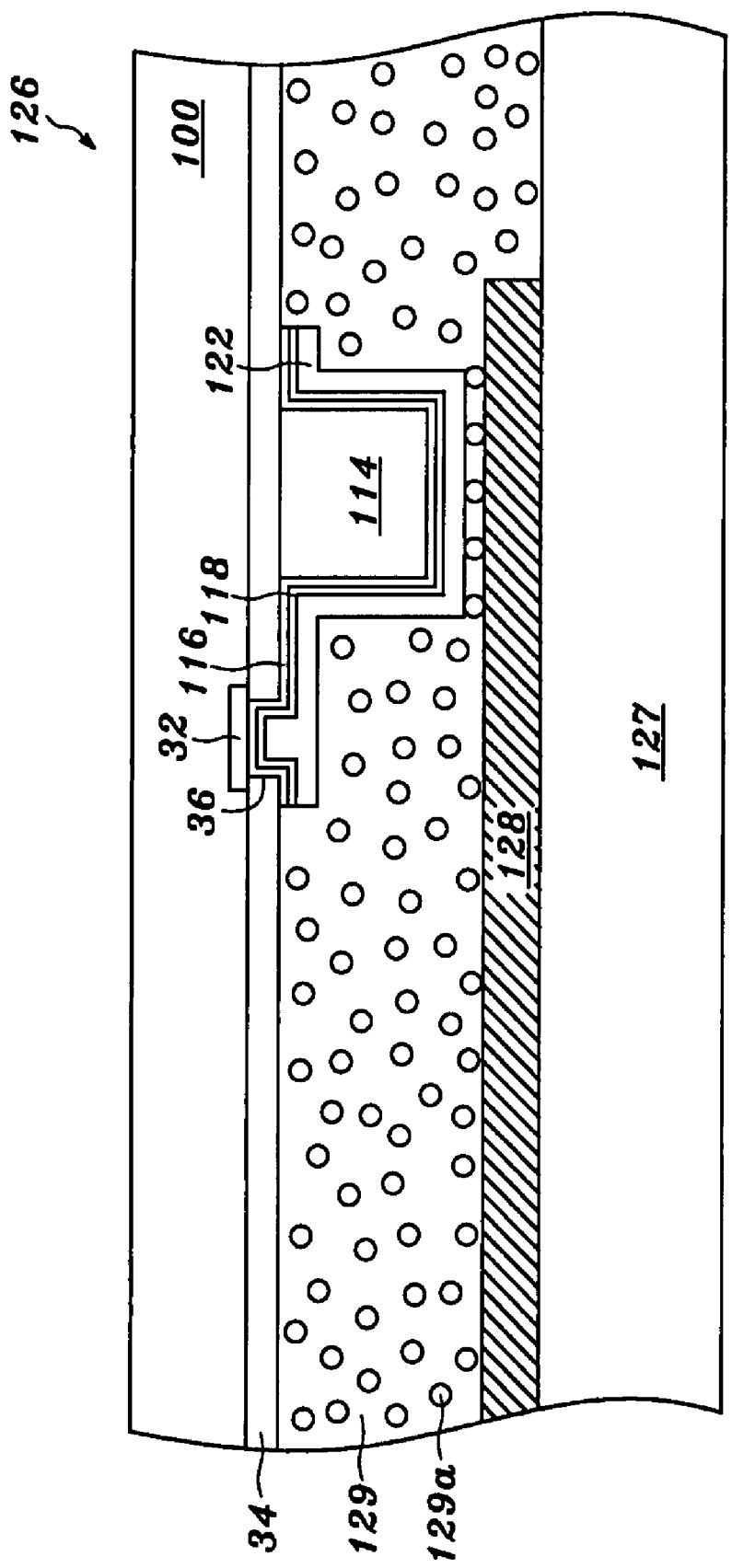
FIGS. 14A through 14I are sectional views showing a process according to another one embodiment of the present invention.

Referring to FIG. 14A, via a thermal pressing process, the bonding pad 124 and polymer bump 114 of the semiconductor chip 126 shown in FIG. 2H is pressed into ACF/ACP 129 preformed on a glass bustrate 127. Thus, metal particles 129a inside ACF/ACP 129 clusters between the bonding pad 124 of the semiconductor chip 126 and a trace 128, including indium tin oxide (ITO), of the glass substrate 127, leading the bonding pad 124 of the semiconductor chip 126 to be electrically coupled to the trace 128 of the glass substrate 127. Alternatively, the bonding pad 124 of the semiconductor chip 126 may be electrically connected to a ceramic board or an organic substrate using ACF/ACP 129, as mentioned above.

Figure 14B:
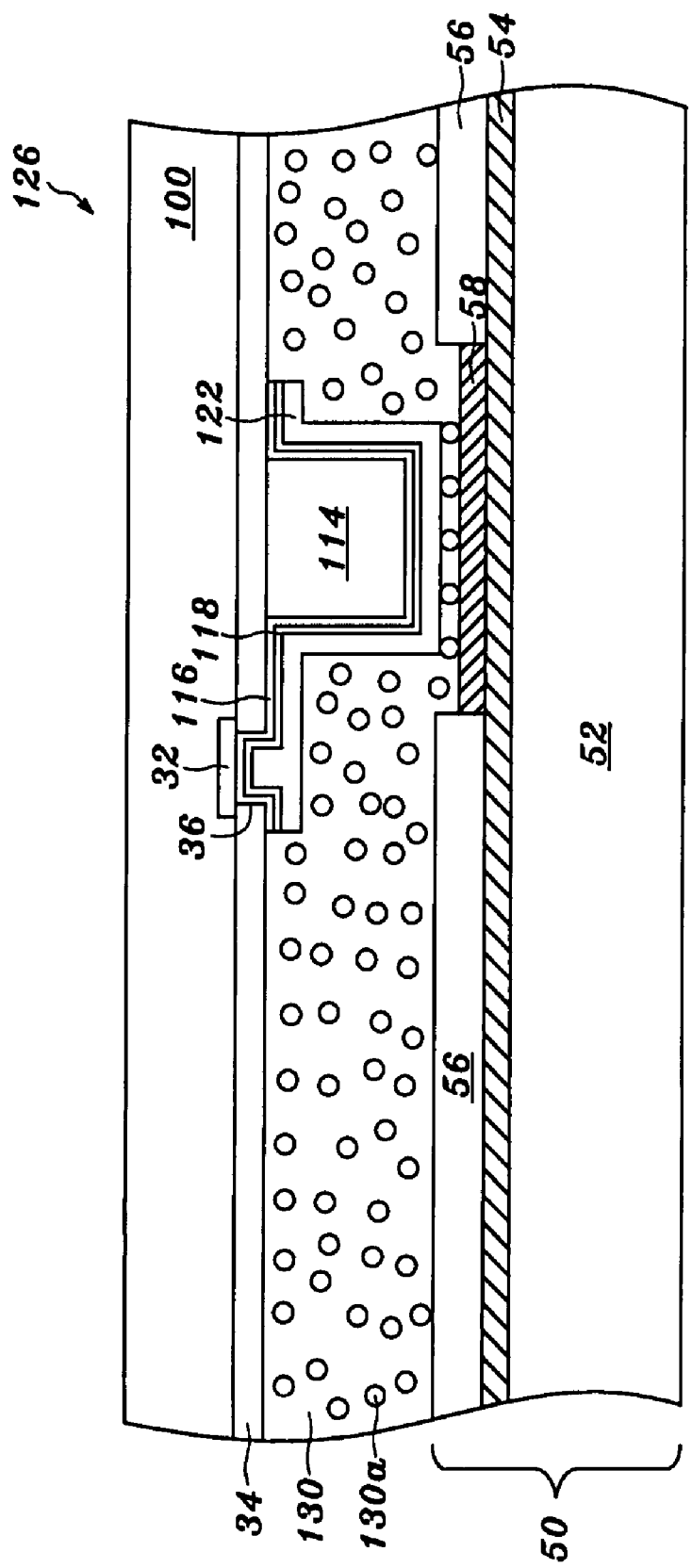

Referring to FIG. 14B, using a thermal-press process, the bonding pad 124 of the semiconductor chip 126 shown in FIG. 2H is connected to a flexible film 50. The flexible film 50 comprises a polymer layer 52, a copper trace 54 on the polymer layer 52, a protective polymer layer 56 on the copper trace 54 and on the polymer layer 52, and a gold layer 58 on the copper trace 54 exposed by an opening in the protective polymer layer 56. In a thermal pressing process, the bonding pad 124 and polymer bump 114 of the semiconductor chip 126 is pressed into ACF/ACP 130 preformed on the flexible film 50. Thus, metallic particles 130a inside ACF/ACP 130 cluster between the bonding pad 124 of the semiconductor chip 126 and the gold layer 58 on the copper trace 54, leading the bonding pad 124 of the semiconductor chip 126 to be electrically coupled to the gold layer 58 of the flexible film 50.

Figure 14C:
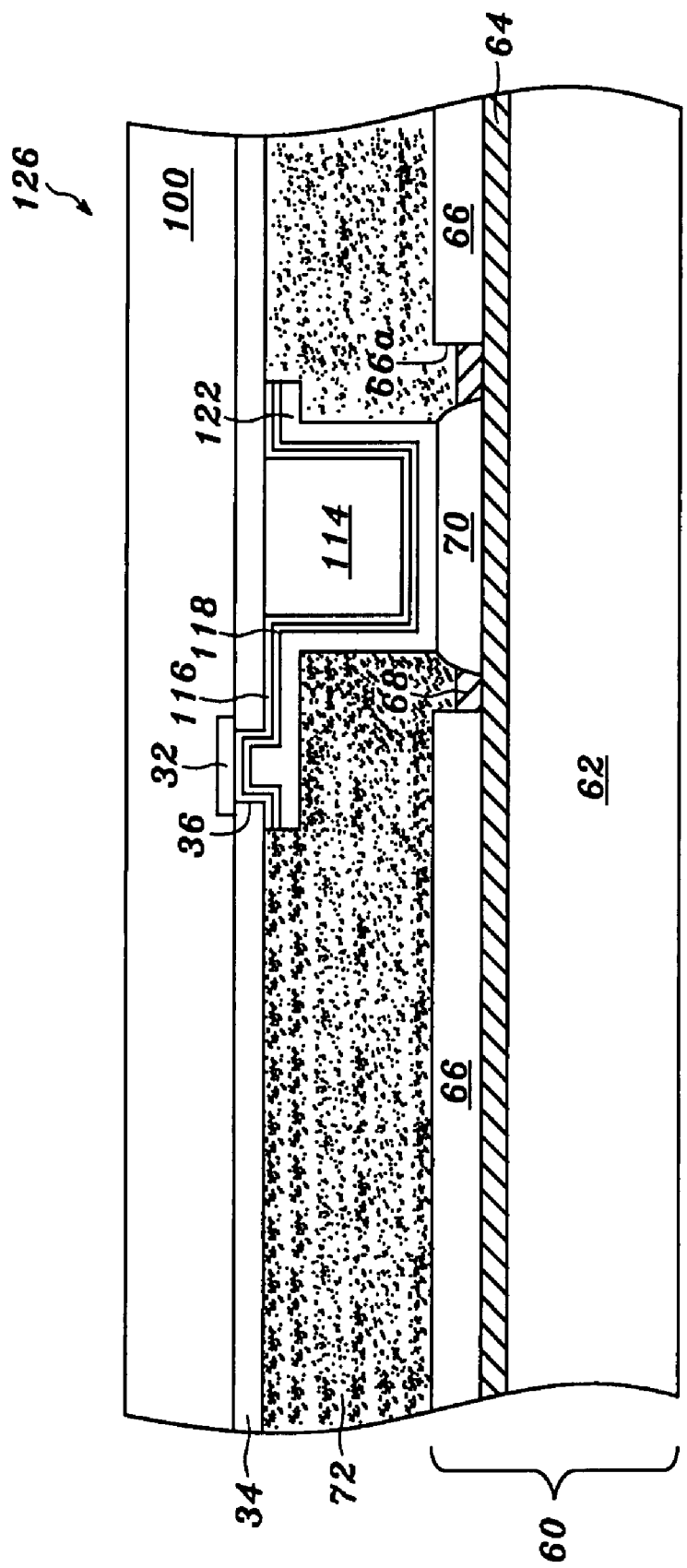

Referring to FIG. 14C, via the TAB technology, the bonding pad 124 of the semiconductor chip 126 shown in FIG. 2H is bonded to a flexible film 60, and the flexible film 60 is further connected to an external circuit, such as another semiconductor chip, printed circuit board (PCB), glass substrate, another flexible film, ceramic substrate, glass fiber reinforced epoxy based substrate, silicon substrate, organic substrate, wherein the printed circuit board containing a core with glass fiber and multiple circuit layer over and under the core, and the flexible film containing a polymer layer, such as polyimide, having a thickness of between 30 and 200 μm and a circuit layer on the polymer layer.

In the process of fabricating a metal trace 64 of the flexible film 60, a metal layer, such as a layer of nickel, titanium, chromium or a titanium-tungsten alloy, is sputtered on a polymer layer 62. Next, a seed layer, such as a copper layer, is sputtered on the metal layer. Next, a photoresist layer is formed on the seed layer and an opening in the photoresist layer exposes the seed layer. Next, a copper layer is electroplated on the seed layer exposed by the opening in the photoresist layer. Next, the photoresist layer is removed, and then the seed layer and the metal layer not under the electroplated copper layer are also removed.

After the metal trace 64 is formed on the polymer layer 62, a solder mask 66 is formed on the copper layer of the metal trace 64 and on the polymer layer 62 by screen printing or laminating. An opening 66a in the solder mask 66 exposes the copper layer of the metal trace 64. For example, the solder mask 66 may be formed by laminating a polyimide layer having a thickness of between 4 and 60 μm, and preferably of between 6 and 24 μm, on the metal trace 64 and on the polymer layer 62, then removing part of the laminated polyimide layer using laser for forming the opening 66a in the laminated polyimide layer exposing the copper layer of the metal trace 64. Alternatively, the laminated polyimide layer may be photosensitive, and the opening 66a in the laminated polyimide layer may be formed by a photolithography process.

Next, via an electroless plating method, a tin layer 68 is formed on the copper layer of the metal trace 64 exposed by the opening 66a. Therefore, the flexible film 60 comprises an inner lead containing an inner part of the electroplated copper layer of the metal trace 64 and the tin layer 68 or gold layer on the inner part of the electroplated copper layer of the metal trace 64, and an outer lead containing an outer part of the electroplated copper layer of the metal trace 64. The inner lead extends to a central region of the flexible film 60, used to be bonded with the bonding pad 124 of the semiconductor chip 126. The outer lead extends to a peripheral region of the flexible film 60, used to be connected to an external element, such as another semiconductor chip, printed circuit board containing a core with glass fiber and multiple circuit layer over and under the core, glass substrate, flexible film containing a polymer layer, such as polyimide, having a thickness of between 30 and 200 μm and a circuit layer on the polymer layer, a ceramic substrate, a glass fiber reinforced epoxy based substrate, a silicon substrate, an organic substrate, a metal substrate comprising aluminum, or a metal substrate comprising copper. The inner lead is connected to the outer lead.

Alternatively, instead of the tin layer 68, the inner lead may include a gold layer electroless plated on the inner part of the electroplated copper layer of the metal trace 64 to connect the inner lead of the flexible film 60 to the bonding pad 124 of the semiconductor chip 126.

When the tin layer 68 is formed on the inner part of the electroplated copper layer of the metal trace 64, the inner lead of the metal trace 64 may be bonded to the bonding pad 124 using a thermal pressing process. If the topmost metal layer of the bonding pad 124 is gold to be bonded with the tin layer 68, in the thermal pressing process, a tin-gold alloy 70 is formed between the bonding pad 124 and the inner part of the electroplated copper layer of the metal trace 64.

When, instead of the tin layer 68, a gold layer is formed on the inner part of the electroplated copper layer of the metal trace 64, the inner lead of the metal trace 64 may be bonded to the bonding pad 124 using a thermal pressing process. If the topmost metal layer of the bonding pad 124 is gold to be bonded with the gold layer, in the thermal pressing process, the gold layer on the inner part of the copper layer of the metal trace 64 is bonded to the bonding pad 124 via a gold-to-gold eutectic bonding.

Further, after the process of bonding the bonding pad 124 of the semiconductor chip 126 to the flexible film 60 fixed on a fixture, a polymeric material 72, such as polyimide, is formed between the chip 126 and flexible film 60, enclosing the metal layer 122 at the sidewall(s) of the polymer bump 114. Alternatively, the flexible film 60 can be bonded to the bonding pad 124 of the semiconductor chip 126 fixed on a fixture, followed by forming a polymeric material 72, such as polyimide, between the chip 126 and flexible film 60, enclosing the metal layer 122 at the sidewall(s) of the polymer bump 114.

In one embodiment, a side of the outer leads of the flexible film 60 may be connected to a glass substrate via ACF (Anisotropic Conductive Film) or ACP (Anisotropic Conductive Paste). The other side of the outer leads of the flexible film 60 may be connected to a printed circuit board via the tin-to-gold bonding, tin-to-tin bonding or gold-to-gold bonding using a thermal press process. Alternatively, a side of the outer leads of the flexible film 60 is connected to a glass substrate via ACF or ACP, and the other part of the outer leads of the flexible film 60 is also connected to a printed circuit board via ACF or ACP.

Figure 14D:
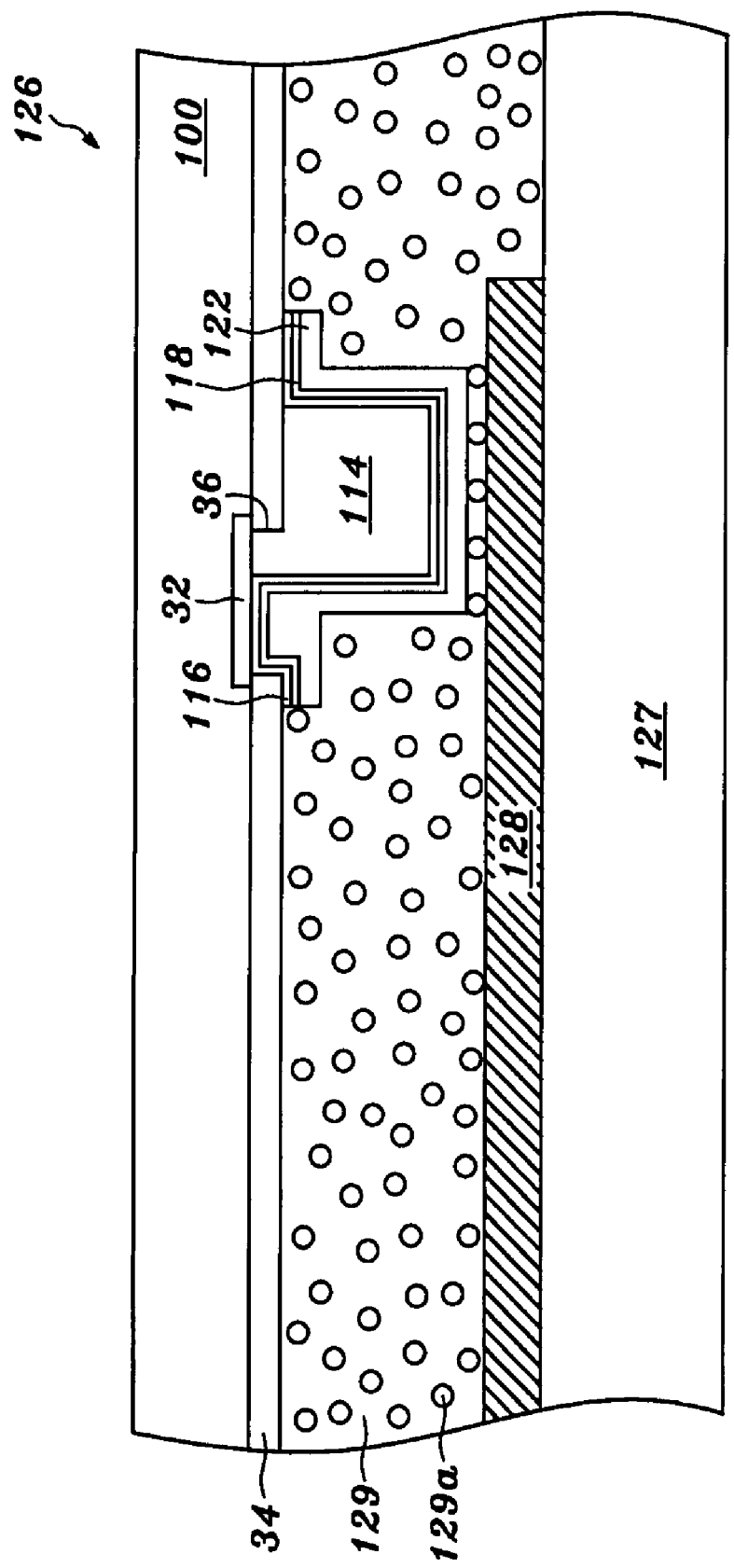
Figure 14E:
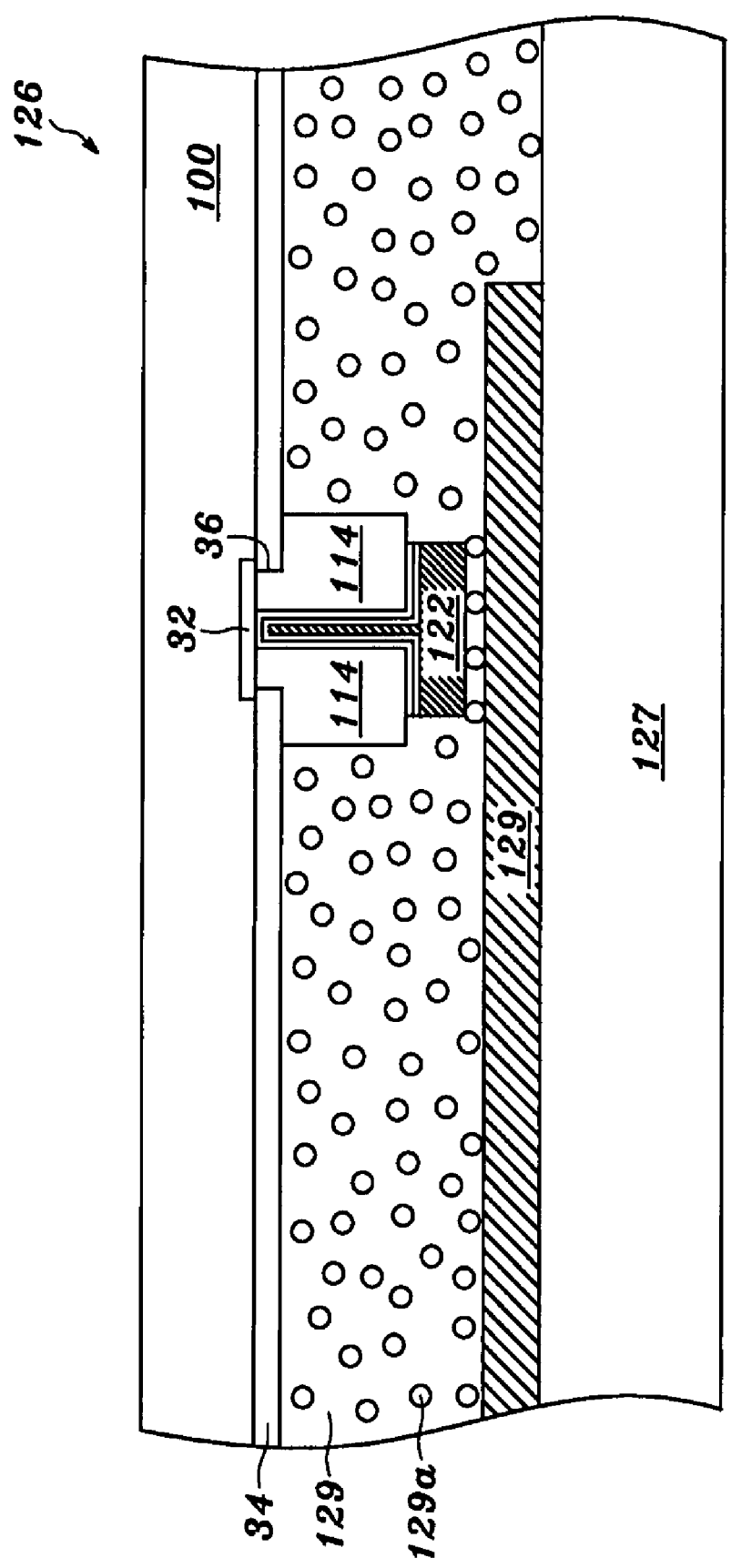

Alternatively, the bonding pad 124 shown in FIG. 7H or 11I can be connected to the glass substrate 127 shown in FIG. 14A via ACF or ACP 129, as shown in FIG. 14D or 14E. The process of connecting the bonding pad 124 shown in FIG. 7H or 11I to the glass substrate 127 can be referred to as the process of connecting the bonding pad 124 to the glass substrate 127, as shown in FIG. 14A. Alternatively, the process of connecting the bonding pad 124 shown in FIG. 2J, 2L, 7J or 7L to the glass substrate 127 can be referred to as the process of connecting the bonding pad 124 to the glass substrate 127, as shown in FIG. 14A.

Figure 14F:
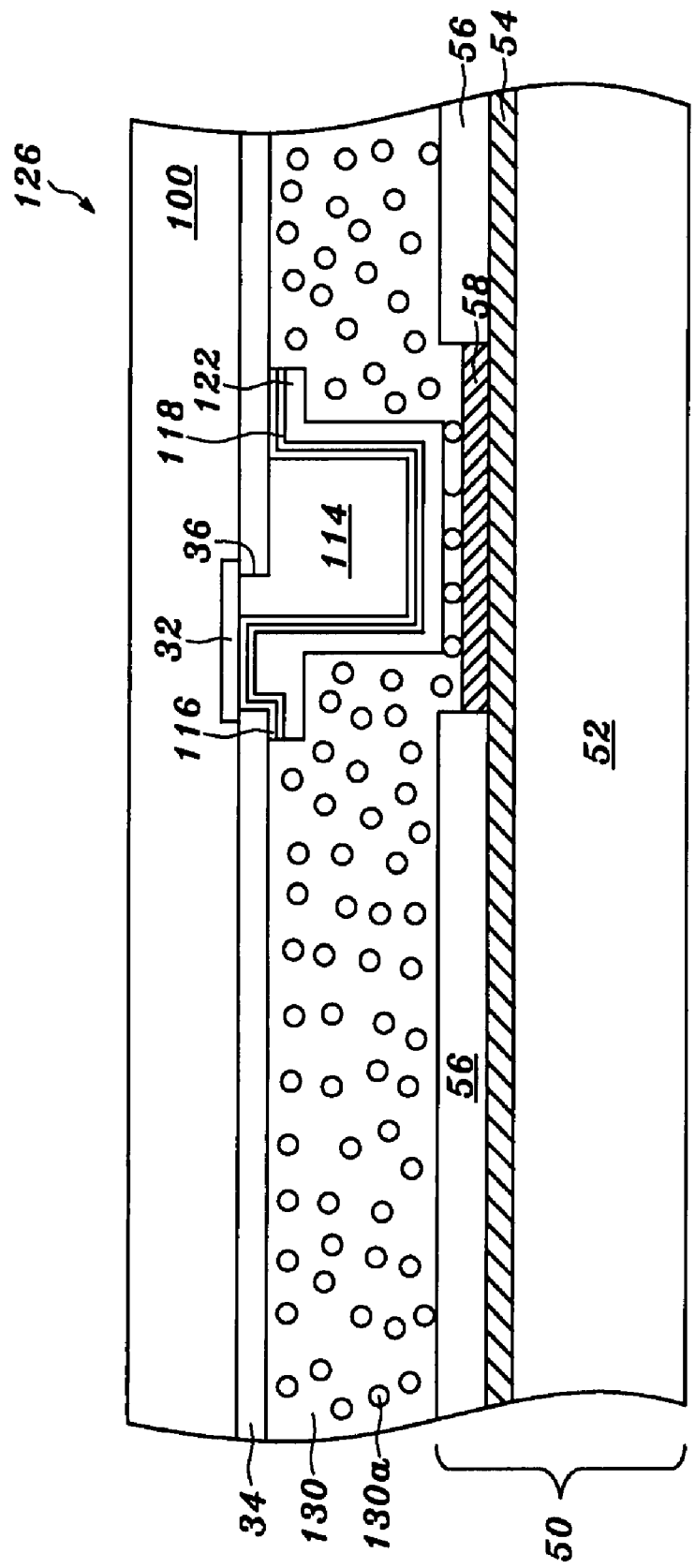
Figure 14G:
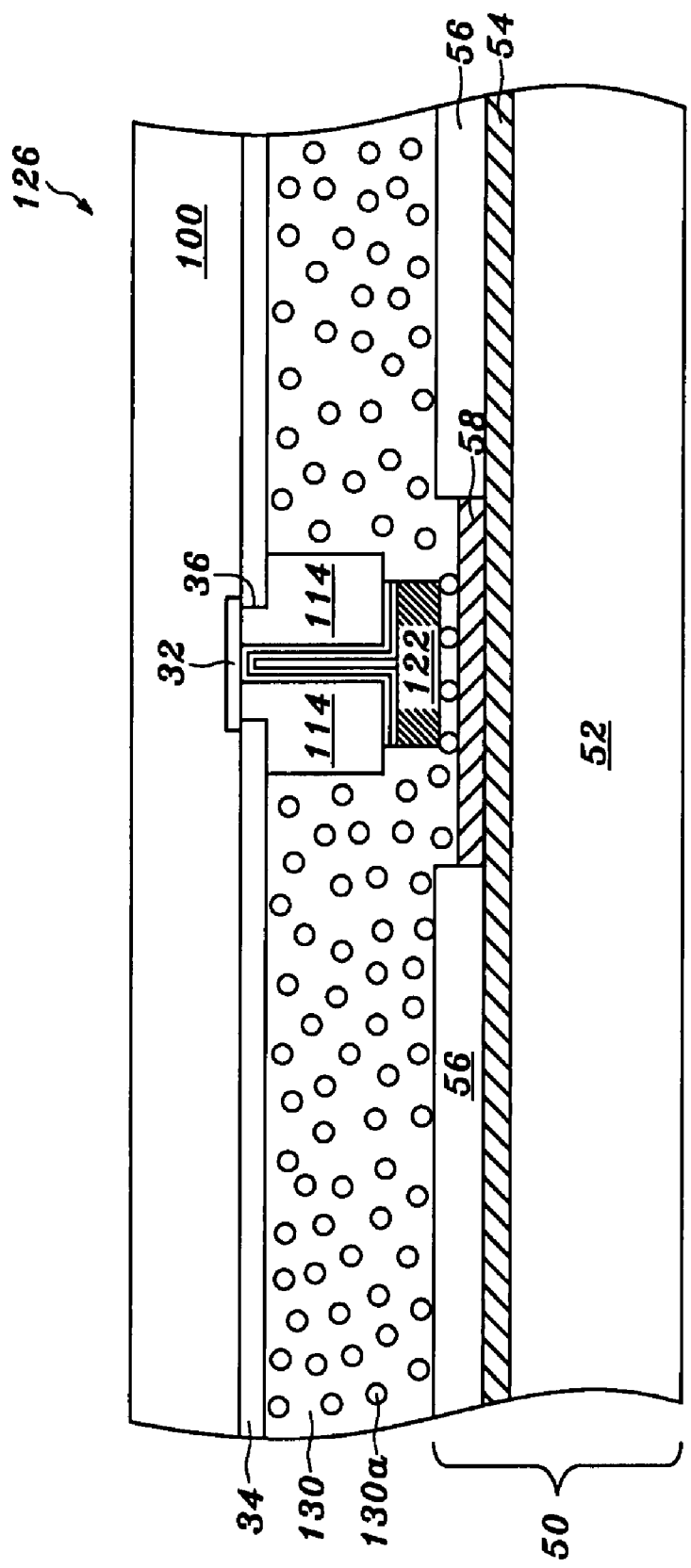

Alternatively, the bonding pad 124 shown in FIG. 7H or 11I can be connected to the flexible film 50 shown in FIG. 14B via ACF or ACP 130, as shown in FIG. 14F or 14G. The process of connecting the bonding pad 124 shown in FIG. 7H or 11I to the flexible film 50 can be referred to as the process of connecting the bonding pad 124 to the flexible film 50, as shown in FIG. 14B. Alternatively, the process of connecting the bonding pad 124 shown in FIG. 2J, 2L, 7J or 7L to the flexible film 50 can be referred to as the process of connecting the bonding pad 124 to the flexible film 50, as shown in FIG. 14B.

Figure 14H:
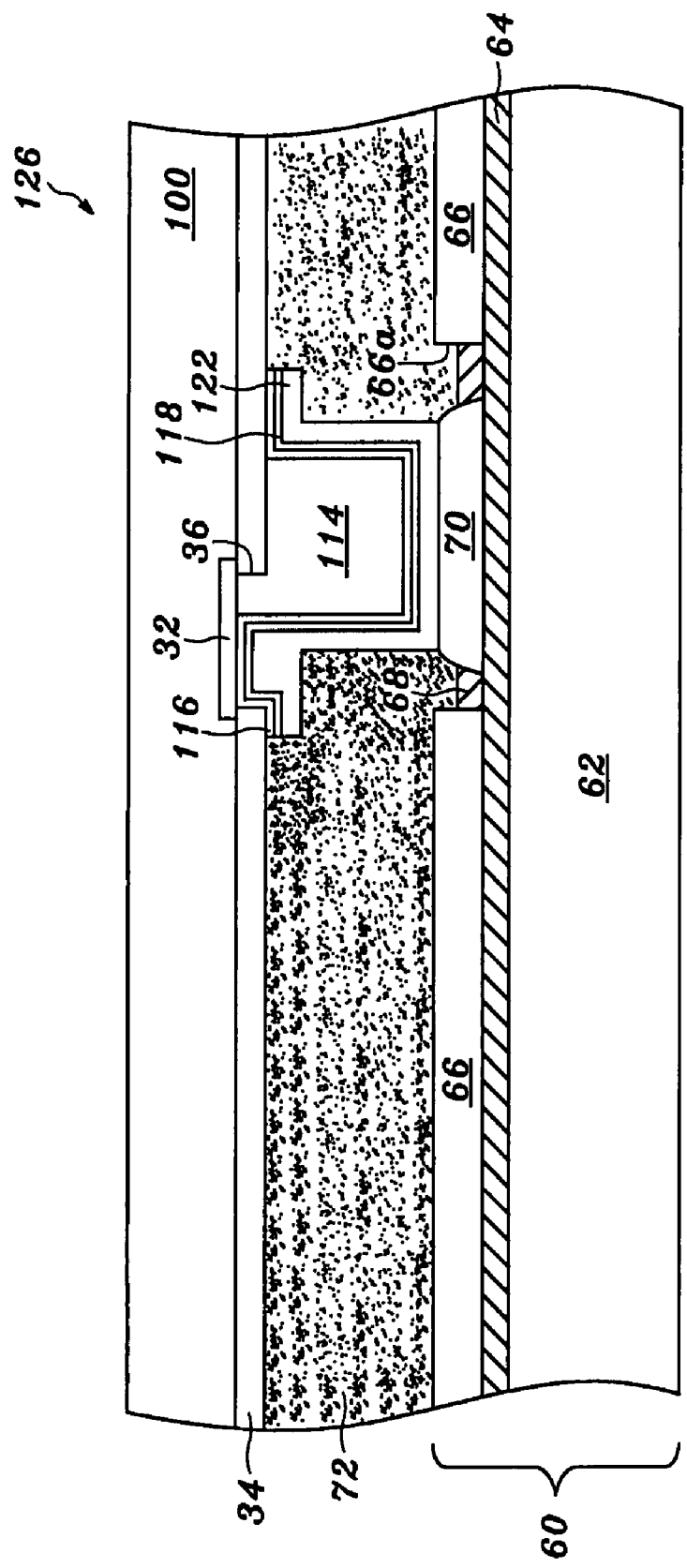
Figure 14I:
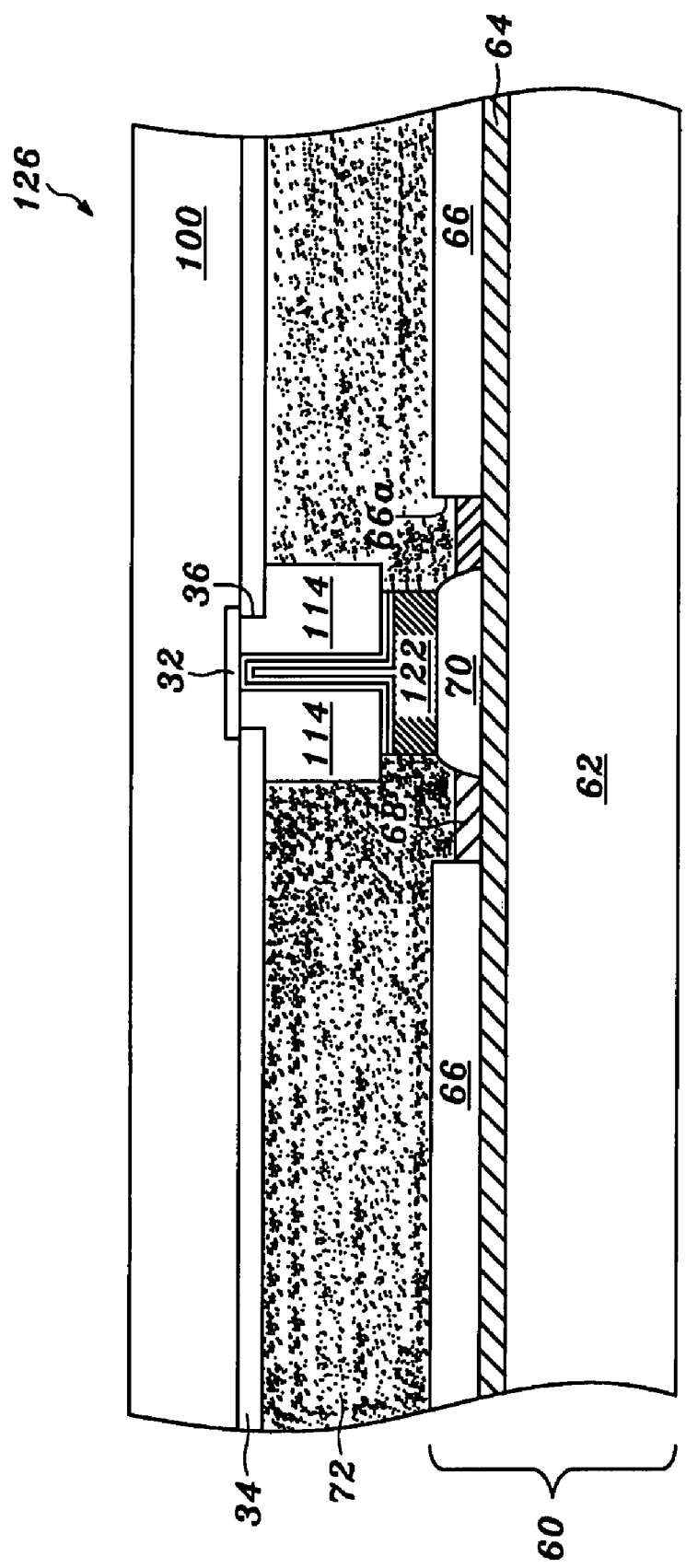

Alternatively, the bonding pad 124 shown in FIG. 7H or 11I can be connected to the flexible film 60 shown in FIG. 14C via solder bonding or gold-to-gold bonding, as shown in FIG. 14H or 14I. The process of connecting the bonding pad 124 shown in FIG. 7H or 11I to the flexible film 60 can be referred to as the process of connecting the bonding pad 124 to the flexible film 60, as shown in FIG. 14C. Alternatively, the process of connecting the bonding pad 124 shown in FIG. 2J, 2L, 7J or 7L to the flexible film 60 can be referred to as the process of connecting the bonding pad 124 to the flexible film 60, as shown in FIG. 14C.

Embodiment 5

Figure 15A:
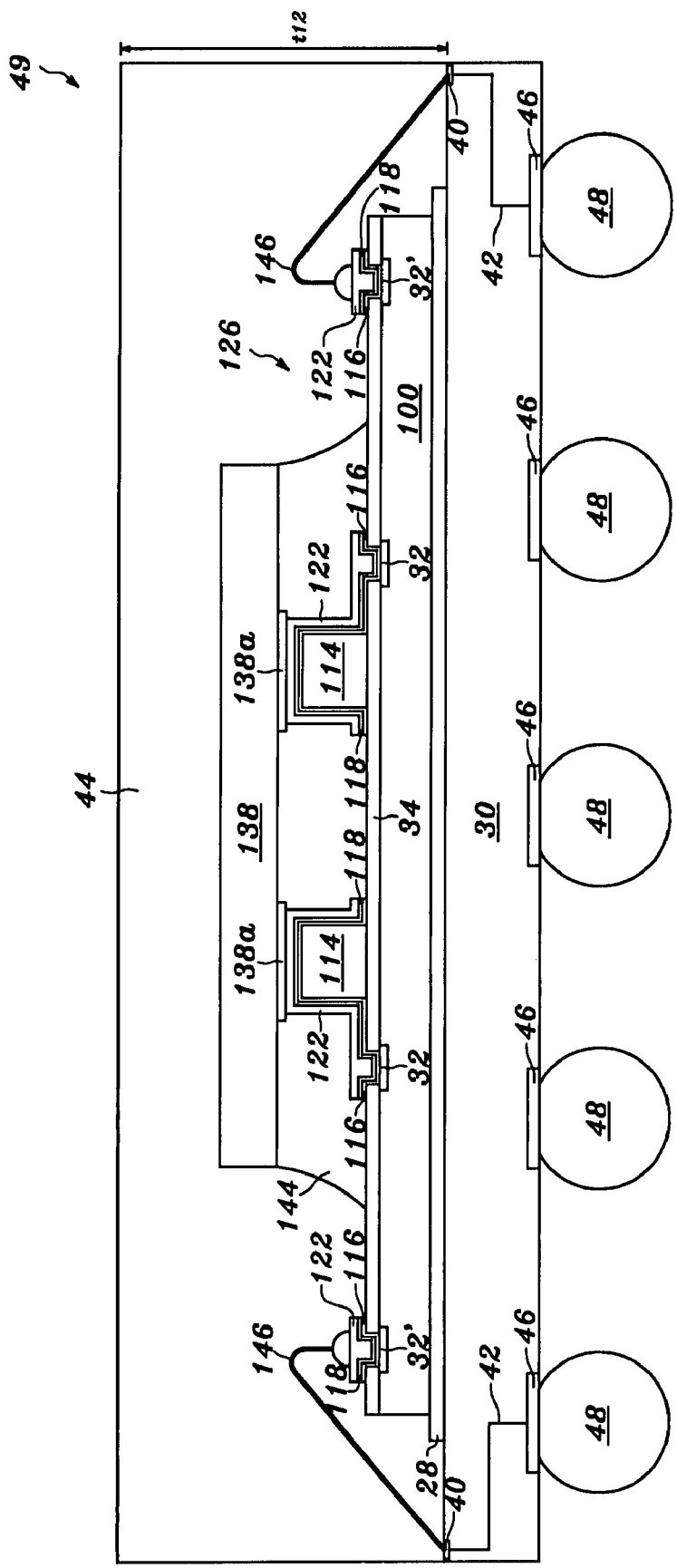
FIGS. 15A through 15B are sectional views showing a process according to the other one embodiment of the present invention.

Referring to FIG. 15A, a glue material 28 is first formed on multiple regions of a ball grid array (BGA) substrate 30 by a dispensing process to form multiple glue portions 28 on the BGA substrate 30. Next, multiple semiconductor chips 126 shown in FIG. 3H are respectively mounted onto the glue portions 28 to be adhered to the BGA substrate 30, and then the glue material 28 is baked at a temperature of between 100 and 200° C. In another word, the semiconductor substrate 2 of the semiconductor chip 126 can be adhered to the BGA substrate 30 using the glue material 28.

For example, the glue material 28 may be polyimide having a thickness of between 1 and 50 μm to adhere the semiconductor chips 126 to the BGA substrate 30. Alternatively, the glue material 28 may be epoxy resin having a thickness of between 1 and 50 μm to adhere the semiconductor chips 126 to the BGA substrate 30. Alternatively, the glue material 28 may be silver-filed epoxy having a thickness of between 1 and 50 μm to adhere the semiconductor chips 126 to the BGA substrate 30.

Next, multiple metal pads 138a of a semiconductor chip 138 are bonded to multiple bonding pads 124 of the semiconductor chip 126, respectively. For example, a tin-containing layer of the metal pad 138a can be bonded to the gold layer of bonding pad 124 via a solder bonding process. Alternatively, a gold layer of the pad 138a can be thermal pressed to the gold layer of bonding pad 124. Next, via an underfill process, a polymer material 144, such as epoxy-based underfill material, can be formed between the semiconductor chips 126 and 138, covering the metal layer 122, and then the polymer material 144 is baked at a temperature of between 100 and 200° C. Alternatively, the polymer material 144 may be polyimide.

Next, via a wire-bonding process, one end of a wire 146 can be ball bonded to the bonding pad 136 of the semiconductor chip 126, and the other end of the wire 146 can be wedge bonded to a contact point 40 of a metal trace 42 of the BGA substrate 30, wherein the wire 146 has a diameter of between 20 and 50 micrometers, and the wire 146 can be made of gold, typically called a gold wire, or made of copper, typically called a copper wire. For example, one end of the wire 146, made of gold, can be ball bonded to the gold layer of the bonding pad 136 of the semiconductor chip 126, and the other end of the wire 146 can be wedge bonded to the contact point 40 of the metal trace 42 of the BGA substrate 30. Alternatively, one end of the wire 146 can be ball bonded to the palladium layer of the bonding pad 136 of the semiconductor chip 126, and the other end of the wire 146 can be wedge bonded to the contact point 40 of the metal trace 42 of the BGA substrate 30. Alternatively, one end of the wire 146, made of copper, can be ball bonded to the copper layer of the bonding pad 136 of the semiconductor chip 126, and the other end of the wire 146 can be wedge bonded to the contact point 40 of the metal trace 42 of the BGA substrate 30. Thereby, the bonding pad 136 of the semiconductor chip 126 is electrically connected to the metal trace 42 of the BGA substrate 30.

Next, a polymer material 44 having a thickness t12 of between 250 and 1,000 μm is formed over the BGA substrate 30 and over the semiconductor chips 126 and 138, covering the wires 146. The polymer material 44 can be formed by molding benzocyclobutane (BCB), polyimide (PI) or an epoxy-based material, by dispensing benzocyclobutane (BCB), polyimide (PI) or an epoxy-based material, by coating benzocyclobutane (BCB), polyimide (PI) or an epoxy-based material, by printing benzocyclobutane (BCB), polyimide (PI) or an epoxy-based material, or by laminating benzocyclobutane (BCB), polyimide (PI) or an epoxy-based material.

For example, the polymer material 44 can be formed by molding an epoxy-based material having a thickness t12 of between 250 and 1,000 μm over the BGA substrate 30 and over the semiconductor chips 126 and 138, covering the wires 146. Alternatively, the polymer material 44 can be formed by molding polyimide or benzocyclobutane having a thickness t12 of between 250 and 1,000 μm over the BGA substrate 30 and over the semiconductor chips 126 and 138, covering the wires 146. Alternatively, the polymer material 44 can be formed by dispensing polyimide or benzocyclobutane having a thickness t12 of between 250 and 1,000 μm over the BGA substrate 30 and over the semiconductor chips 126 and 138, covering the wires 146.

Next, a tin-containing ball 48 having a diameter d of between 0.25 and 1.2 mm can be formed on a contact point 46 of the metal trace 42 of the BGA substrate 30 via a ball planting process and a reflowing process. Alternatively, the tin-containing ball 48 may be formed by a screen printing process and a reflowing process. The material of the tin-containing ball 48 may be a tin-lead alloy, a tin-silver alloy, a tin-silver-copper alloy or a lead-free alloy. The tin-containing ball 48 is bonded on the contact point 46 of the metal trace 42 and connected to the contact point 40, for being electrically connected to the wire 146.

After the tin-containing ball 48 is formed, the BGA substrate 30 and the polymer material 44 can be cutted into a plurality of chip packages 49 using a mechanical cutting process or using a laser cutting process. The BGA substrate 30 comprises a top surface and a bottom surface opposite to the top surface. The glue material 28 and the polymer material 44 are on the top surface, and the tin-containing ball 48 is on the bottom surface.

Alternatively, the semiconductor chip 126 shown in FIG. 3J, 3L, 4E, 4G, 4I, 5J, 5L, 5N, 6F, 6H, 6J, 8H, 8J, 8L, 9E, 9G, 9I, 10G, 10J, 10K, 12I or 13F can be adhered to the BGA substrate 30 using the glue material 28, followed by bonding multiple metal pads 138a of the semiconductor chip 138 to multiple bonding pads 124 of the semiconductor chip 126 shown in FIG. 3J, 3L, 4E, 4G, 4I, 5J, 5L, 5N, 6F, 6H, 6J, 8H, 8J, 8L, 9E, 9G, 9I, 10G, 10J, 10K, 12I or 13F, followed by forming the polymer material 144 between the semiconductor chip 126 shown in FIG. 3J, 3L, 4E, 4G, 4I, 5J, 5L, 5N, 6F, 6H, 6J, 8H, 8J, 8L, 9E, 9G, 9I, 10G, 10J, 10K, 12I or 13F and the semiconductor chip 138, followed by bonding the wire 146 to the bonding pad 136 of the semiconductor chip 126 shown in FIG. 3J, 3L, 4E, 4G, 4I, 5J, 5L, 5N, 6F, 6H, 6J, 8H, 8J, 8L, 9E, 9G, 9I, 10G, 10J, 10K, 12I or 13F and to the contact point 40 of the BGA substrate 30, followed by forming the polymer material 44 over the BGA substrate 30, over the semiconductor chip 126 shown in FIG. 3J, 3L, 4E, 4G, 4I, 5J, 5L, 5N, 6F, 6H, 6J, 8H, 8J, 8L, 9E, 9G, 9I, 10G 10J, 10K, 12I or 13F and over the semiconductor chip 138, covering the wires 146, followed by forming the tin-containing ball 48 on the BGA substrate 30, followed by cutting the BGA substrate 30 and the polymer material 44 into a plurality of chip packages using a mechanical cutting process or using a laser cutting process, which can be referred to as the above description concerning FIG. 15A.

Figure 15B:
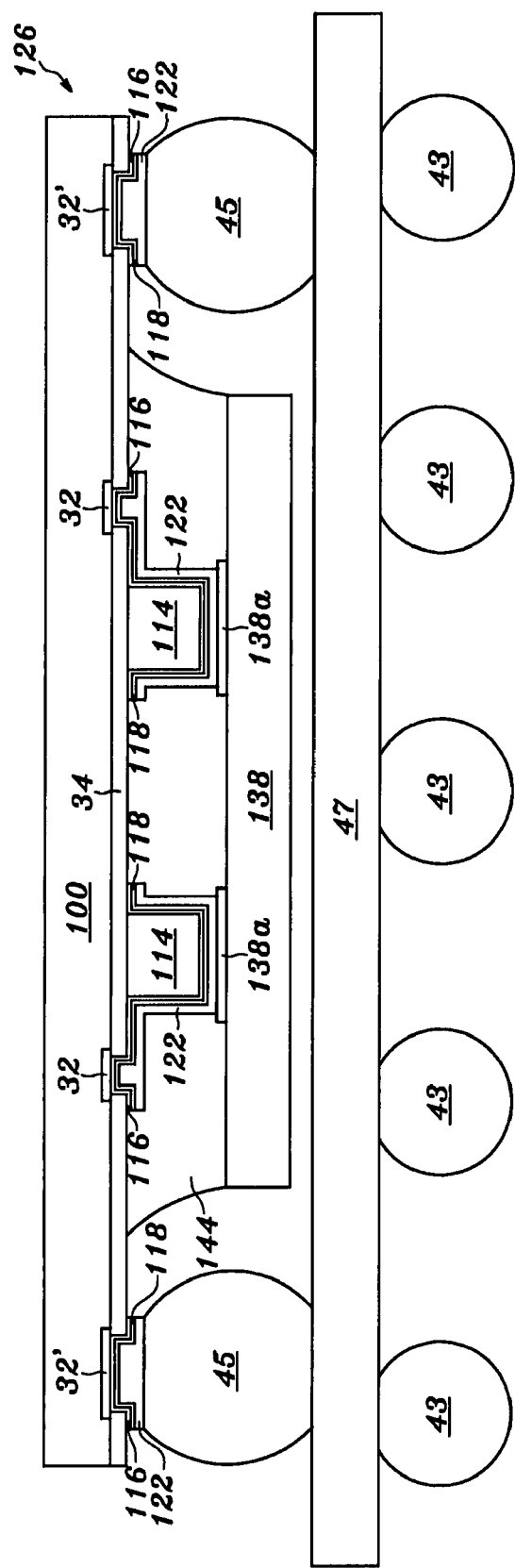

Referring to FIG. 15B, multiple metal pads 138a of a semiconductor chip 138 are bonded to multiple bonding pads 124 of the semiconductor chip 126, respectively. For example, a tin-containing layer of the metal pad 138a can be bonded to the gold layer of bonding pad 124 via a solder bonding process. Alternatively, a gold layer of the pad 138a can be thermal pressed to the gold layer of bonding pad 124. Next, via an underfill process, a polymer material 144, such as epoxy-based underfill material, can be formed between the semiconductor chips 126 and 138, covering the metal layer 122, and then the polymer material 144 is baked at a temperature of between 100 and 200° C. Alternatively, the polymer material 144 may be polyimide.

Next, via a ball mounting process, multiple tin-containing balls 45, such as a tin-lead alloy, a tin-silver alloy, or a tin-silver-copper alloy, can be planted on multiple bonding pads 136 of the semiconductor chip 126. Next, the tin-containing balls 45 planted on the semiconductor chip 126 can be bonded to multiple pads of a BGA substrate 47. Alternatively, multiple tin-containing balls 45 can be first planted on multiple pads of the BGA substrate 47 via a ball mounting process, and then the bonding pad 136 of the semiconductor chip 126 can be bonded to the tin-containing ball 45 planted on the BGA substrate 47.

After the semiconductor chip 126 is joined with the BGA substrate 47 via the tin-containing balls 45, multiple tin-containing balls 43, such as a tin-lead alloy, a tin-silver alloy, or a tin-silver-copper alloy, can be planted on a bottom surface of the BGA substrate 47.

Alternatively, multiple metal pads 138a of the semiconductor chip 138 can be bonded to the semiconductor chip 126 shown in FIG. 3J, 3L, 4E, 4G, 4I, 5J, 5L, 5N, 6F, 6H, 6J, 8H, 8J, 8L, 9E, 9G, 9I, 10G, 10J, 10K, 12I or 13F, followed by forming the polymer material 144 between the semiconductor chip 126 shown in FIG. 3J, 3L, 4E, 4G, 4I, 5J, 5L, 5N, 6F, 6H, 6J, 8H, 8J, 8L, 9E, 9G, 9I, 10G, 10J, 10K, 12I or 13F and the semiconductor chip 138, followed by joining the semiconductor chip 126 shown in FIG. 3J, 3L, 4E, 4G, 4I, 5J, 5L, 5N, 6F, 6H, 6J, 8H, 8J, 8L, 9E, 9G, 9I, 10G, 10J, 10K, 12I or 13F with the BGA substrate 47 via the tin-containing balls 45, followed by forming the tin-containing ball 43 on the BGA substrate 47, which can be referred to as the above description concerning FIG. 15B.

Those described above are the embodiments to exemplify the present invention to enable the person skilled in the art to understand, make and use the present invention. However, it is not intended to limit the scope of the present invention. Any equivalent modification and variation according to the spirit of the present invention is to be also included within the scope of the claims stated below.

What is claimed is:

1. A semiconductor chip comprising:
   a silicon substrate;
   at least one active device in or over said silicon substrate;
   a first dielectric layer over said silicon substrate;
   a metallization structure over said first dielectric layer, wherein said metallization structure is connected to said at least one active device, and wherein said metallization structure comprises a first metal layer and a second metal layer over said first metal layer;
   a second dielectric layer between said first and second metal layers;
   a passivation layer over said metallization structure and over said first and second dielectric layers, an opening in said passivation layer exposing a pad of said metallization structure;
   a polymer bump over said passivation layer and over said at least one active device, wherein said polymer bump has a thickness of between 5 and 25 micrometers and a width between 5 and 40 micrometers;
   an adhesion/barrier layer on said pad exposed by said opening, over said passivation layer and on a top surface and a portion of sidewall(s) of said polymer bump;
   a seed layer on said adhesion/barrier layer; and
   a third metal layer on said seed layer, wherein the material of said third metal layer is the same as that of said seed layer.

2. The semiconductor chip of claim 1, wherein said first metal layer comprises a copper layer having a thickness of between 0.05 and 2 micrometers.

3. The semiconductor chip of claim 1, wherein said first metal layer comprises an aluminum layer having a thickness of between 0.05 and 2 micrometers.

4. The semiconductor chip of claim 1, wherein said passivation layer comprises a silicon nitride layer having a thickness of more than 0.3 micrometers.

5. The semiconductor chip of claim 1, wherein said seed layer comprises a first gold layer and said third metal layer comprises a second gold layer having a thickness of between 1 and 20 micrometers on said first gold layer.

6. The semiconductor chip of claim 1, wherein said seed layer comprises a first copper layer and said third metal layer comprises a second copper layer having a thickness of between 1 and 20 micrometers on said first copper layer.

7. The semiconductor chip of claim 1, wherein said polymer bump is directly on said passivation layer and directly on a portion of said pad exposed by said opening.

8. The semiconductor chip of claim 1, wherein said polymer bump comprises polyimide.

9. The semiconductor chip of claim 1, wherein said adhesion/barrier layer comprises a titanium-containing layer having a thickness of between 0.02 and 0.8 micrometers.

10. The semiconductor chip of claim 1, wherein said third metal layer over said polymer bump is used to be connected to a glass substrate through an ACF (Anisotropic Conductive Film) or ACP (Anisotropic Conductive Paste).

11. A semiconductor chip comprising:
    a silicon substrate;
    at least one semiconductor device in or over said silicon substrate;
    a first dielectric layer over said silicon substrate;
    a metallization structure over said first dielectric layer, wherein said metallization structure is connected to said at least one semiconductor device, and wherein said metallization structure comprises a first metal layer and a second metal layer over said first metal layer;

a second dielectric layer between said first and second metal layers;

a passivation layer over said metallization structure and over said first and second dielectric layers, a first opening in said passivation layer exposing a pad of said metallization structure;

a polymer bump on said passivation layer and on said pad exposed by said first opening, a second opening in said polymer bump exposing said pad, wherein said polymer bump has a thickness of between 5 and 25 micrometers and a width between 10 and 40 micrometers;

an adhesion/barrier layer on said pad exposed by said second opening and on a top surface of said polymer bump;

a seed layer on said adhesion/barrier layer; and a third metal layer on said seed layer, wherein the material of said third metal layer is the same as that of said seed layer.

12. The semiconductor chip of claim 11, wherein said first metal layer comprises a copper layer having a thickness of between 0.05 and 2 micrometers.

13. The semiconductor chip of claim 11, wherein said first metal layer comprises an aluminum layer having a thickness of between 0.05 and 2 micrometers.

14. The semiconductor chip of claim 11, wherein said passivation layer comprises a silicon nitride layer having a thickness of more than 0.3 micrometers.

15. The semiconductor chip of claim 11, wherein said seed layer comprises a first gold layer and said third metal layer comprises a second gold layer having a thickness of between 1 and 20 micrometers on said first gold layer.

16. The semiconductor chip of claim 11, wherein said seed layer comprises a first copper layer and said third metal layer comprises a second copper layer having a thickness of between 1 and 20 micrometers on said first copper layer.

17. The semiconductor chip of claim 11, wherein said polymer bump comprises polyimide.

18. The semiconductor chip of claim 11, wherein said adhesion/barrier layer comprises a titanium-containing layer having a thickness of between 0.02 and 0.8 micrometers.

19. The semiconductor chip of claim 11, wherein said third metal layer over said polymer bump is used to be connected to a glass substrate through an ACF (Anisotropic Conductive Film) or ACP (Anisotropic Conductive Paste).

20. The semiconductor chip of claim 11, wherein said third metal layer over said polymer bump is used to be connected to another semiconductor chip.

* * * * *